US010763349B2

(12) United States Patent
Pillarisetty et al.

(10) Patent No.: US 10,763,349 B2
(45) Date of Patent: Sep. 1, 2020

(54) QUANTUM DOT DEVICES WITH MODULATION DOPED STACKS

(71) Applicant: Intel Corporation, Santa Clara, CA (US)

(72) Inventors: Ravi Pillarisetty, Portland, OR (US); Van H. Le, Beaverton, OR (US); Jeanette M. Roberts, North Plains, OR (US); James S. Clarke, Portland, OR (US); Zachary R. Yoscovits, Beaverton, OR (US); David J. Michalak, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/097,730

(22) PCT Filed: Jun. 29, 2016

(86) PCT No.: PCT/US2016/039953
§ 371 (c)(1),
(2) Date: Oct. 30, 2018

(87) PCT Pub. No.: WO2018/004554
PCT Pub. Date: Jan. 4, 2018

(65) Prior Publication Data
US 2019/0363181 A1    Nov. 28, 2019

(51) Int. Cl.
*H01L 29/778*    (2006.01)
*H01L 29/06*    (2006.01)
(Continued)

(52) U.S. Cl.
CPC ...... *H01L 29/7782* (2013.01); *H01L 27/0886* (2013.01); *H01L 29/0673* (2013.01);
(Continued)

(58) Field of Classification Search
CPC ..... H01L 21/823431; H01L 21/823821; H01L 21/845; H01L 27/0886; H01L 27/0924;
(Continued)

(56) References Cited

U.S. PATENT DOCUMENTS 6,081,882 A * 6/2000 Gossett .................. B82Y 10/00
712/1
6,448,161 B1 * 9/2002 Krivokapic ............ B82Y 10/00
257/E21.415
(Continued)

FOREIGN PATENT DOCUMENTS

WO    2018004554 A1    1/2018

OTHER PUBLICATIONS

International Search Report and Written Opinion issued in PCT Application No. PCT/US2016/039953 dated Mar. 29, 2017; 8 pages.
(Continued)

*Primary Examiner* — Eduardo A Rodela
(74) *Attorney, Agent, or Firm* — Patent Capital Group

(57) ABSTRACT

Disclosed herein are quantum dot devices, as well as related computing devices and methods. For example, in some embodiments, a quantum dot device may include: a quantum well stack including a quantum well layer, a doped layer, and a barrier layer disposed between the doped layer and the quantum well layer; and gates disposed above the quantum well stack. The doped layer may include a first material and a dopant, the first material may have a first diffusivity of the dopant, the barrier layer may include a second material having a second diffusivity of the dopant, and the second diffusivity may be less than the first diffusivity.

25 Claims, 21 Drawing Sheets

(51) Int. Cl.

| | | |
|---|---|---|
| H01L 29/12 | (2006.01) | |
| H01L 29/66 | (2006.01) | |
| H01L 29/786 | (2006.01) | |
| H01L 29/15 | (2006.01) | |
| H01L 49/00 | (2006.01) | |
| H01L 27/088 | (2006.01) | |
| H01L 29/775 | (2006.01) | |
| H01L 29/417 | (2006.01) | |
| H01L 29/78 | (2006.01) | |

(52) U.S. Cl.
CPC ............ *H01L 29/122* (2013.01); *H01L 29/15* (2013.01); *H01L 29/151* (2013.01); *H01L 29/152* (2013.01); *H01L 29/41791* (2013.01); *H01L 29/66439* (2013.01); *H01L 29/66469* (2013.01); *H01L 29/66977* (2013.01); *H01L 29/775* (2013.01); *H01L 29/7831* (2013.01); *H01L 29/78687* (2013.01); *H01L 49/006* (2013.01)

(58) Field of Classification Search
CPC ......... H01L 27/10826; H01L 27/10879; H01L 27/1211; H01L 29/122; H01L 29/15; H01L 29/151; H01L 29/152; H01L 29/66439; H01L 29/66469; H01L 29/775; H01L 29/7782; H01L 29/803; H01L 29/41791; H01L 29/66772; H01L 29/66795; H01L 29/7831; H01L 29/785; H01L 29/7858; H01L 29/786; H01L 49/006
See application file for complete search history.

(56) References Cited

U.S. PATENT DOCUMENTS

| | | | | |
|---|---|---|---|---|
| 6,597,010 | B2* | 7/2003 | Eriksson | B82Y 10/00 257/14 |
| 10,002,328 | B1* | 6/2018 | Gamble, IV | H01L 29/423 |
| 2005/0077510 | A1* | 4/2005 | Chu | H01L 29/66431 257/19 |
| 2006/0157685 | A1 | 7/2006 | Ponomarev | |
| 2008/0237573 | A1 | 10/2008 | Jin et al. | |
| 2009/0078947 | A1* | 3/2009 | Ohgoh | B82Y 20/00 257/97 |
| 2010/0213441 | A1 | 8/2010 | Pillarisetty et al. | |
| 2010/0320443 | A1* | 12/2010 | Jiang | B82Y 20/00 257/14 |
| 2011/0147712 | A1 | 6/2011 | Radosavljevic et al. | |
| 2012/0074386 | A1 | 3/2012 | Rachmady et al. | |
| 2013/0264617 | A1 | 10/2013 | Joshi et al. | |
| 2014/0084245 | A1* | 3/2014 | Zhang | H01L 29/127 257/20 |
| 2014/0197376 | A1* | 7/2014 | Ma | H01L 29/775 257/24 |
| 2015/0279981 | A1* | 10/2015 | Eriksson | H01L 29/7782 257/14 |

OTHER PUBLICATIONS

"A Nanodamascene Process for Advanced Single-Electron Transistor Fabrication," Dubuc et al, IEEE Transactions on Nanotechnology, vol. 7, No. 1, Jan. 2008, pp. 68-73.
"A two-qubit logic gate in silicon," Veldhorst et al., Nature, vol. 526, Oct. 15, 2015, pp. 410-414.
"Gate-Defined Quantum Dots in Intrinsic Silicon," Angus et al., Nano Letters 2007, vol. 7, No. 7, 2051-2055, publication date Jun. 14, 2007, retrieved from http://pubs.acs.org on Mar. 31, 2009, 6 pages.
"Independent, extensible control of same-frequency superconducting qubits by selective broadcasting," Asaad et al., Netherlands Organisation for Applied Scientific Research, Aug. 28, 2015, 17 pages.
"Fast sensing of double-dot charge arrangement and spin state with an rf sensor quantum dot," Barthel et al, Materials Department, University of California, Santa Barbara, Jan. 16, 2014, 4 pages.
"Undoped accumulation-mode Si/SiGe quantum dots," Borselli et al, HRL Laboratories, LLC., Jul. 15, 2014, 4 pages.
"Multilayer microwave integrated quantum circuits for scalable quantum computing," Brecht et al, Department of Applied Physics, Yale University, Sep. 4, 2015, 5 pages.
"Reducing intrinsic loss in superconducting resonators by surface treatment and deep etching of silicon substrates," Bruno, et al., QuTech Advanced Research Center and Kavli Institute of Nanoscience, Delft University of Technology, The Netherlands, Feb. 16, 2015, 9 pages.
"Spin Relaxation and Decoherence of Holes in Quantum Dots," Bulaev et al., Phys. Rev. Lett. 95, 076805, Aug. 11, 2005, 1 page.
"Fundamentals of Silicon Material Properties for Successful Exploitation of Strain Engineering in Modern CMOS Manufacturing," Chidambaram et al, IEE Transactions on Electron Devices, vol. 53, No. 5, May 2006, pp. 944-964.
"Ultrafast optical control of individual quantum dot spin qubits," De Greve et al, Reports on Progress in Physics, vol. 76, No. 9, Sep. 4, 2013, 2 pages.
"Fabrication and Characterization of Sidewall Defined Silicon-on-Insulator Single-Electron Transistor," Jung et al., IEEE Transactions on Nanotechnology, vol. 7, No. 5, Sep. 2008, pp. 544-550.
"How it's built: Micron/Intel3D NAND Micron Opens the Veil a Little," Moyer, Bryon, retrieved from https://www.eejournal.com/article/20160201-micron/ on Nov. 29, 2017, 9 pages.
"Investigation of Vertical Type Single-Electron Transistor with Sidewall Spacer Quantum Dot," Kim et al, Student Paper, Inter-University Semiconductor Research Center and School of Electrical Engineering and Computer Science, Seoul National University, ISDRS 2011, Dec. 7-9, 2011, ISDRS 2011—http://www.ece.umd.edu/ISDR2011, 2 pages.
"Platinum single-electron transistors with tunnel barriers made by atomic layer deposition", George et al., Department of Electrical Engineering, University of Notre Dame, Published Nov. 5, 2010, 3 pages.
"Surface loss simulations of superconducting coplanar waveguide resonators," Wenner et al, Applied Physics Letters 99, 113513 (2011), pp. 113513-1 through 3.
"Quantum computation with quantum dots," Loss et al , Physical Review A, vol. 57, No. 1, Jan. 1998, pp. 120-126.
"Ultafast high-fidelity initialization of a quantum-dot spin qubit without magnetic fields," Mar et al., Phys. Rev. B 90 241303®, published Dec. 15, 2014, 1 page.
"Delaying Forever: Uniaxial Strained Silicon Transistors in a 90nm CMOS Technology," Mistry et al Portland Technology Department, TCAD, Intel Corp., 2 pages.
Supplementary Information, retrieved from www.nature.com, doi:10.1038/nature 15263, 8 pages.
"Magnetic field tuning of coplanar waveguide resonators," Healey, et al., Applied Physics Letters 93, 043513 (2008), pp. 043513-1 through 3 (4 pages with cover sheet).
"Embracing the quantum limit in silicon computing," Morton et al, Macmillan Publishers, Nov. 17, 2011, vol. 479, Nature, pp. 345-353.
"Review : Towards Spintronic Quantum Technologies with Dopants in Silicon," Morley, Gavin, Department of Physics, University of Warwich, 13 pages.
"A Reconfigurable Gate Architecture for Si/SiGe Quantum Dots," Zajac et al., Department of Physics, Princeton University; Department of Physics, University of California; Feb. 6, 2015, 5 pages.
"Scalable quantum circuit and control for a superconducting surface code," Versluis et al, Netherlands Organisation for Applied Scientific Research, Dec. 28, 2016, 9 pages.
"Defect reduction of selective Ge epitaxy in trenches on Si(001) substrates using aspect ratio trapping," Park et al., Applied Physics Letter 90, 052113 (2007), pp. 052113-1 through 3.

(56) References Cited

OTHER PUBLICATIONS

"Photon- and phonon-assisted tunneling in the three-dimensional charge stability diagram of a triple quantum dot array," Braakman et al., Applied Physics Letters 102, 112110 (2013), pp. 112110-1 through 4 (5 pages with cover sheet).

"Radio frequency measurements of tunnel couplings and singlet-triplet spin states in Si:P quantum dots," House et al., Nature Communications, 6:884, DOI: 10.1038/ncomms9848, pp. 1-6.

"Detecting big-flip errors in a logical qubit using stabilizer measurements," Riste et al., Nature Communications, 6:6983, DOI: 10.1038/ncomms7983, pp. 1-6.

"Scalable gate architecture for densely packed semiconductor spin qubits," Zajac et al, Department of Physics, Princeton University; Sandia National Laboratories, 8 pages.

"Silicon CMOS architecture for a spin-based quantum computer," Veldhorst et al., Qutech, TU Delft, The Netherlands, Centre for Quantum Computation and Communication Technology, School of Electrical Engineering and Telecommunications, The University of New South Wales, NanoElectronics Group, MESA + Institute for Nanotechnology, University of Twente, The Netherlands, Oct. 2, 2016, 13 pages.

"Single-electron Transistors fabricated with sidewall spacer patterning," Park et al., Superlattices and Microstructures 34 (2003) 231-239.

"Single-electron Transistors with wide operating temperature range," Dubuc et al., Applied Physics Letters 90, 113104 (2007) pp. 113104-1 through 3.

"Single-shot read-out of an individual electron spin in a quantum dot," Elzerman et al., Nature, vol. 430, Jul. 22, 2004, pp. 431-435.

"Suspending superconducting qubits by silicon micromachining," Chu et al., Department of Applied Physics, Yale University, Jun. 10, 2016, 10 pages.

"Single-charge tunneling in ambipolar silicon quantum dots," Muller, Filipp, Dissertation, University of Twente, Jun. 19, 2015, 148 pages.

"An addressable quantum dot qubit with fault-tolerant control-fidelity," Veldhorst et al., Nature Nanotechnology vol. 9, Dec. 2014, pp. 981-985.

PCT/US2018/012742, Jan. 8, 2018, Quantum Dot Devices With Boron Dielectrics.

PCT/US2016/036563, Jun. 9, 2016, Quantum Dot Devices With Modulation Doped Stacks.

PCT/US2016/036565, Jun. 9, 2016, Quantum Dot Devices With Modulation Doped Stacks.

PCT/US2016/036317, Jun. 8, 2016, Quantum Dot Devices With Doped Regions.

\* cited by examiner

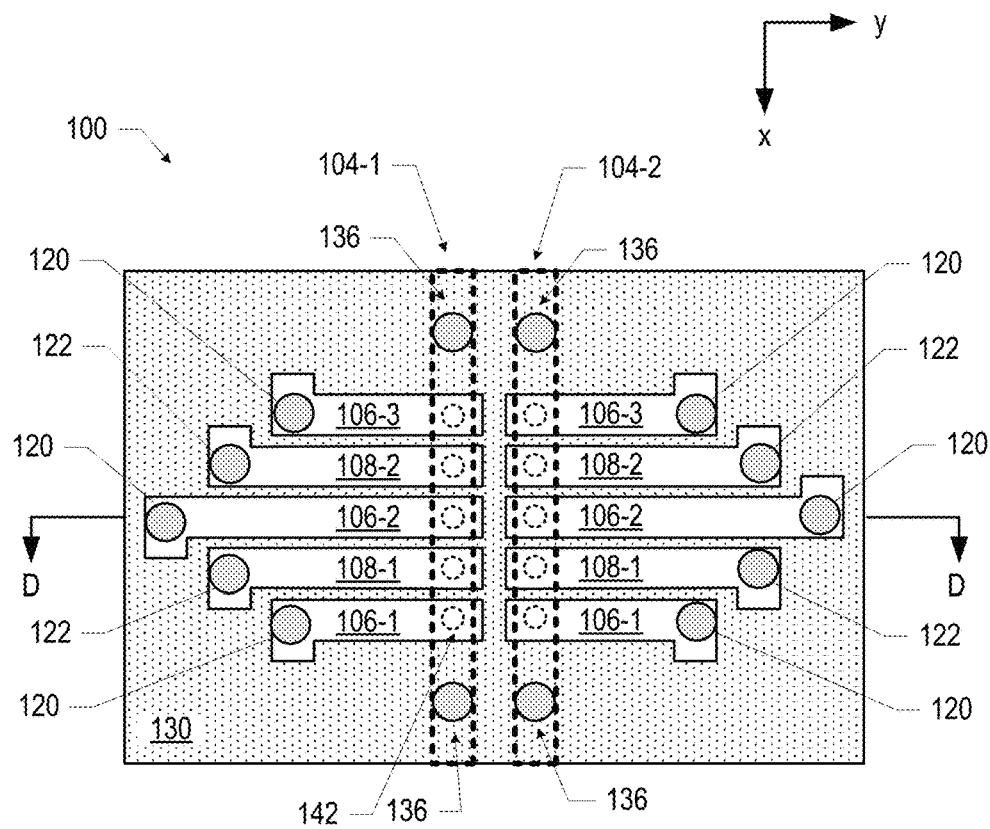
FIG. 3
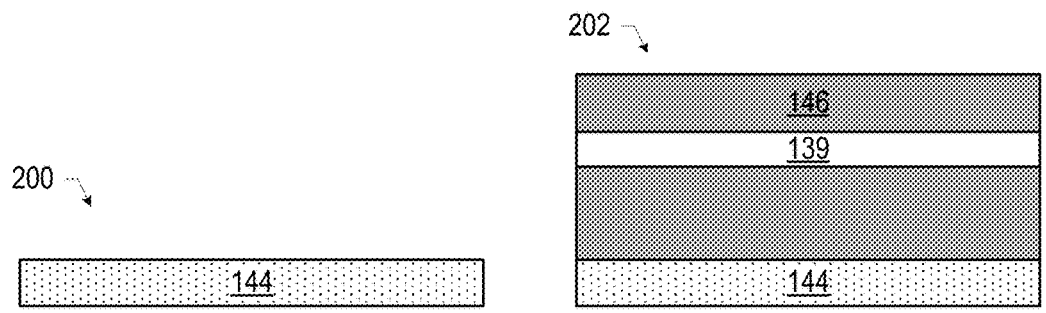
FIG. 4        FIG. 5
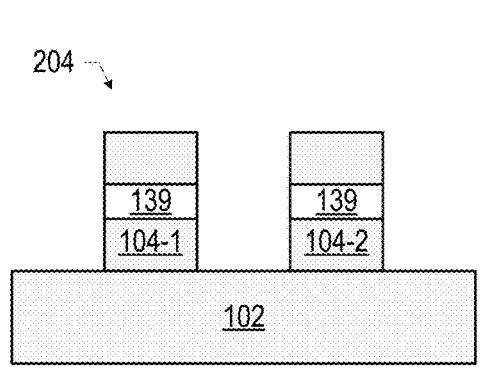 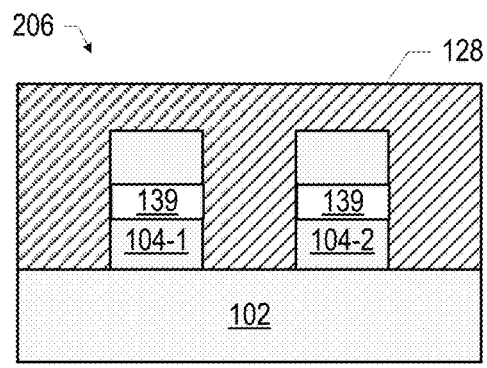
FIG. 6        FIG. 7

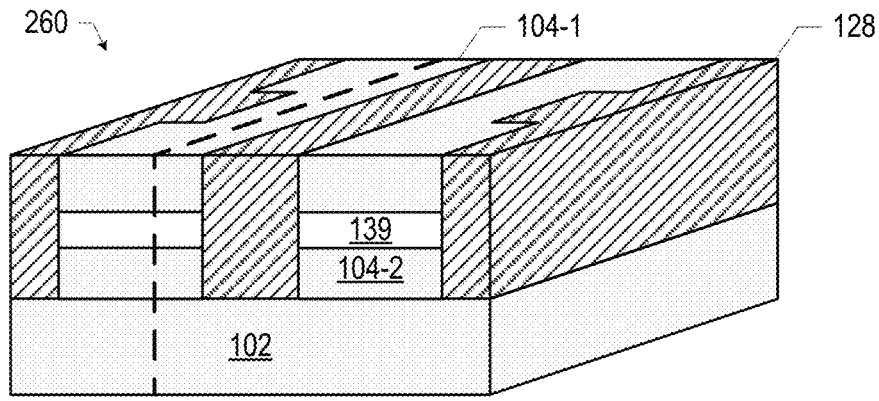
FIG. 54
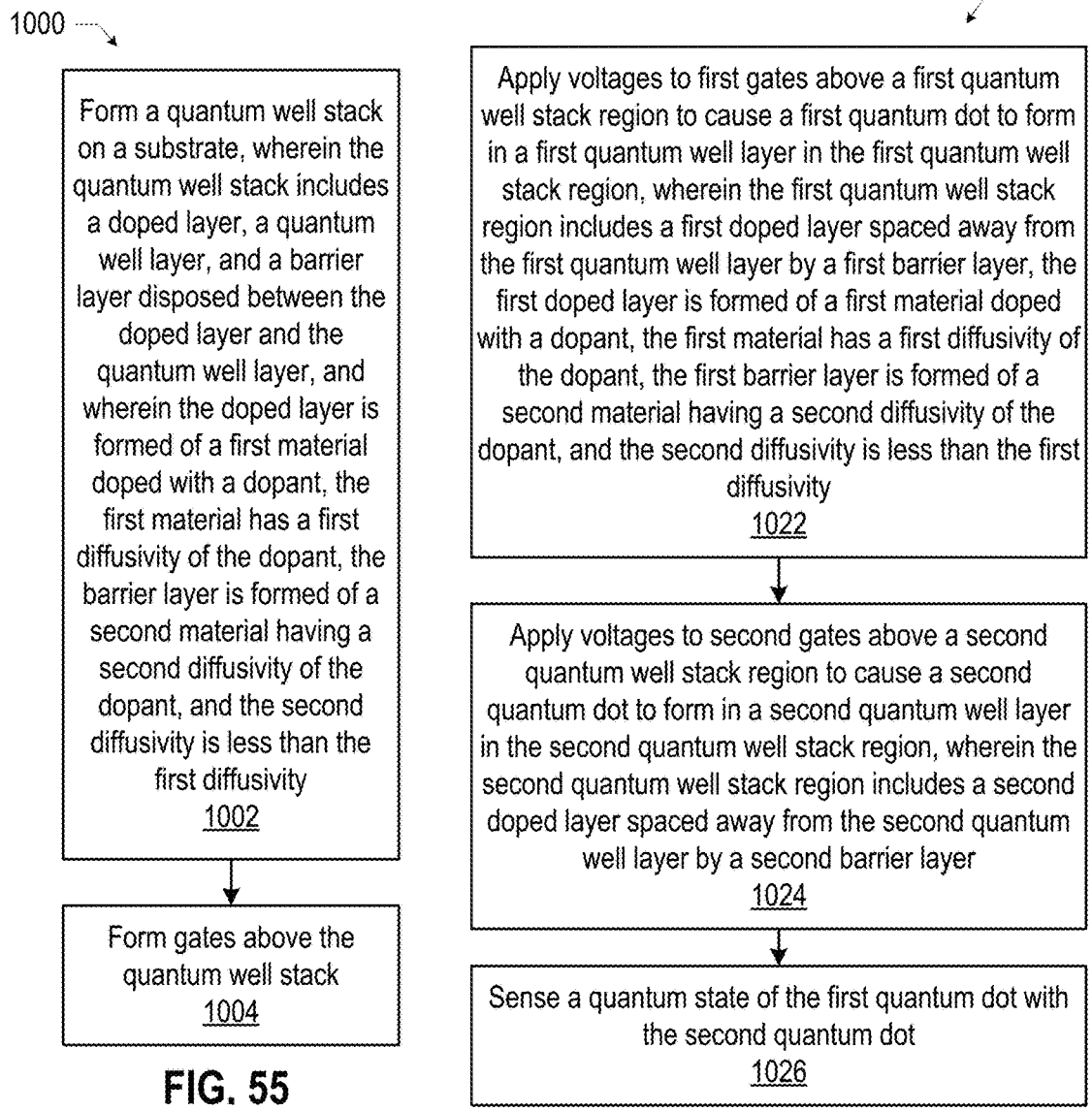
FIG. 55
FIG. 56

1040 ─╲

```
┌─────────────────────────────────────────────────────────────┐
│ Apply an electrical signal to a first gate disposed above a quantum well │
│ stack region to cause a first quantum dot to form in a first quantum well in │
│ a quantum well layer in the quantum well stack region under the first │
│ gate, wherein the quantum well stack region includes a doped layer and │
│ a barrier layer disposed between the doped layer and the quantum well │
│ layer, the doped layer is formed of a first material doped with a dopant, │
│ the first material has a first diffusivity of the dopant, the barrier layer is │
│ formed of a second material having a second diffusivity of the dopant, │
│ and the second diffusivity is less than the first diffusivity │
│                            1042                             │
└─────────────────────────────────────────────────────────────┘
```

```
┌─────────────────────────────────────────────────────────────┐
│ Apply an electrical signal to a second gate disposed on the quantum well │
│ stack region to cause a second quantum dot to form in a second │
│ quantum well in the quantum well stack layer in the quantum well stack │
│ region under the second gate │
│                            1044                             │
└─────────────────────────────────────────────────────────────┘
```

```
┌─────────────────────────────────────────────────────────────┐
│ Apply an electrical signal to a third gate disposed on the quantum well │
│ stack region to (1) cause a third quantum dot to form in a third quantum │
│ well in the quantum well layer in the quantum well stack region under the │
│ third gate or (2) provide a potential barrier between the first quantum well │
│ and the second quantum well │
│                            1046                             │
└─────────────────────────────────────────────────────────────┘
```

FIG. 57

QUANTUM DOT DEVICES WITH MODULATION DOPED STACKS

CROSS-REFERENCE TO RELATED APPLICATION

This application is a national stage application under 35 U.S.C. § 371 of PCT International Application Serial No. PCT/US2016/039953, filed on Jun. 29, 2016 and entitled "QUANTUM DOT DEVICES WITH MODULATION DOPED STACKS," which is hereby incorporated by reference herein in its entirety.

BACKGROUND

Quantum computing refers to the field of research related to computation systems that use quantum mechanical phenomena to manipulate data. These quantum mechanical phenomena, such as superposition (in which a quantum variable can simultaneously exist in multiple different states) and entanglement (in which multiple quantum variables have related states irrespective of the distance between them in space or time), do not have analogs in the world of classical computing, and thus cannot be implemented with classical computing devices.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 1-3 are cross-sectional views of a quantum dot device, in accordance with various embodiments.

FIGS. 4-25 illustrate various example stages in the manufacture of a quantum dot device, in accordance with various embodiments.

FIG. 54 is a perspective view of an assembly that may be formed in the manufacture of the quantum dot device of FIG. 53, in accordance with various embodiments.

FIG. 55 is a flow diagram of an illustrative method of manufacturing a quantum dot device, in accordance with various embodiments.

FIGS. 56-57 are flow diagrams of illustrative methods of operating a quantum dot device, in accordance with various embodiments.

DETAILED DESCRIPTION

Figure 1:
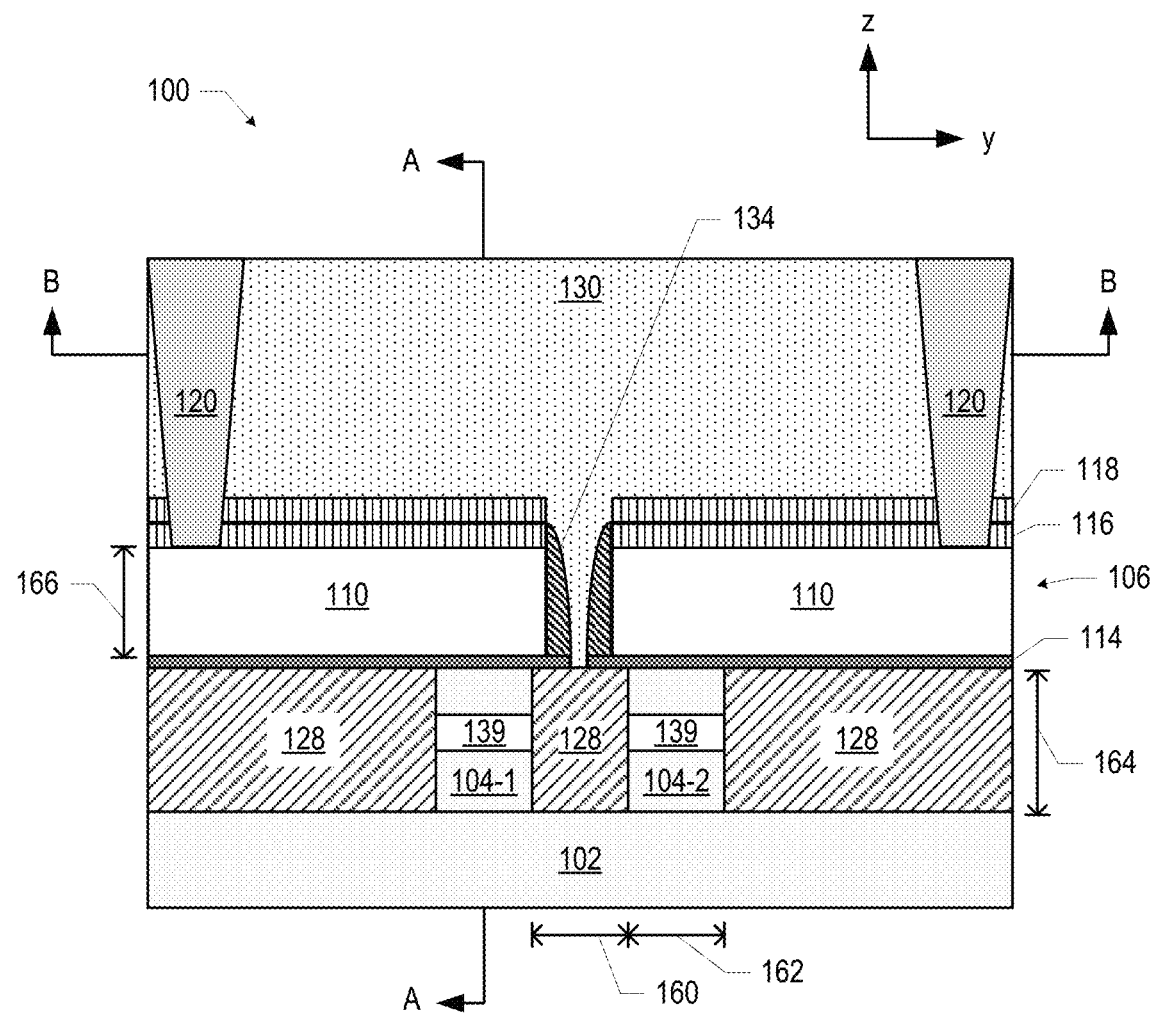

Disclosed herein are quantum dot devices, as well as related computing devices and methods. For example, in some embodiments, a quantum dot device may include: a quantum well stack including a quantum well layer, a doped layer, and a barrier layer disposed between the doped layer and the quantum well layer; and gates disposed above the quantum well stack. The doped layer may include a first material and a dopant, the first material may have a first diffusivity of the dopant, the barrier layer may include a second material having a second diffusivity of the dopant, and the second diffusivity may be less than the first diffusivity.

The quantum dot devices disclosed herein may enable the formation of quantum dots to serve as quantum bits ("qubits") in a quantum computing device, as well as the control of these quantum dots to perform quantum logic operations. Unlike previous approaches to quantum dot formation and manipulation, various embodiments of the quantum dot devices disclosed herein provide strong spatial localization of the quantum dots (and therefore good control over quantum dot interactions and manipulation), good scalability in the number of quantum dots included in the device, and/or design flexibility in making electrical connections to the quantum dot devices to integrate the quantum dot devices in larger computing devices.

In the following detailed description, reference is made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. As used herein, a "high-k dielectric" refers to a material having a higher dielectric constant than silicon oxide.

Figure 2:
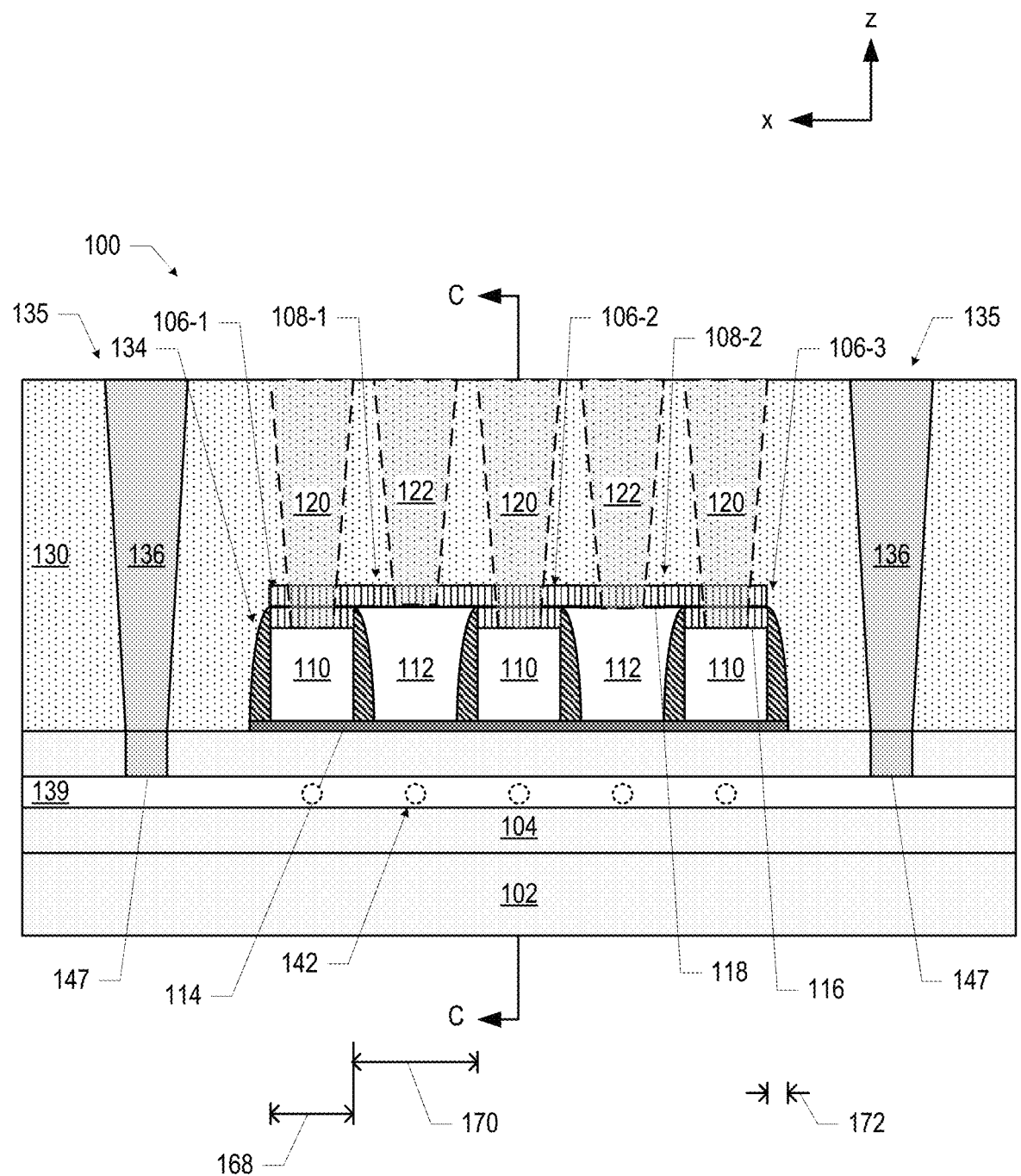

FIGS. 1-3 are cross-sectional views of a quantum dot device 100, in accordance with various embodiments. In particular, FIG. 2 illustrates the quantum dot device 100 taken along the section A-A of FIG. 1 (while FIG. 1 illustrates the quantum dot device 100 taken along the section C-C of FIG. 2), and FIG. 3 illustrates the quantum dot device 100 taken along the section B-B of FIG. 1 with a number of components not shown to more readily illustrate how the gates 106/108 may be patterned (while FIG. 1 illustrates a quantum dot device 100 taken along the section D-D of FIG. 3). Although FIG. 1 indicates that the cross-section illustrated in FIG. 2 is taken through the fin 104-1, an analogous cross section taken through the fin 104-2 may be identical, and thus the discussion of FIG. 2 refers generally to the "fin 104."

The quantum dot device 100 may include a base 102 and multiple fins 104 extending away from the base 102. The base 102 and the fins 104 may include a substrate and a quantum well stack (not shown in FIGS. 1-3, but discussed below with reference to the substrate 144 and the quantum well stack 146), distributed in any of a number of ways between the base 102 and the fins 104. The base 102 may include at least some of the substrate, and the fins 104 may each include a modulation doped stack 139 that includes a quantum well layer, one or more doped layers, and one or more barrier layers disposed between the quantum well layer and one or various ones of the doped layer(s). Examples of modulation doped stacks 139 are discussed below with reference to the quantum well stacks 146 of FIGS. 30-35, and examples of base/fin arrangements are discussed below with reference to the base/fin arrangements 158 of FIGS. 36-42.

Although only two fins, 104-1 and 104-2, are shown in FIGS. 1-3, this is simply for ease of illustration, and more than two fins 104 may be included in the quantum dot device 100. In some embodiments, the total number of fins 104 included in the quantum dot device 100 is an even number, with the fins 104 organized into pairs including one active fin 104 and one read fin 104, as discussed in detail below. When the quantum dot device 100 includes more than two fins 104, the fins 104 may be arranged in pairs in a line (e.g., 2N fins total may be arranged in a 1×2N line, or a 2×N line) or in pairs in a larger array (e.g., 2N fins total may be arranged as a 4×N/2 array, a 6×N/3 array, etc.). The discussion herein will largely focus on a single pair of fins 104 for ease of illustration, but all the teachings of the present disclosure apply to quantum dot devices 100 with more fins 104.

As noted above, each of the fins 104 may include a quantum well layer (not shown in FIGS. 1-3, but discussed below with reference to the quantum well layer 152). The quantum well layer included in the fins 104 may be arranged normal to the z-direction, and may provide a layer in which a two-dimensional electron gas (2DEG) may form to enable the generation of a quantum dot during operation of the quantum dot device 100, as discussed in further detail below. The quantum well layer itself may provide a geometric constraint on the z-location of quantum dots in the fins 104, and the limited extent of the fins 104 (and therefore the quantum well layer) in the y-direction may provide a geometric constraint on the y-location of quantum dots in the fins 104. To control the x-location of quantum dots in the fins 104, voltages may be applied to gates disposed on the fins 104 to adjust the energy profile along the fins 104 in the x-direction and thereby constrain the x-location of quantum dots within quantum wells (discussed in detail below with reference to the gates 106/108). The dimensions of the fins 104 may take any suitable values. For example, in some embodiments, the fins 104 may each have a width 162 between 10 and 30 nanometers. In some embodiments, the fins 104 may each have a height 164 between 200 and 400 nanometers (e.g., between 250 and 350 nanometers, or equal to 300 nanometers).

The fins 104 may be arranged in parallel, as illustrated in FIGS. 1 and 3, and may be spaced apart by an insulating material 128, which may be disposed on opposite faces of the fins 104. The insulating material 128 may be a dielectric material, such as silicon oxide. For example, in some embodiments, the fins 104 may be spaced apart by a distance 160 between 100 and 250 microns.

Multiple gates may be disposed on each of the fins 104. In the embodiment illustrated in FIG. 2, three gates 106 and two gates 108 are shown as distributed on the top of the fin 104. This particular number of gates is simply illustrative, and any suitable number of gates may be used. Additionally, as discussed below with reference to FIG. 46, multiple groups of gates (like the gates illustrated in FIG. 2) may be disposed on the fin 104.

As shown in FIG. 2, the gate 108-1 may be disposed between the gates 106-1 and 106-2, and the gate 108-2 may be disposed between the gates 106-2 and 106-3. Each of the gates 106/108 may include a gate dielectric 114; in the embodiment illustrated in FIG. 2, the gate dielectric 114 for all of the gates 106/108 is provided by a common layer of gate dielectric material. In other embodiments, the gate dielectric 114 for each of the gates 106/108 may be provided by separate portions of gate dielectric 114 (e.g., as discussed below with reference to FIGS. 47-51). In some embodiments, the gate dielectric 114 may be a multilayer gate dielectric (e.g., with multiple materials used to improve the interface between the fin 104 and the corresponding gate metal). The gate dielectric 114 may be, for example, silicon oxide, aluminum oxide, or a high-k dielectric, such as hafnium oxide. More generally, the gate dielectric 114 may include elements such as hafnium, silicon, oxygen, titanium, tantalum, lanthanum, aluminum, zirconium, barium, strontium, yttrium, lead, scandium, niobium, and zinc. Examples of materials that may be used in the gate dielectric 114 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, an annealing process may be carried out on the gate dielectric 114 to improve the quality of the gate dielectric 114.

Each of the gates 106 may include a gate metal 110 and a hardmask 116. The hardmask 116 may be formed of silicon nitride, silicon carbide, or another suitable material. The gate metal 110 may be disposed between the hardmask 116 and the gate dielectric 114, and the gate dielectric 114 may be disposed between the gate metal 110 and the fin 104. Only one portion of the hardmask 116 is labeled in FIG. 2 for ease of illustration. In some embodiments, the gate metal 110 may be a superconductor, such as aluminum, titanium nitride (e.g., deposited via atomic layer deposition), or niobium titanium nitride. In some embodiments, the hardmask 116 may not be present in the quantum dot device 100 (e.g., a hardmask like the hardmask 116 may be removed during processing, as discussed below). The sides of the gate metal 110 may be substantially parallel, as shown in FIG. 2, and insulating spacers 134 may be disposed on the sides of the gate metal 110 and the hardmask 116. As illustrated in FIG. 2, the spacers 134 may be thicker closer to the fin 104 and thinner farther away from the fin 104. In some embodiments, the spacers 134 may have a convex shape. The spacers 134 may be formed of any suitable material, such as a carbon-doped oxide, silicon nitride, silicon oxide, or other carbides or nitrides (e.g., silicon carbide, silicon nitride doped with carbon, and silicon oxynitride). The gate metal 110 may be any suitable metal, such as titanium nitride.

Each of the gates 108 may include a gate metal 112 and a hardmask 118. The hardmask 118 may be formed of silicon nitride, silicon carbide, or another suitable material. The gate metal 112 may be disposed between the hardmask 118 and the gate dielectric 114, and the gate dielectric 114 may be disposed between the gate metal 112 and the fin 104. In the embodiment illustrated in FIG. 2, the hardmask 118 may extend over the hardmask 116 (and over the gate metal 110 of the gates 106), while in other embodiments, the hardmask 118 may not extend over the gate metal 110 (e.g., as discussed below with reference to FIG. 48). In some embodiments, the gate metal 112 may be a different metal from the gate metal 110; in other embodiments, the gate metal 112 and the gate metal 110 may have the same material composition. In some embodiments, the gate metal 112 may be a superconductor, such as aluminum, titanium nitride (e.g., deposited via atomic layer deposition), or niobium titanium nitride. In some embodiments, the hardmask 118 may not be present in the quantum dot device 100 (e.g., a hardmask like the hardmask 118 may be removed during processing, as discussed below).

The gate 108-1 may extend between the proximate spacers 134 on the sides of the gate 106-1 and the gate 106-2, as shown in FIG. 2. In some embodiments, the gate metal 112 of the gate 108-1 may extend between the spacers 134 on the sides of the gate 106-1 and the gate 106-2. Thus, the gate metal 112 of the gate 108-1 may have a shape that is substantially complementary to the shape of the spacers 134, as shown. Similarly, the gate 108-2 may extend between the proximate spacers 134 on the sides of the gate 106-2 and the gate 106-3. In some embodiments in which the gate dielectric 114 is not a layer shared commonly between the gates 108 and 106, but instead is separately deposited on the fin 104 between the spacers 134 (e.g., as discussed below with reference to FIGS. 47-51), the gate dielectric 114 may extend at least partially up the sides of the spacers 134, and the gate metal 112 may extend between the portions of gate dielectric 114 on the spacers 134. The gate metal 112, like the gate metal 110, may be any suitable metal, such as titanium nitride.

The dimensions of the gates 106/108 may take any suitable values. For example, in some embodiments, the z-height 166 of the gate metal 110 may be between 40 and 75 nanometers (e.g., approximately 50 nanometers); the z-height of the gate metal 112 may be in the same range. In embodiments like the ones illustrated in FIGS. 2, 45, and 52, the z-height of the gate metal 112 may be greater than the z-height of the gate metal 110. In some embodiments, the length 168 of the gate metal 110 (i.e., in the x-direction) may be between 20 and 40 nanometers (e.g., 30 nanometers). In some embodiments, the distance 170 between adjacent ones of the gates 106 (e.g., as measured from the gate metal 110 of one gate 106 to the gate metal 110 of an adjacent gate 106 in the x-direction, as illustrated in FIG. 2) may be between 40 and 60 nanometers (e.g., 50 nanometers). In some embodiments, the thickness 172 of the spacers 134 may be between 1 and 10 nanometers (e.g., between 3 and 5 nanometers, between 4 and 6 nanometers, or between 4 and 7 nanometers). The length of the gate metal 112 (i.e., in the x-direction) may depend on the dimensions of the gates 106 and the spacers 134, as illustrated in FIG. 2. As indicated in FIG. 1, the gates 106/108 on one fin 104 may extend over the insulating material 128 beyond their respective fins 104 and toward the other fin 104, but may be isolated from their counterpart gates by the intervening insulating material 130 and spacers 134.

As shown in FIG. 2, the gates 106 and 108 may be alternatingly arranged along the fin 104 in the x-direction. During operation of the quantum dot device 100, voltages may be applied to the gates 106/108 to adjust the potential energy in the quantum well layer (not shown) in the fin 104 to create quantum wells of varying depths in which quantum dots 142 may form. Only one quantum dot 142 is labeled with a reference numeral in FIGS. 2 and 3 for ease of illustration, but five are indicated as dotted circles in each fin 104. The location of the quantum dots 142 in FIG. 2 is not intended to indicate a particular geometric positioning of the quantum dots 142 in the z-direction. The spacers 134 may themselves provide "passive" barriers between quantum wells under the gates 106/108 in the quantum well layer, and the voltages applied to different ones of the gates 106/108 may adjust the potential energy under the gates 106/108 in the quantum well layer; decreasing the potential energy may form quantum wells, while increasing the potential energy may form quantum barriers.

The modulation doped stack 139 may include one or more doped layers that may serve as reservoirs of charge carriers for the quantum dot device 100. For example, an n-type doped layer may supply electrons for electron-type quantum dots 142, and a p-type doped layer may supply holes for hole-type quantum dots 142. The one or more doped layers may be spaced apart from the quantum well layer in the modulation doped stack 139 (e.g., by one or more barrier layers) to allow charge carriers to flow into the quantum well layer without "contaminating" the quantum well layer with the ionized impurities that would be present in the quantum well layer if it were directly doped. Examples of doped layers, barrier layers, and quantum well layers are discussed below with reference to the doped layers 137, the barrier layers 157, and the quantum well layers 152, respectively.

The quantum dot devices 100 disclosed herein may be used to form electron-type or hole-type quantum dots 142. Note that the polarity of the voltages applied to the gates 106/108 to form quantum wells/barriers depend on the charge carriers used in the quantum dot device 100. In embodiments in which the charge carriers are electrons (and thus the quantum dots 142 are electron-type quantum dots), amply negative voltages applied to a gate 106/108 may increase the potential barrier under the gate 106/108, and amply positive voltages applied to a gate 106/108 may decrease the potential barrier under the gate 106/108 (thereby forming a potential well in which an electron-type quantum dot 142 may form). In embodiments in which the charge carriers are holes (and thus the quantum dots 142 are hole-type quantum dots), amply positive voltages applied to a gate 106/108 may increase the potential barrier under the gate 106/108, and amply negative voltages applied to a gate 106 and 108 may decrease the potential barrier under the gate 106/108 (thereby forming a potential well in which a hole-type quantum dot 142 may form). The quantum dot devices 100 disclosed herein may be used to form electron-type or hole-type quantum dots.

Voltages may be applied to each of the gates 106 and 108 separately to adjust the potential energy in the quantum well layer under the gates 106 and 108, and thereby control the formation of quantum dots 142 under each of the gates 106 and 108. Additionally, the relative potential energy profiles under different ones of the gates 106 and 108 allow the quantum dot device 100 to tune the potential interaction between quantum dots 142 under adjacent gates. For example, if two adjacent quantum dots 142 (e.g., one quantum dot 142 under a gate 106 and another quantum dot 142 under a gate 108) are separated by only a short potential barrier, the two quantum dots 142 may interact more strongly than if they were separated by a taller potential barrier. Since the depth of the potential wells/height of the potential barriers under each gate 106/108 may be adjusted by adjusting the voltages on the respective gates 106/108, the differences in potential between adjacent gates 106/108 may be adjusted, and thus the interaction tuned.

In some applications, the gates 108 may be used as plunger gates to enable the formation of quantum dots 142 under the gates 108, while the gates 106 may be used as barrier gates to adjust the potential barrier between quantum dots 142 formed under adjacent gates 108. In other applications, the gates 108 may be used as barrier gates, while the gates 106 are used as plunger gates. In other applications, quantum dots 142 may be formed under all of the gates 106 and 108, or under any desired subset of the gates 106 and 108.

Conductive vias and lines may make contact with the gates 106/108, and to the modulation doped stack 139, to enable electrical connection to the gates 106/108 and the modulation doped stack 139 to be routed in desired locations. As shown in FIGS. 1-3, the gates 106 may extend away from the fins 104, and conductive vias 120 may contact the gates 106 (and are drawn in dashed lines in FIG. 2 to indicate their location behind the plane of the drawing). The conductive vias 120 may extend through the hardmask 116 and the hardmask 118 to contact the gate metal 110 of the gates 106. The gates 108 may extend away from the fins 104, and conductive vias 122 may contact the gates 108 (also drawn in dashed lines in FIG. 2 to indicate their location behind the plane of the drawing). The conductive vias 122 may extend through the hardmask 118 to contact the gate metal 112 of the gates 108. Conductive pathways 135 may extend through the insulating material 130 and into the fin 104 to contact the modulation doped stack 139. In the embodiment illustrated in FIG. 2, the conductive pathways 135 may include conductive vias 136 (extending through the insulating material 130 to the fin 104) and conductive bridges 147 (extending into the fin 104 to make contact with the doped layer(s) and the quantum well layer of the modulation doped stack 139). In the embodiment illustrated in FIG. 2, the conductive bridges 147 may be formed by ion implantation of dopants (e.g., n-type or p-type dopants, as appropriate) into the fin 104 so as to form a conductive region between the conductive vias 136 and the quantum well layer and doped layer(s) of the modulation doped stack 139 (e.g., as discussed below with reference to FIG. 24). In other embodiments, the conductive pathways 135 to the modulation doped stack 139 may take other forms (e.g., as discussed below with reference to FIGS. 26-29). The quantum dot device 100 may include further conductive vias and/or lines (not shown) to make electrical contact to the gates 106/108 and/or the modulation doped stack 139, as desired. The conductive vias and lines included in a quantum dot device 100 may include any suitable materials, such as copper, tungsten (deposited, e.g., by CVD), or a superconductor (e.g., aluminum, tin, titanium nitride, niobium titanium nitride, tantalum, niobium, or other niobium compounds such as niobium tin and niobium germanium).

During operation, a bias voltage may be applied to the quantum well layer (e.g., via the conductive pathways 135) to cause current to flow through the quantum well layer. When a doped layer includes an n-type dopant, and thus the carriers that flow through the quantum well layer are electrons, this voltage may be positive; when a doped layer a p-type dopant, and thus the carriers that flow through the quantum well layer are holes, this voltage may be negative. The magnitude of this bias voltage may take any suitable value (e.g., between 0.25 volts and 2 volts). Layers other than the quantum well layer in the quantum well stack (e.g., the doped layer(s) of the modulation doped stack 139) may have higher threshold voltages for conduction than the quantum well layer so that when the quantum well layer is biased at its threshold voltage, the quantum well layer conducts and the other layers of the quantum well stack do not. This may avoid parallel conduction in both the quantum well layer and the other layers, and thus avoid compromising the strong mobility of the quantum well layer with conduction in layers having inferior mobility.

The conductive vias 120, 122, and 136 may be electrically isolated from each other by an insulating material 130. The insulating material 130 may be any suitable material, such as an interlayer dielectric (ILD). Examples of the insulating material 130 may include silicon oxide, silicon nitride, aluminum oxide, carbon-doped oxide, and/or silicon oxynitride. As known in the art of integrated circuit manufacturing, conductive vias and lines may be formed in an iterative process in which layers of structures are formed on top of each other. In some embodiments, the conductive vias 120/122/136 may have a width that is 20 nanometers or greater at their widest point (e.g., 30 nanometers), and a pitch of 80 nanometers or greater (e.g., 100 nanometers). In some embodiments, conductive lines (not shown) included in the quantum dot device 100 may have a width that is 100 nanometers or greater, and a pitch of 100 nanometers or greater. The particular arrangement of conductive vias shown in FIGS. 1-3 is simply illustrative, and any electrical routing arrangement may be implemented.

As discussed above, the structure of the fin 104-1 may be the same as the structure of the fin 104-2; similarly, the construction of gates 106/108 on the fin 104-1 may be the same as the construction of gates 106/108 on the fin 104-2. The gates 106/108 on the fin 104-1 may be mirrored by corresponding gates 106/108 on the parallel fin 104-2, and the insulating material 130 may separate the gates 106/108 on the different fins 104-1 and 104-2. In particular, quantum dots 142 formed in the fin 104-1 (under the gates 106/108) may have counterpart quantum dots 142 in the fin 104-2 (under the corresponding gates 106/108). In some embodiments, the quantum dots 142 in the fin 104-1 may be used as "active" quantum dots in the sense that these quantum dots 142 act as qubits and are controlled (e.g., by voltages applied to the gates 106/108 of the fin 104-1) to perform quantum computations. The quantum dots 142 in the fin 104-2 may be used as "read" quantum dots in the sense that these quantum dots 142 may sense the quantum state of the quantum dots 142 in the fin 104-1 by detecting the electric field generated by the charge in the quantum dots 142 in the fin 104-1, and may convert the quantum state of the quantum dots 142 in the fin 104-1 into electrical signals that may be detected by the gates 106/108 on the fin 104-2. Each quantum dot 142 in the fin 104-1 may be read by its corresponding quantum dot 142 in the fin 104-2. Thus, the quantum dot device 100 enables both quantum computation and the ability to read the results of a quantum computation.

The quantum dot devices 100 disclosed herein may be manufactured using any suitable techniques. FIGS. 4-25 illustrate various example stages in the manufacture of the quantum dot device 100 of FIGS. 1-3, in accordance with various embodiments. Although the particular manufacturing operations discussed below with reference to FIGS. 4-25 are illustrated as manufacturing a particular embodiment of the quantum dot device 100, these operations may be applied to manufacture many different embodiments of the quantum dot device 100, as discussed herein. Any of the elements discussed below with reference to FIGS. 4-25 may take the form of any of the embodiments of those elements discussed above (or otherwise disclosed herein).

FIG. 4 illustrates a cross-sectional view of an assembly 200 including a substrate 144. The substrate 144 may include any suitable semiconductor material or materials. In some embodiments, the substrate 144 may include a semiconductor material. For example, the substrate 144 may include silicon (e.g., may be formed from a silicon wafer).

FIG. 5 illustrates a cross-sectional view of an assembly 202 subsequent to providing a quantum well stack 146 on the substrate 144 of the assembly 200 (FIG. 4). The quantum well stack 146 may include a modulation doped stack 139 including a quantum well layer (not shown) in which a 2DEG may form during operation of the quantum dot device 100. Various embodiments of the quantum well stack 146 are discussed below with reference to FIGS. 30-35.

FIG. 6 illustrates a cross-sectional view of an assembly 204 subsequent to forming fins 104 in the assembly 202 (FIG. 5). The fins 104 may extend from a base 102, and may be formed in the assembly 202 by patterning and then etching the assembly 202, as known in the art. For example, a combination of dry and wet etch chemistry may be used to form the fins 104, and the appropriate chemistry may depend on the materials included in the assembly 202, as known in the art. At least some of the substrate 144 may be included in the base 102, and at least some of the quantum well stack 146 may be included in the fins 104. In particular, the quantum well layer (not shown) of the quantum well stack 146 may be included in the fins 104. In some embodiments, the modulation doped stack 139 may be included in the fins 104 (e.g., as shown). Example arrangements in which the quantum well stack 146 and the substrate 144 are differently included in the base 102 and the fins 104 are discussed below with reference to FIGS. 36-42.

FIG. 7 illustrates a cross-sectional view of an assembly 206 subsequent to providing an insulating material 128 to the assembly 204 (FIG. 6). Any suitable material may be used as the insulating material 128 to electrically insulate the fins 104 from each other. As noted above, in some embodiments, the insulating material 128 may be a dielectric material, such as silicon oxide.

Figure 8:
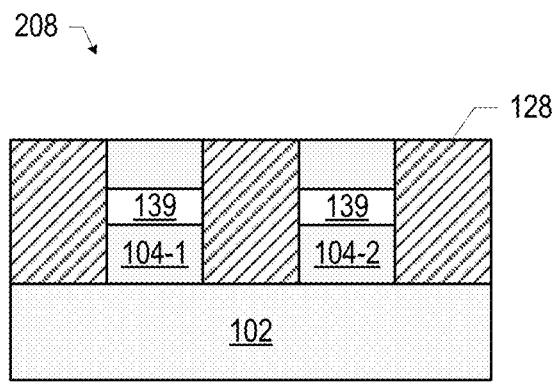

FIG. 8 illustrates a cross-sectional view of an assembly 208 subsequent to planarizing the assembly 206 (FIG. 7) to remove the insulating material 128 above the fins 104. In some embodiments, the assembly 206 may be planarized using a chemical mechanical polishing (CMP) technique.

Figure 9:
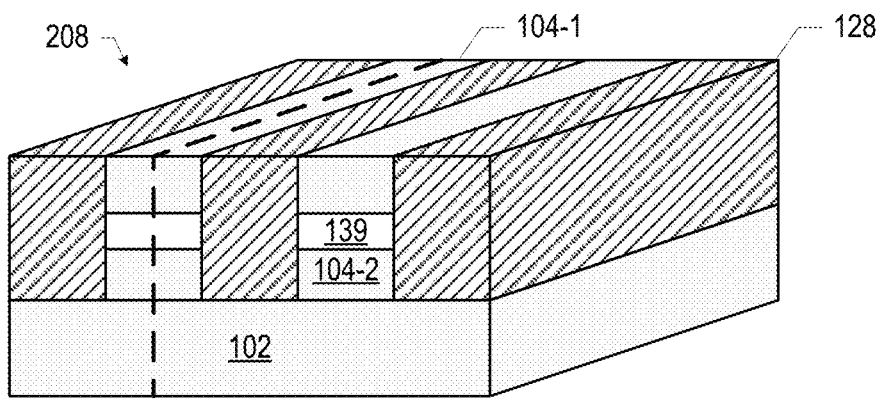
Figure 10:
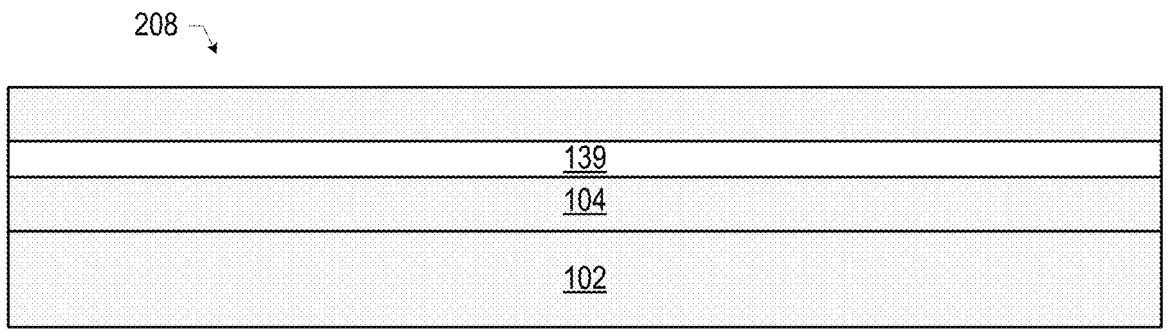

FIG. 9 is a perspective view of at least a portion of the assembly 208, showing the fins 104 extending from the base 102 and separated by the insulating material 128. The cross-sectional views of FIGS. 4-8 are taken parallel to the plane of the page of the perspective view of FIG. 9. FIG. 10 is another cross-sectional view of the assembly 208, taken along the dashed line along the fin 104-1 in FIG. 9. The cross-sectional views illustrated in FIGS. 11-25 are taken along the same cross-section as FIG. 10.

Figure 11:
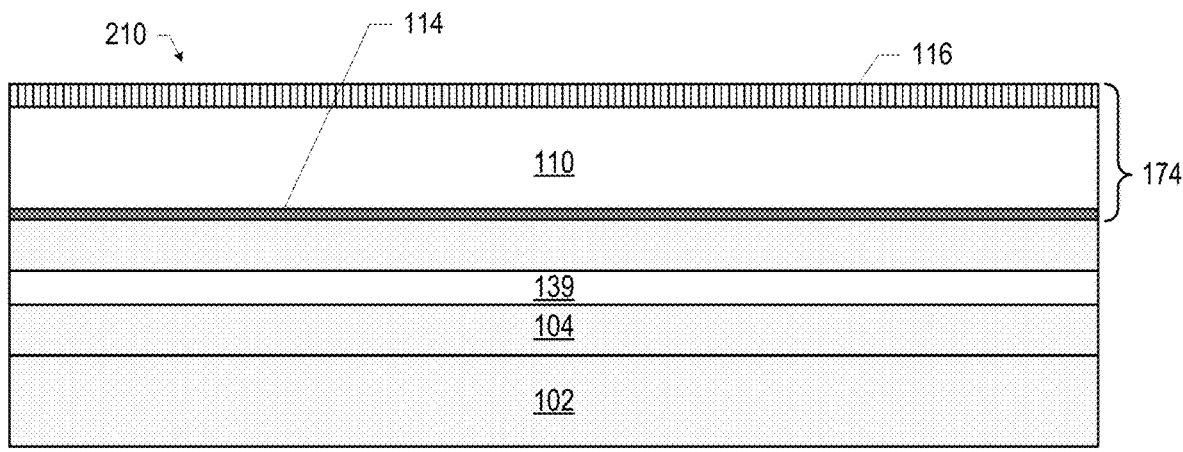

FIG. 11 is a cross-sectional view of an assembly 210 subsequent to forming a gate stack 174 on the fins 104 of the assembly 208 (FIGS. 8-10). The gate stack 174 may include the gate dielectric 114, the gate metal 110, and a hardmask 116. The hardmask 116 may be formed of an electrically insulating material, such as silicon nitride or carbon-doped nitride.

Figure 12:
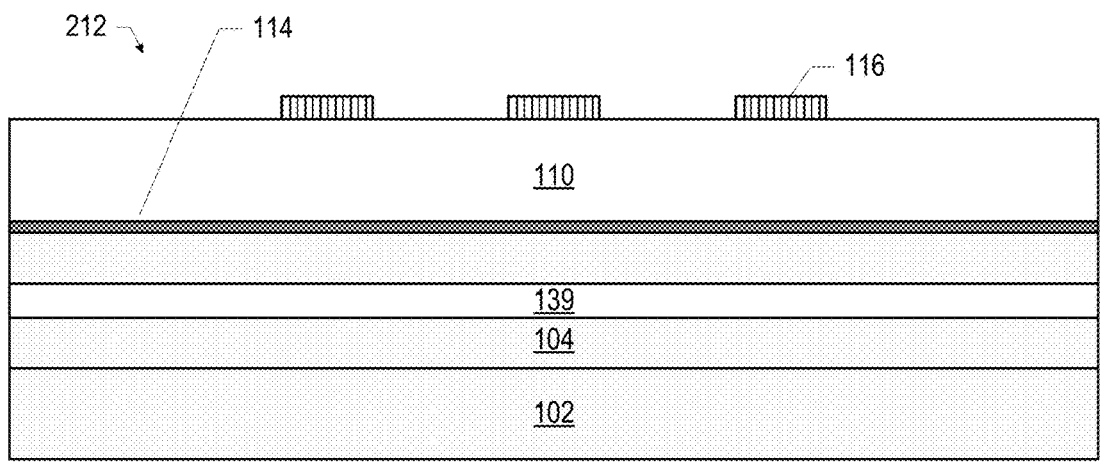

FIG. 12 is a cross-sectional view of an assembly 212 subsequent to patterning the hardmask 116 of the assembly 210 (FIG. 11). The pattern applied to the hardmask 116 may correspond to the locations for the gates 106, as discussed below. The hardmask 116 may be patterned by applying a resist, patterning the resist using lithography, and then etching the hardmask (using dry etching or any appropriate technique).

Figure 13:
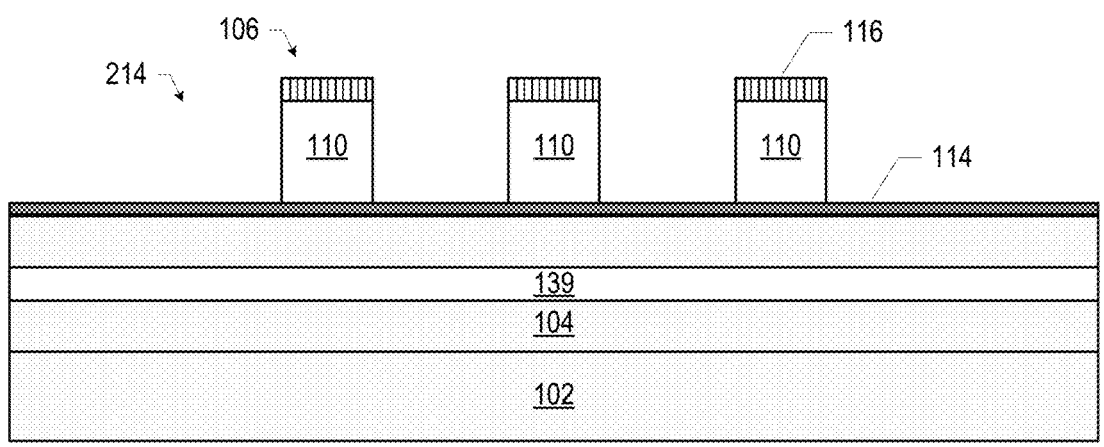

FIG. 13 is a cross-sectional view of an assembly 214 subsequent to etching the assembly 212 (FIG. 12) to remove the gate metal 110 that is not protected by the patterned hardmask 116 to form the gates 106. In some embodiments, as illustrated in FIG. 13, the gate dielectric 114 may remain after the etched gate metal 110 is etched away; in other embodiments, the gate dielectric 114 may also be etched during the etching of the gate metal 110. Examples of such embodiments are discussed below with reference to FIGS. 47-51.

Figure 14:
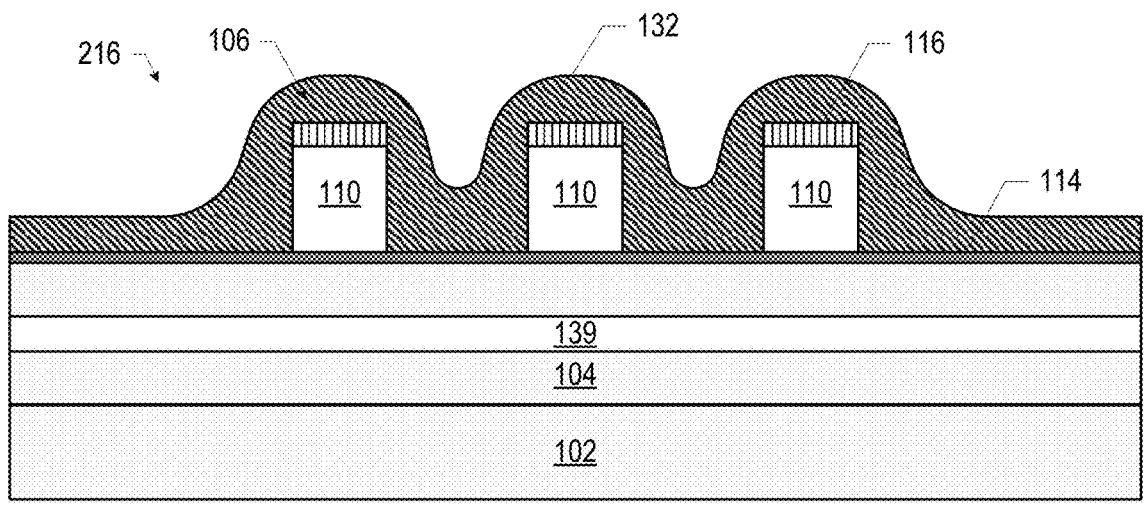

FIG. 14 is a cross-sectional view of an assembly 216 subsequent to providing spacer material 132 on the assembly 214 (FIG. 13). The spacer material 132 may include any of the materials discussed above with reference to the spacers 134, for example, and may be deposited using any suitable technique. For example, the spacer material 132 may be a nitride material (e.g., silicon nitride) deposited by sputtering.

Figure 15:
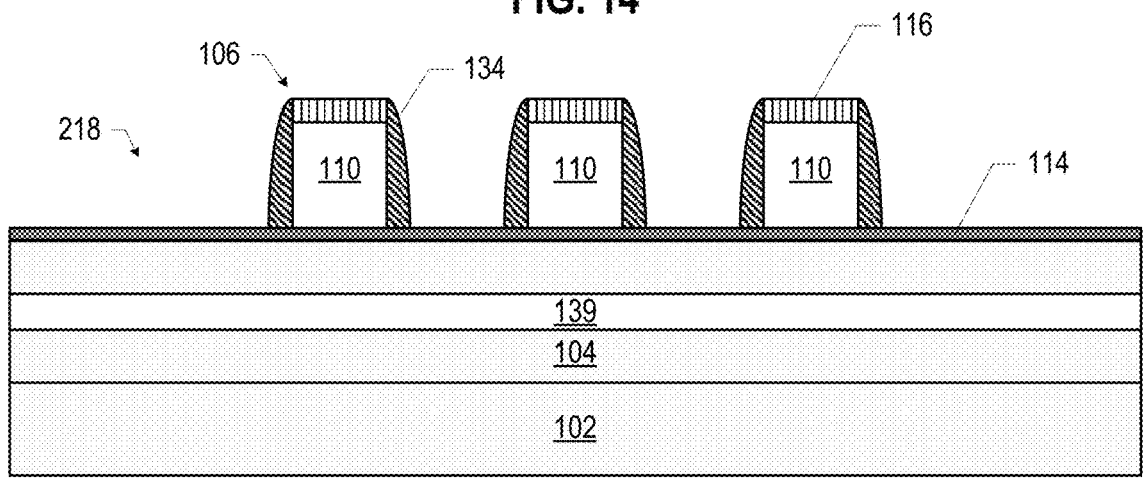

FIG. 15 is a cross-sectional view of an assembly 218 subsequent to etching the spacer material 132 of the assembly 216 (FIG. 14), leaving spacers 134 formed of the spacer material 132 on the sides of the gates 106 (e.g., on the sides of the hardmask 116 and the gate metal 110). The etching of the spacer material 132 may be an anisotropic etch, etching the spacer material 132 "downward" to remove the spacer material 132 on top of the gates 106 and in some of the area between the gates 106, while leaving the spacers 134 on the sides of the gates 106. In some embodiments, the anisotropic etch may be a dry etch.

Figure 16:
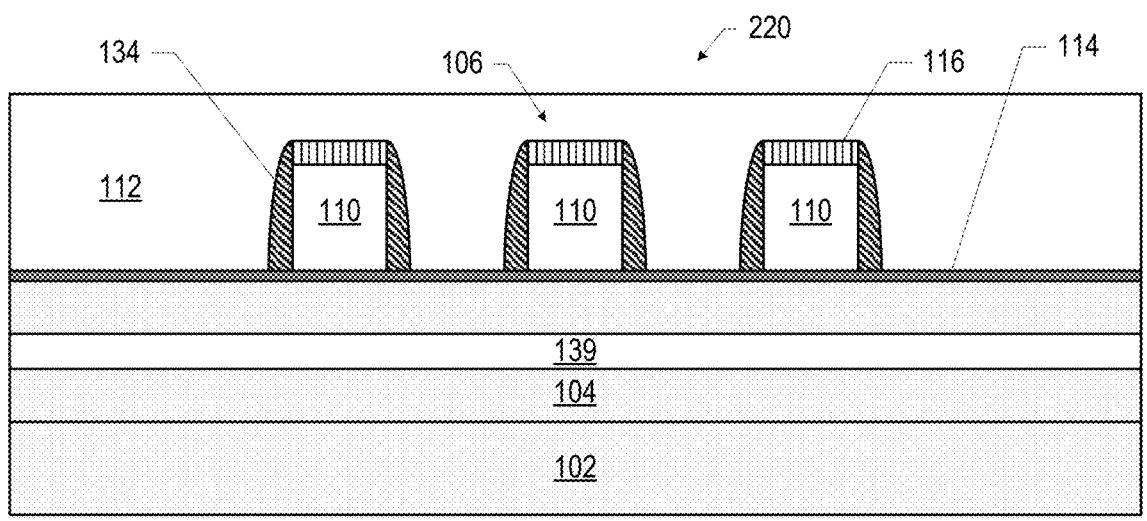

FIG. 16 is a cross-sectional view of an assembly 220 subsequent to providing the gate metal 112 on the assembly 218 (FIG. 15). The gate metal 112 may fill the areas between adjacent ones of the gates 106, and may extend over the tops of the gates 106.

Figure 17:
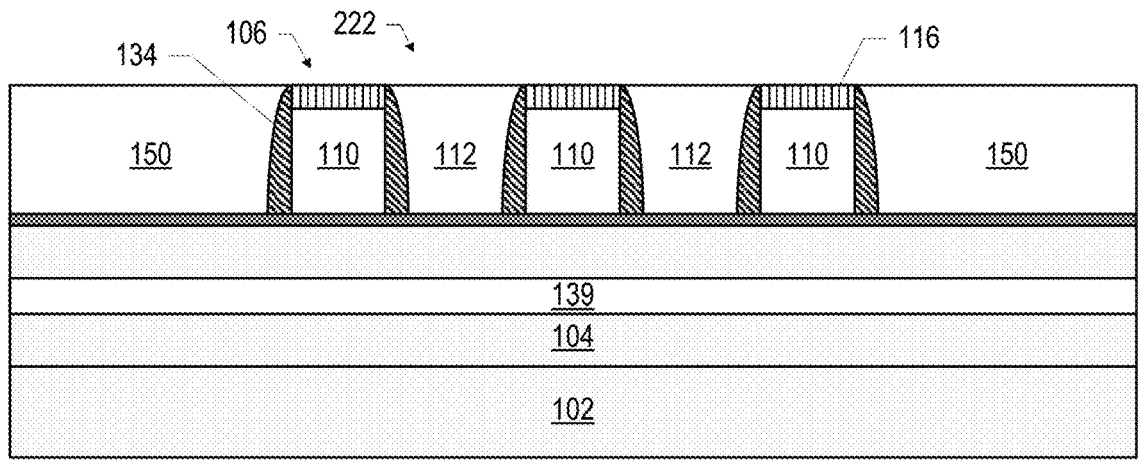

FIG. 17 is a cross-sectional view of an assembly 222 subsequent to planarizing the assembly 220 (FIG. 16) to remove the gate metal 112 above the gates 106. In some embodiments, the assembly 220 may be planarized using a CMP technique. Some of the remaining gate metal 112 may fill the areas between adjacent ones of the gates 106, while other portions 150 of the remaining gate metal 112 may be located "outside" of the gates 106.

Figure 18:
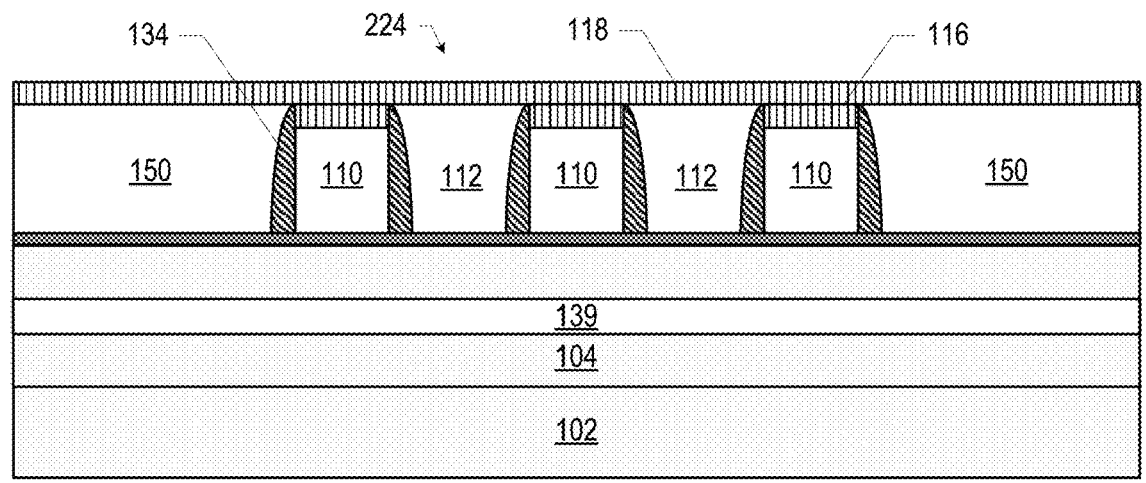

FIG. 18 is a cross-sectional view of an assembly 224 subsequent to providing a hardmask 118 on the planarized surface of the assembly 222 (FIG. 17). The hardmask 118 may be formed of any of the materials discussed above with reference to the hardmask 116, for example.

Figure 19:
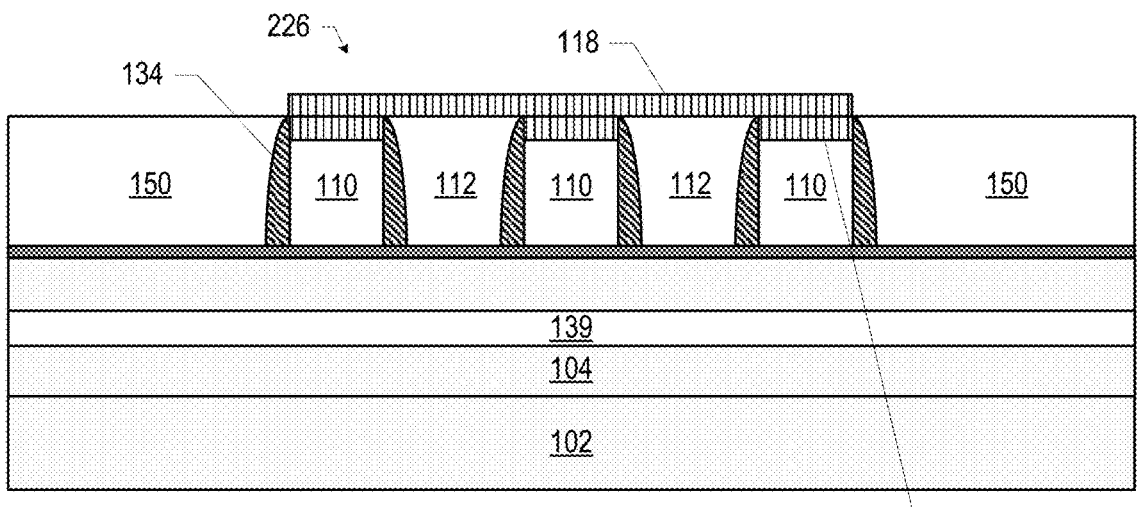

FIG. 19 is a cross-sectional view of an assembly 226 subsequent to patterning the hardmask 118 of the assembly 224 (FIG. 18). The pattern applied to the hardmask 118 may extend over the hardmask 116 (and over the gate metal 110 of the gates 106, as well as over the locations for the gates 108 (as illustrated in FIG. 2). The hardmask 118 may be non-coplanar with the hardmask 116, as illustrated in FIG. 19. The hardmask 118 illustrated in FIG. 19 may thus be a common, continuous portion of hardmask 118 that extends over all of the hardmask 116. Examples of embodiments in which the hardmask 118 is not disposed over the entirety of the hardmask 116 are discussed below with reference to FIGS. 43-45 and 52. The hardmask 118 may be patterned using any of the techniques discussed above with reference to the patterning of the hardmask 116, for example.

Figure 20:
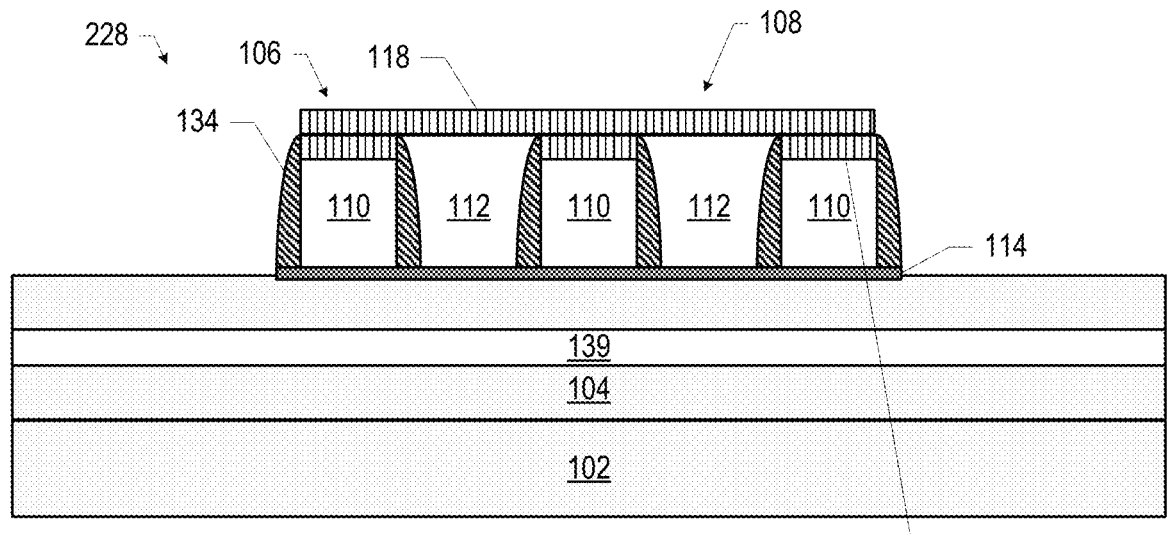

FIG. 20 is a cross-sectional view of an assembly 228 subsequent to etching the assembly 226 (FIG. 19) to remove the portions 150 that are not protected by the patterned hardmask 118 to form the gates 108. Portions of the hardmask 118 may remain on top of the hardmask 116, as shown. The operations performed on the assembly 226 may include removing any gate dielectric 114 that is "exposed" on the fin 104, as shown. The excess gate dielectric 114 may be removed using any suitable technique, such as chemical etching or silicon bombardment.

Figure 21:
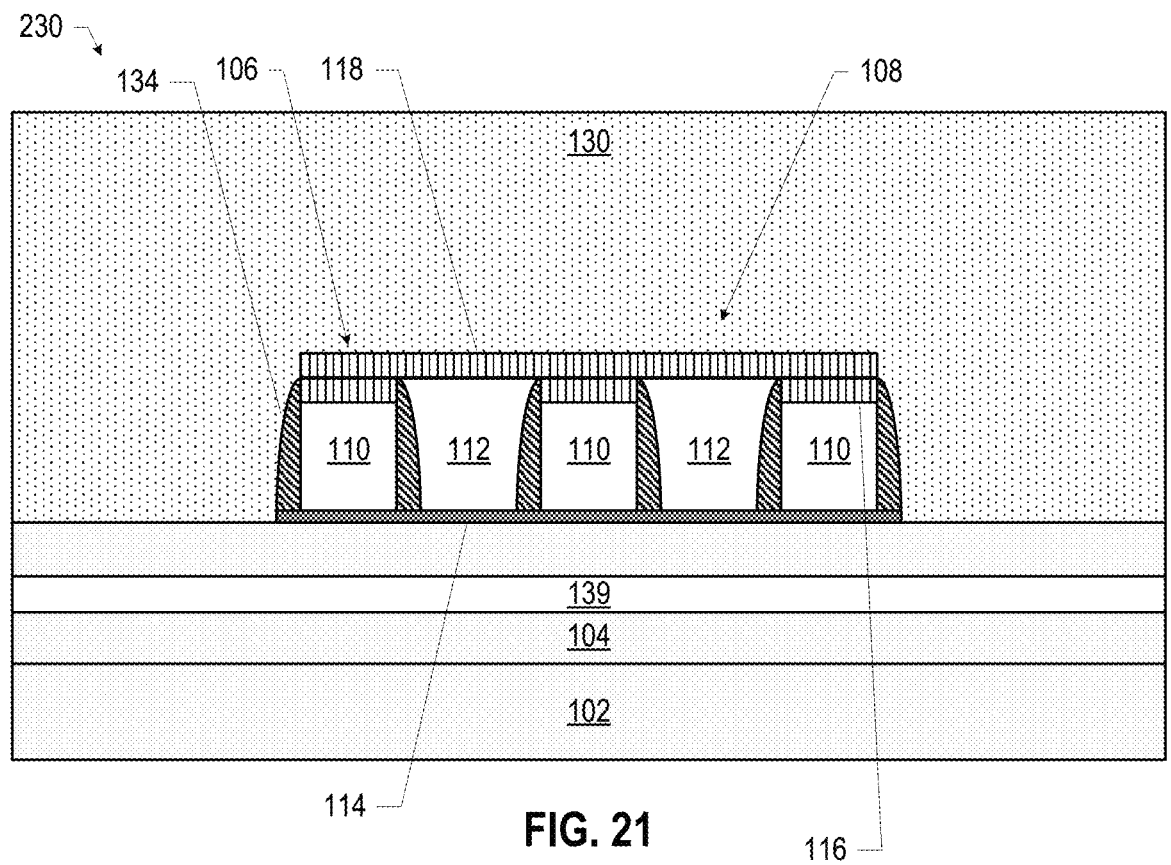

FIG. 21 is a cross-sectional view of an assembly 230 subsequent to providing an insulating material 130 on the assembly 228 (FIG. 20). The insulating material 130 may take any of the forms discussed above. For example, the insulating material 130 may be a dielectric material, such as silicon oxide. The insulating material 130 may be provided on the assembly 228 using any suitable technique, such as spin coating, chemical vapor deposition (CVD), or plasma-enhanced CVD (PECVD). In some embodiments, the insulating material 130 may be polished back after deposition, and before further processing.

Figure 22:
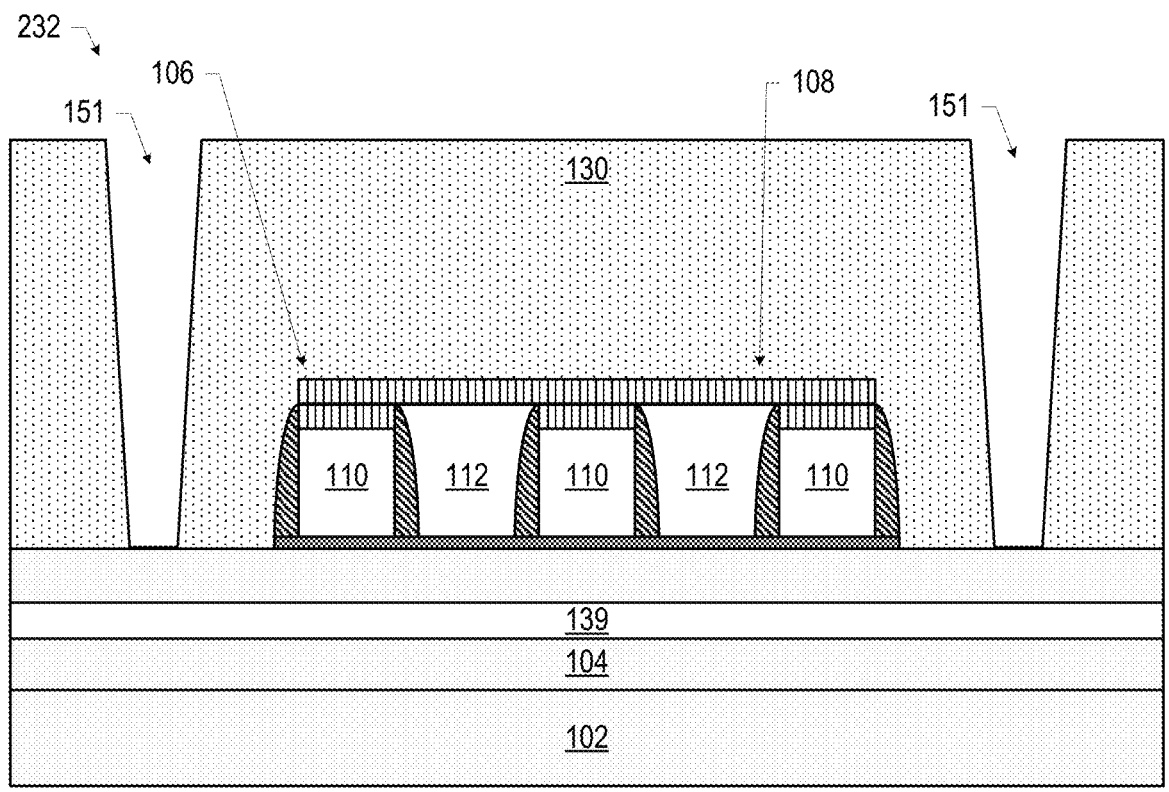

FIG. 22 is a cross-sectional view of an assembly 232 subsequent to forming, in the assembly 230 (FIG. 21), cavities 151 in the insulating material 130. The cavities 151 may extend down to the fin 104, and in some embodiments, may be tapered so as to be narrower proximate to the fin 104 (as shown). The cavities 151 may be formed using any suitable technique (e.g., laser or mechanical drilling, or using conventional lithography techniques for patterning and etching the cavities 151 in a low dielectric insulating material 130).

Figure 23:
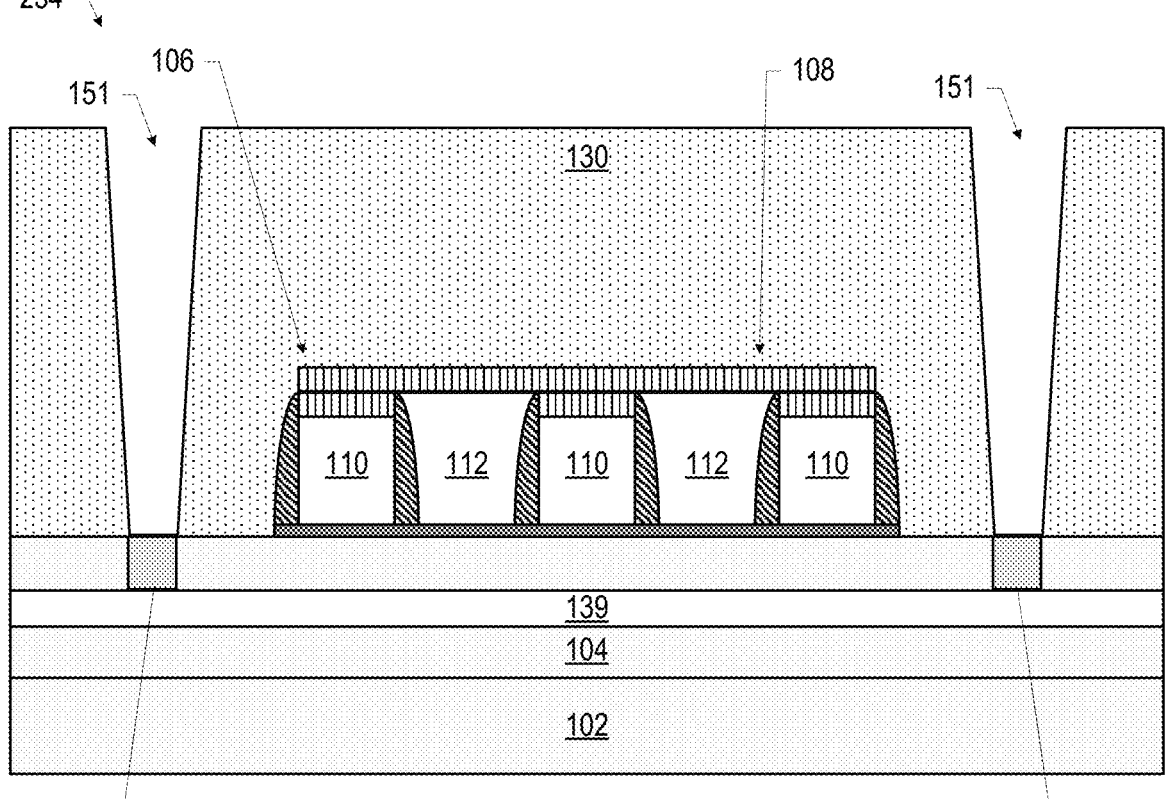

FIG. 23 is a cross-sectional view of an assembly 234 subsequent to performing ion implantation in the fin 104 of the assembly 232 (FIG. 22) at the base of the cavities 151 to create conductive bridges 147 in the fin 104 between the cavities 151 and the modulation doped stack 139. The conductive bridges 147 may extend to the doped layer(s) and the quantum well layer of the modulation doped stack 139. The type of dopant (e.g., n-type or p-type) implanted in the fin 104 to form the conductive bridge 147 may depend on the type of quantum dot device 100 (e.g., an n-type dopant for an electron-type device, and a p-type dopant for a hole-type device), and the density of doping may be selected to achieve a desired amount of conductivity for the relevant carrier.

Figure 24:
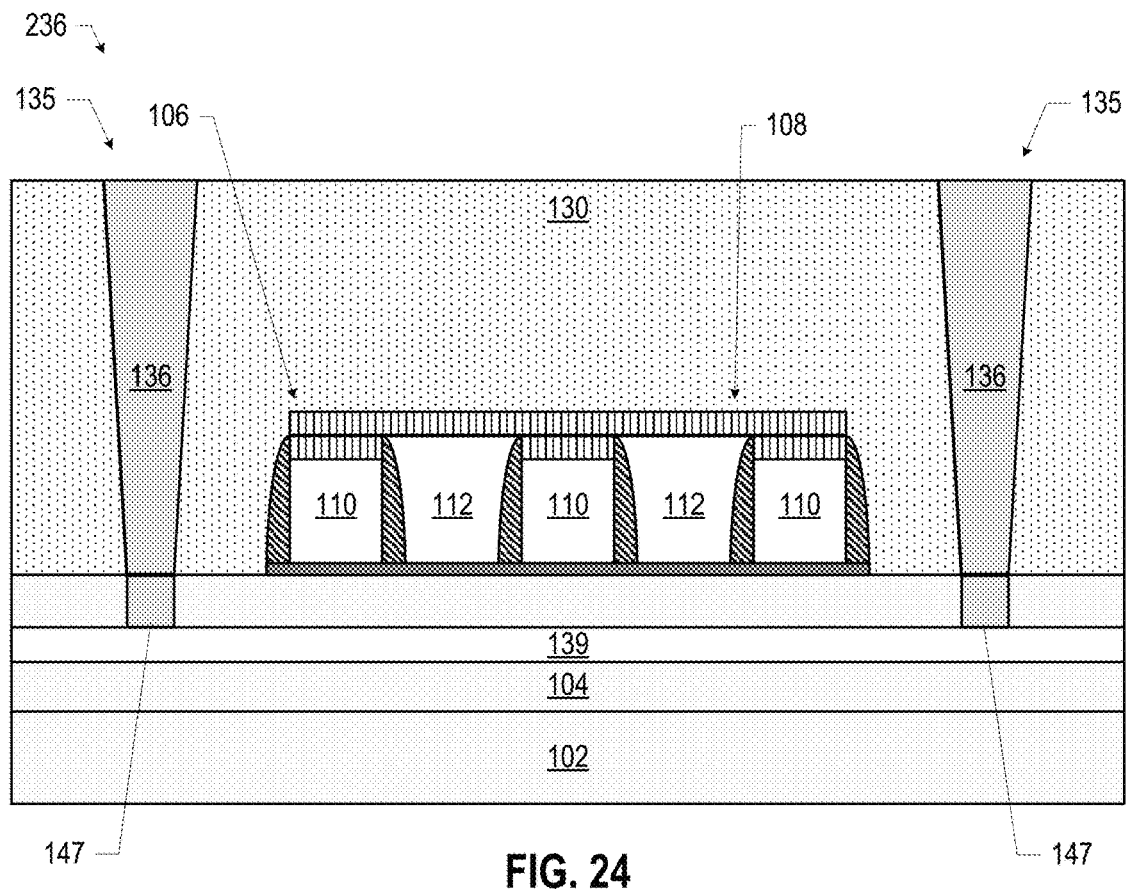

FIG. 24 is a cross-sectional view of an assembly 236 subsequent to filling the cavities 151 of the assembly 234 (FIG. 23) with a conductive material to form the conductive vias 136. The conductive material may include any suitable ones of the materials disclosed herein (e.g., a superconducting material), and the conductive material may be provided in the cavities 151 using any suitable deposition or growth technique (e.g., sputtering, electroless plating, CVD, ALD, or electroplating). In some embodiments, the filling of the cavities 151 may be part of a semi-additive fabrication process for forming interconnects within the quantum dot device 100, as known in the art. In the embodiment illustrated in FIG. 24, the conductive pathways 135 to the modulation doped stack 139 may include the conductive vias 136 and the conductive bridges 147.

Figure 25:
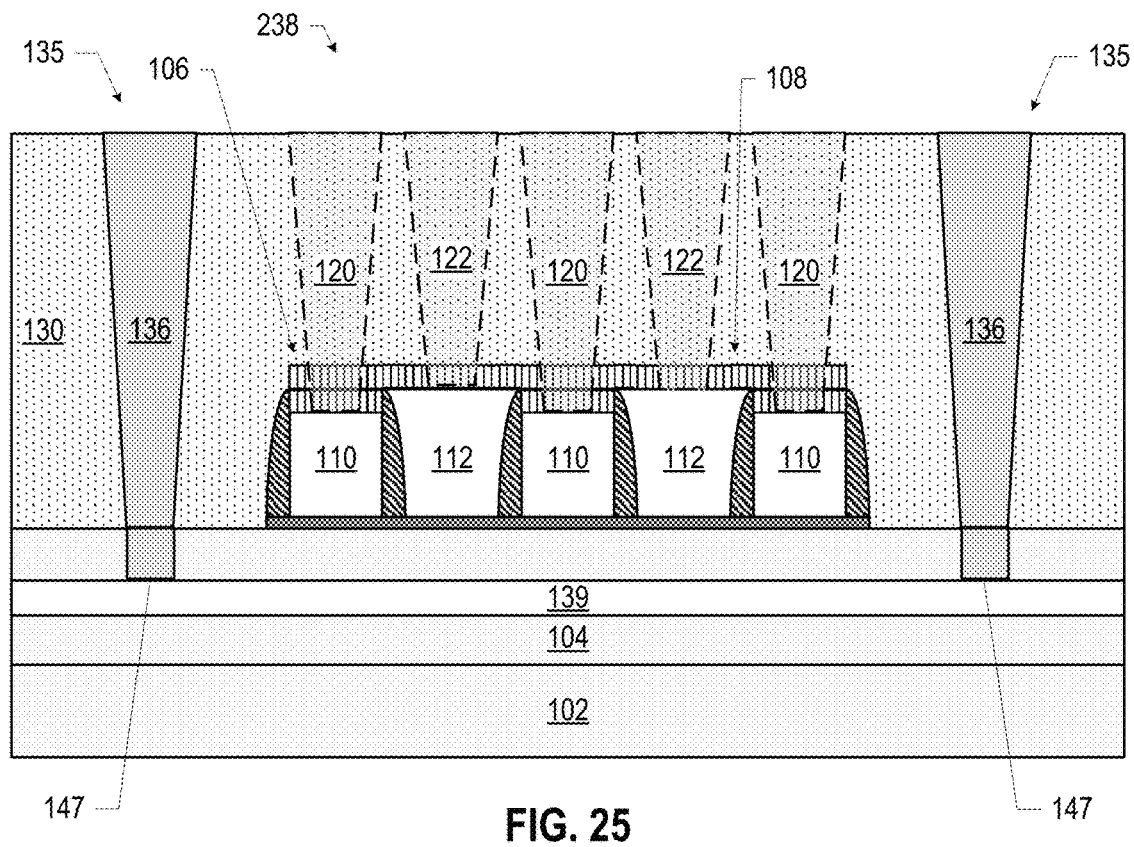

FIG. 25 is a cross-sectional view of an assembly 238 subsequent to forming, in the assembly 236 (FIG. 24), conductive vias 120 through the insulating material 130 (and the hardmasks 116 and 118) to contact the gate metal 110 of the gates 106, and conductive vias 122 through the insulating material 130 (and the hardmask 118) to contact the gate metal 112 of the gates 108. Further conductive vias and/or lines may be formed on the assembly 238 using conventional interconnect techniques, if desired. The resulting assembly 238 may take the form of the quantum dot device 100 discussed above with reference to FIGS. 1-3. In some embodiments, the assembly 236 may be planarized to remove the hardmasks 116 and 118, then additional insulating material 130 may be provided on the planarized surface before forming the conductive vias 120, 122, and 136; in such an embodiment, the hardmasks 116 and 118 would not be present in the quantum dot device 100.

Figure 26:
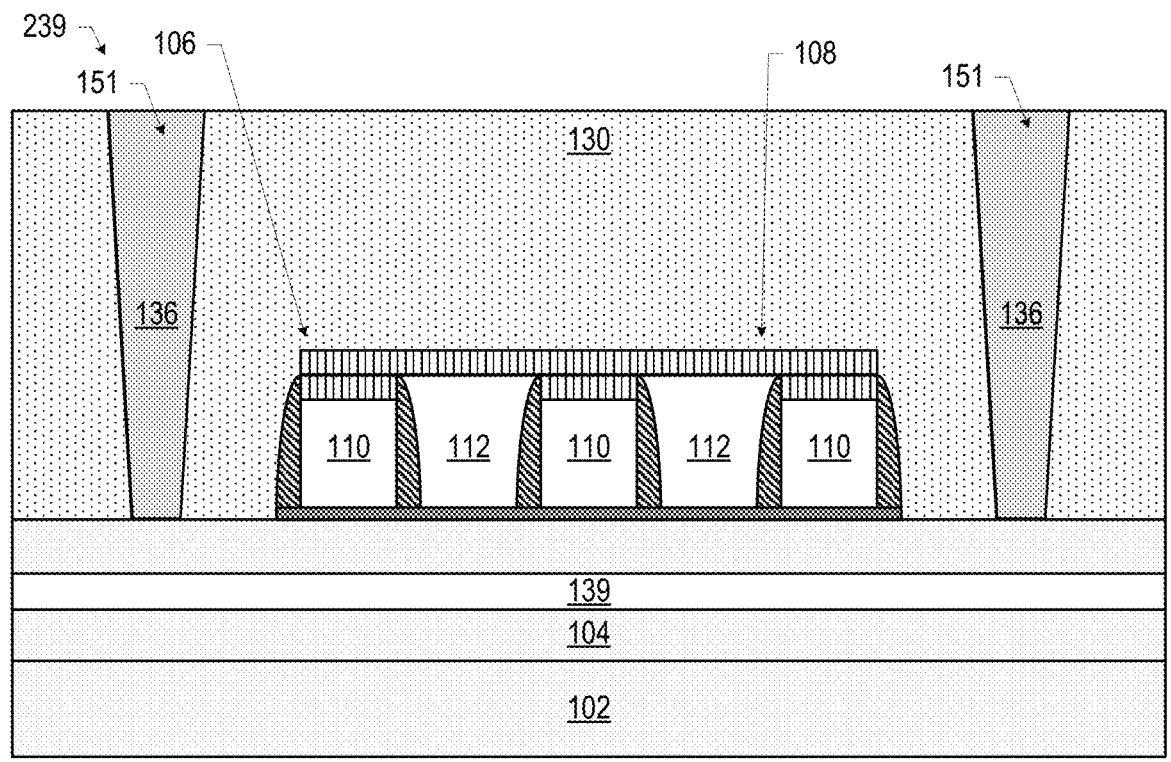
FIGS. 26-27 illustrate alternative example stages in the manufacture of a quantum dot device, in accordance with various embodiments.
Figure 27:
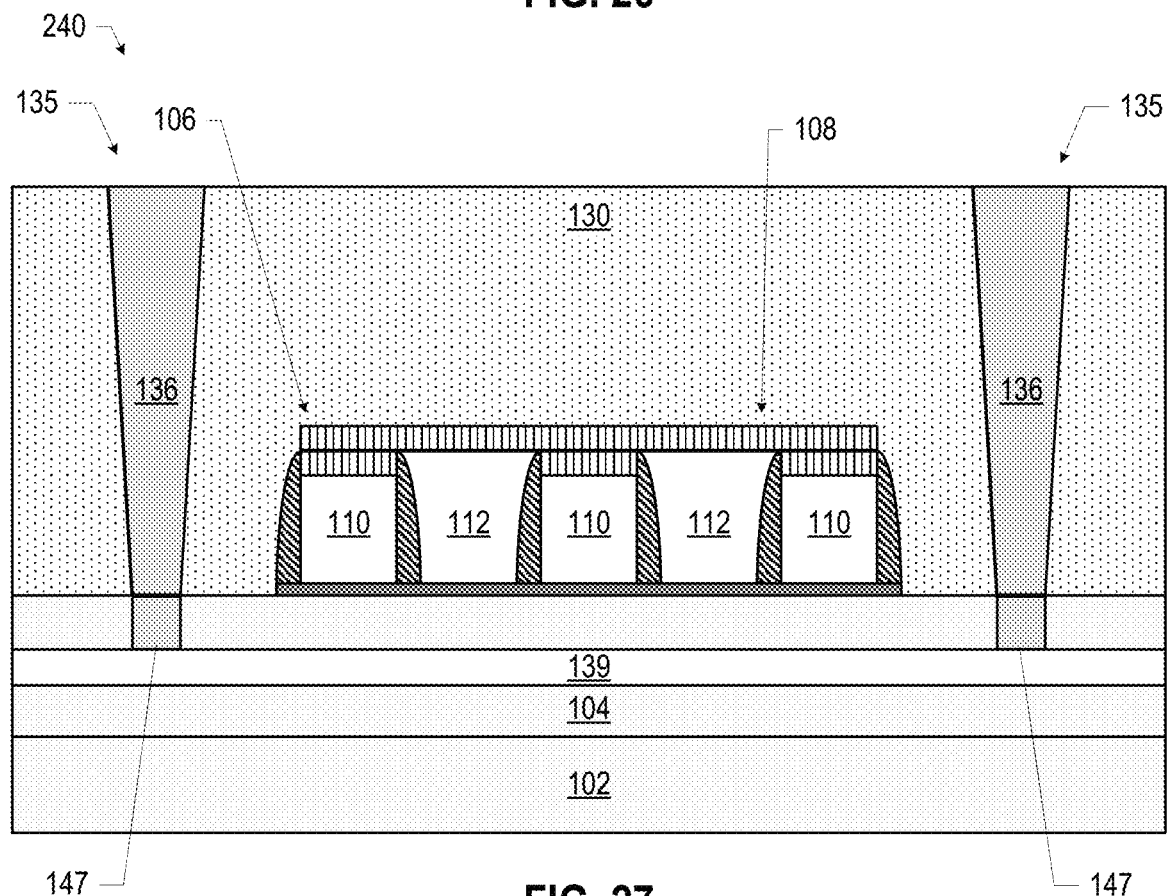

As noted above, conductive pathways 135 to the modulation doped stack 139 may be formed in any of a number of ways. For example, in some embodiments, a conductive pathway 135 may include a conductive via 136 and a conductive bridge 147 formed by metal diffusion into the fin 104. FIGS. 26-27 illustrate alternative example stages in the manufacture of such a quantum dot device 100, in accordance with various embodiments.

In particular, FIG. 26 is a cross-sectional view of an assembly 239 subsequent to forming cavities 151 in the insulating material 130 of the assembly 230 (FIG. 21), then filling the cavities 151 with a conductive material to form the conductive vias 136, without performing ion implantation in between. The formation of the cavities 151 may take the form of any of the embodiments discussed above with reference to FIG. 22, and the formation of the conductive vias 136 may take the form of any of the embodiments discussed above with reference to FIG. 24.

FIG. 27 is a cross-sectional view of an assembly 240 subsequent to annealing the assembly 239 (FIG. 26) to drive metal atoms from the conductive vias 136 into the fin 104 to form conductive bridges 147 between the conductive vias 136 and the modulation doped stack 139. In particular, the conductive bridges 147 may provide conductive pathways between the conductive vias 136 and the doped layer(s) and the quantum well layer of the modulation doped stack 139. The parameters of the annealing process may depend on the materials used in the assembly 240, and on the desired properties of the conductive bridges 147. The assembly 240 may be further processed in accordance with the operations discussed above with reference to FIG. 25, for example, to form a quantum dot device 100.

Figure 28:
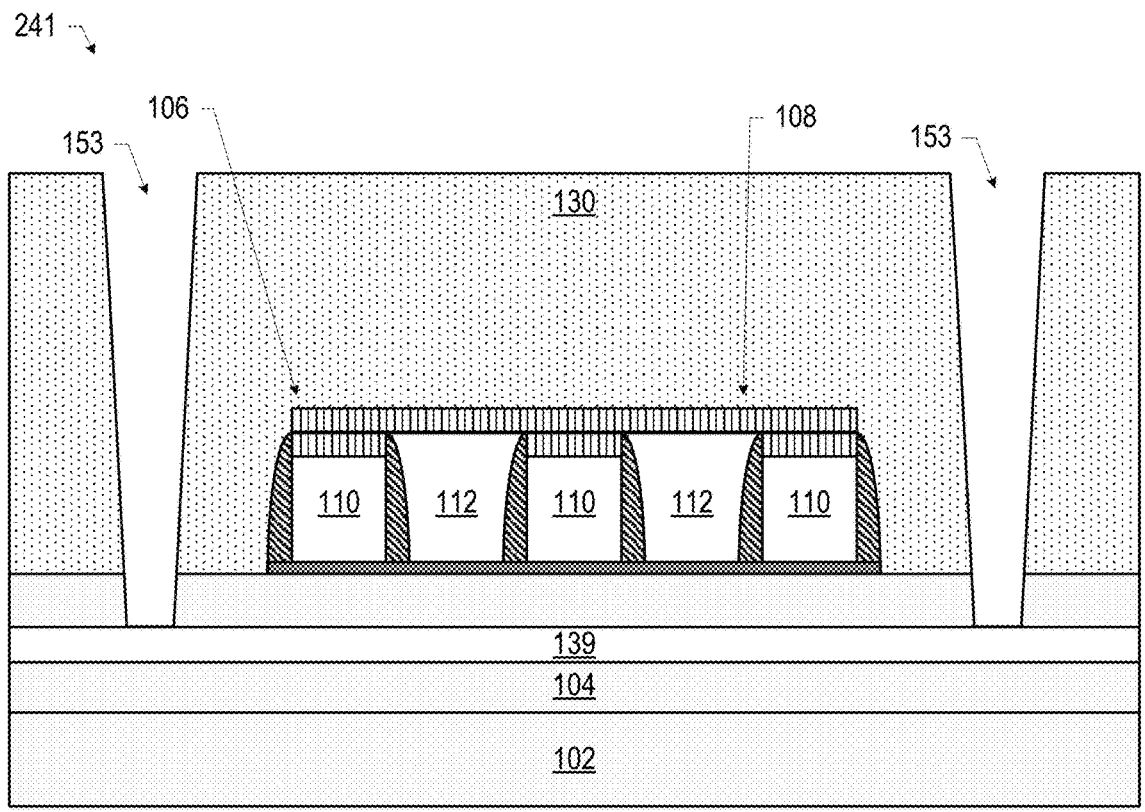
FIGS. 28-29 illustrate alternative example stages in the manufacture of a quantum dot device, in accordance with various embodiments.
Figure 29:
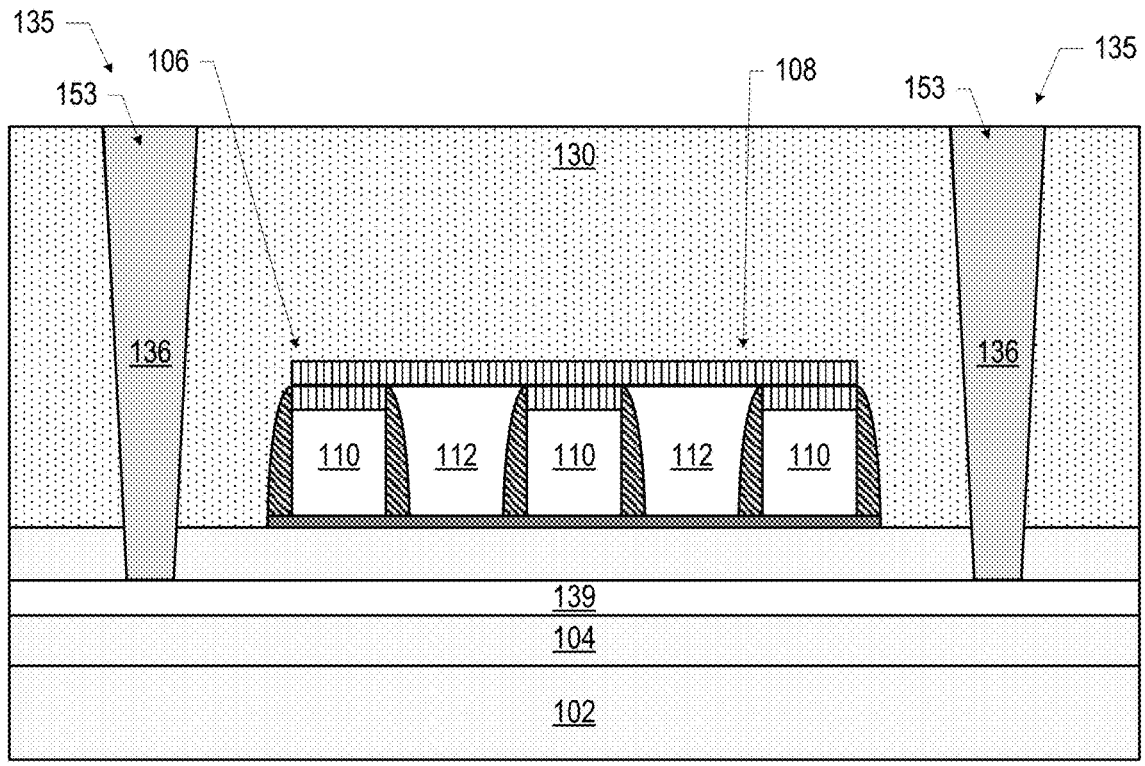

In other embodiments, the conductive pathways 135 may be provided by conductive vias 136 that extend into the fins 140 and make electrical contact with the doped layer(s) and the quantum well layer of the modulation doped stack 139. FIGS. 28-29 illustrate alternative example stages in the manufacture of such a quantum dot device 100, in accordance with various embodiments.

In particular, FIG. 28 is a cross-sectional view of an assembly 241 subsequent to forming cavities 153 in the insulating material 130 of the assembly 230 (FIG. 21). The cavities 153 may extend through the insulating material 130, and into the fin 104 to expose the doped layer(s) and the quantum well layer of the modulation doped stack 139. The cavities 153 may be formed in accordance with any of the techniques discussed above with reference to FIG. 22.

FIG. 29 is a cross-sectional view of an assembly 243 subsequent to filling the cavities 153 of the assembly 241 (FIG. 28) with a conductive material to form the conductive vias 136. The conductive vias 136 of the assembly 243 may be in conductive contact with the doped layer(s) and the quantum well layer of the modulation doped stack 139. The filling of the cavities 153 may take the form of any of the embodiments discussed above with reference to FIG. 24. The assembly 243 may be further processed in accordance with the operations discussed above with reference to FIG. 25, for example, to form a quantum dot device 100.

As discussed above, the base 102 and the fin 104 of a quantum dot device 100 may be formed from a substrate 144 and a quantum well stack 146 disposed on the substrate 144. The quantum well stack 146 may include a modulation doped stack 139 including a quantum well layer in which a 2DEG may form during operation of the quantum dot device 100. The modulation doped stack may also include one or more doped layers and at least one barrier layer disposed between the one or more doped layers and the quantum well layer. The quantum well stack 146 may take any of a number of forms, several of which are illustrated in FIGS. 30-35. The various layers in the quantum well stacks 146 discussed below may be grown on the substrate 144 (e.g., using epitaxial processes). Any of the modulation doped stacks 139 and quantum well stacks 146 discussed below may be included in any of the embodiments of the quantum dot devices 100 (and associated systems and methods) disclosed herein.

Figure 30:
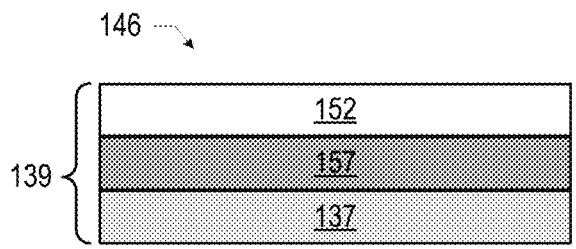
FIGS. 30-35 are cross-sectional views of various examples of quantum well stacks that may be used in a quantum dot device, in accordance with various embodiments.

FIG. 30 is a cross-sectional view of a quantum well stack 146 including only a modulation doped stack 139 with a single doped layer 137 and barrier layer 157. The modulation doped stack 139 may include a barrier layer 157 disposed on a doped layer 137, and a quantum well layer 152 disposed on the barrier layer 157. In some embodiments of the quantum dot device 100, the conductive pathways 135 (not shown) may extend through the quantum well layer 152 to the doped layer 137; in other words, the quantum well stack 146 of FIG. 30 may be oriented so that the quantum well layer 152 is disposed between the doped layer 137 and the gates 106/108 (not shown in FIG. 30). In some embodiments of the quantum dot device 100, the quantum well stack 146 of FIG. 30 may be oriented "upside down" in the quantum dot device 100 relative to its illustration in FIG. 30; in such embodiments, the conductive pathways 135 (not shown) may extend through the doped layer 137 to the quantum well layer 152. In other words, the quantum well stack 146 of FIG. 30 may be oriented so that the doped layer 137 is disposed between the quantum well layer 152 and the gates 106/108 (not shown in FIG. 30).

The doped layer 137 of FIG. 30 may be formed of a material including an n-type material (e.g., for an electron-type quantum dot device 100) or a p-type material (e.g., for a hole-type quantum dot device 100). Examples of n-type materials include phosphorous and arsenic, and examples of p-type materials include boron and gallium, though any others known in the art may be used. In some embodiments, the doping concentration of the doped layer 137 may be between $10^{17}/cm^3$ and $10^{20}/cm^3$ (e.g., between $10^{17}/cm^3$ and $2\times10^{18}/cm^3$, or between $10^{17}/cm^3$ and $5\times10^{18}/cm^3$). The material of the doped layer 137 may be any suitable material. For example, in some embodiments, the doped layer 137 may be formed of silicon germanium including a desired dopant, as discussed above.

The doped layer 137 may be formed using any of a number of techniques. In some embodiments, the doped layer 137 may be formed of an undoped base material (e.g., silicon germanium) that is doped in situ during growth of the base material by epitaxy. In some embodiments, the doped layer 137 may initially be fully formed of an undoped base material (e.g., silicon germanium), then a layer of dopant may be deposited on this base material (e.g., a monolayer of the desired dopant), and an annealing process may be performed to drive the dopant into the base material. In some embodiments, the doped layer 137 may initially be fully formed of an undoped base material (e.g., silicon germanium), and the dopant may be implanted into the lattice (and, in some embodiments, may be subsequently annealed). In general, any suitable technique may be used to form the doped layer 137.

The thickness (i.e., z-height) of the doped layer 137 may take any suitable value. For example, in some embodiments, the thickness of the doped layer 137 may be between 5 and 50 nanometers (e.g., between 10 and 20 nanometers, between 10 and 30 nanometers, or between 20 and 30 nanometers). In some embodiments, the doped layer 137 may include a material grown by epitaxy on another material; in such embodiments, the thickness of the doped layer 137 may be selected to be less than the critical value after which the material of the doped layer 137 may "relax" and exhibit defects during growth. Thus, the thickness of the doped layer 137 may be small enough that significant lattice defects do not occur, and the material of the doped layer 137 may be considered high-quality growth. As known in the art, the critical thickness for a particular material of the doped layer 137 may depend on the adjacent materials in the epitaxial stack and the lattice mismatch between the particular material and the adjacent materials.

The barrier layer 157 may provide a barrier to prevent impurities in the doped layer 137 from diffusing into the quantum well layer 152 and forming recombination sites or other defects that may reduce channel conduction and thereby impede performance of the quantum dot device 100. In some embodiments of the quantum well stack 146 of FIG. 30, the doped layer 137 may be formed of a first material that includes a desired dopant, and the barrier layer 157 may be formed of a second material different from the first material. This second material may have a lower diffusivity of the dopant than the first material, and thus may provide a dopant diffusion barrier between the doped layer 137 and the quantum well layer 152. For example, at 820 degrees Celsius, the diffusion constant $D_B$ associated with boron dopant levels of $1\times10^{20}$ atoms/$cm^3$ in crystalline silicon is approximately equal to $7\times10^{-14}$ $cm^2/s$ while the diffusion constant $D_B$ associated with the same boron dopant level in crystalline germanium is approximately $3\times10^{-16}$ $cm^2/s$. Therefore, at 820 degrees Celsius, if the doped layer 137 is formed of $Si_{1-x}Ge_x$ that includes boron at a dopant level of $1\times10^{20}$ atoms/$cm^3$, the barrier layer 157 may be formed of $Si_{1-y}Ge_y$, where x<y, and the barrier layer 157 may have lower diffusivity of the boron dopant than the doped layer 137. For phosphorus doping, for example, the reverse may be true. In particular, at 820 degrees Celsius, the diffusion constant $D_B$ associated with phosphorous dopant levels of $1\times10^{20}$ atoms/cm³ in crystalline silicon is approximately equal to $1\times10^{-15}$ cm²/s, while the diffusion constant $D_B$ associated with the same phosphorous dopant level in crystalline germanium is approximately $1\times10^{-12}$ cm²/s. Therefore, at 820 degrees Celsius, if the doped layer 137 is formed of $Si_{1-x}Ge_x$ that includes phosphorous at a dopant level of $1\times10^{20}$ atoms/cm³, the barrier layer 157 may be formed of $Si_{1-y}Ge_y$, where x>y, and the barrier layer 157 may have lower diffusivity of the phosphorous dopant than the doped layer 137.

As understood from the above examples and material properties known in the art, the choice of material for the barrier layer 157 may depend on the material used in the doped layer 137, the dopant in the doped layer 137, and the material used for the quantum well layer 152. In some embodiments, the doped layer 137 may include silicon germanium and a desired dopant (e.g., silicon germanium doped with the desired dopant), and the barrier layer 157 may be formed of intrinsic silicon, a III-V material (e.g., gallium arsenide, aluminum arsenide, or aluminum gallium arsenide), silicon germanium (with any appropriate germanium content), or carbon-doped silicon. Embodiments in which the barrier layer 157 includes intrinsic silicon, a III-V material, or carbon-doped silicon may be advantageous in quantum dot devices 100 in which the doped layer 137 includes a p-type dopant. Embodiments in which the barrier layer 157 includes a III-V material may be advantageous in quantum dot devices 100 in which the doped layer 137 includes an n-type dopant.

In some embodiments, the doped layer 137 may include silicon germanium having a particular germanium content and a desired dopant (e.g., doped with the desired dopant), and the barrier layer 157 may be formed of silicon germanium having a different germanium content. For example, in some embodiments, the doped layer 137 may be formed of silicon germanium having 30% germanium content (or another particular germanium content), the dopant may be boron or another p-type dopant, and the barrier layer 157 may be formed of silicon germanium having 50% germanium content (or another germanium content higher than the germanium content of the doped layer 137). Analogously, in some embodiments, the doped layer 137 may be formed of silicon germanium having 30% germanium content (or another particular germanium content), the dopant may be phosphorous or another n-type dopant, and the barrier layer 157 may be formed of silicon germanium having 10% germanium content (or another germanium content lower than the germanium content of the doped layer 137).

The barrier layer 157 may have any suitable thickness. For example, the barrier layer 157 may have a thickness between 1 and 50 nanometers. In some embodiments in which the barrier layer 157 of FIG. 30 is formed of intrinsic silicon, the barrier layer 157 may have a thickness between 1 and 10 nanometers (e.g., between 2 and 3 nanometers). In some embodiments in which the barrier layer 157 is formed of a III-V material, the barrier layer 157 may have a thickness between 1 and 3 nanometers (e.g., between 2 and 3 nanometers). As discussed above with reference to the doped layer 137, the thickness of the barrier layer 157 may be selected to be less than the critical value after which the material of the barrier layer 157 may "relax" and exhibit defects during growth. As known in the art, the critical thickness for a particular material of the barrier layer 157 may depend on the adjacent materials in the epitaxial stack and the lattice mismatch between the particular material and the adjacent materials. Additionally, the thickness of the barrier layer 157 may impact the ease with which carriers in the doped layer 137 can move into the quantum well layer 152. The thicker the barrier layer 157, the more difficult it may be for carriers to move into the quantum well layer 152; at the same time, the thicker the barrier layer 157, the more effective it may be at preventing impurities from the doped layer 137 from moving into the quantum well layer 152. Additionally, the diffusion of impurities may depend on the temperature at which the quantum dot device 100 operates. Thus, the thickness of the barrier layer 157 may be adjusted to achieve a desired energy barrier and impurity screening effect between the doped layer 137 and the quantum well layer 152 during expected operating conditions.

The quantum well layer 152 may be formed of a different material from the barrier layer 157. Generally, the quantum well layer 152 may be formed of a material such that, during operation of the quantum dot device 100, a 2DEG may form in the quantum well layer 152. In some embodiments, the gate dielectric 114 of the gates 106/108 may be disposed on the quantum well layer 152 (e.g., as discussed above with reference to FIG. 11). In some such embodiments, the quantum well layer 152 of FIG. 30 may be formed of intrinsic silicon, and the gate dielectric 114 may be formed of silicon oxide; in such an arrangement, during use of the quantum dot device 100, a 2DEG may form in the intrinsic silicon at the interface between the intrinsic silicon and the silicon oxide. Embodiments in which the quantum well layer 152 of FIG. 30 is formed of intrinsic silicon may be particularly advantageous for electron-type quantum dot devices 100. In some embodiments, the quantum well layer 152 of FIG. 30 may be formed of intrinsic germanium, and the gate dielectric 114 may be formed of germanium oxide; in such an arrangement, during use of the quantum dot device 100, a 2DEG may form in the intrinsic germanium at the interface between the intrinsic germanium and the germanium oxide. Such embodiments may be particularly advantageous for hole-type quantum dot devices 100. In some embodiments (e.g., as discussed below with reference to FIG. 35), one or more barrier layers may be disposed between the quantum well layer 152 and the gate dielectric 114. In some embodiments, the quantum well layer 152 may be strained, while in other embodiments, the quantum well layer 152 may not be strained.

The quantum well layer 152 may have any suitable thickness. For example, the quantum well layer 152 may have a thickness between 5 and 30 nanometers (e.g., between 10 and 15 nanometers, or between 10 and 12 nanometers).

In some particular embodiments of the modulation doped stack 139 of FIG. 30, the quantum well layer 152 may be formed of silicon, the doped layer 137 may be formed of doped silicon germanium, and the barrier layer 157 may be formed in accordance with any of the embodiments discussed above. In some such embodiments, the germanium content of the silicon germanium of the doped layer 137 may be 20-80% (e.g., 30%). In other particular embodiments of the modulation doped stack 139 of FIG. 30, the quantum well layer 152 may be formed of germanium, the doped layer 137 may be formed of silicon germanium, and the barrier layer 157 may be formed in accordance with any of the embodiments discussed above. In some such embodiments, the germanium content of the silicon germanium of the doped layer 137 may be 20-80% (e.g., 70%).

Figure 31:
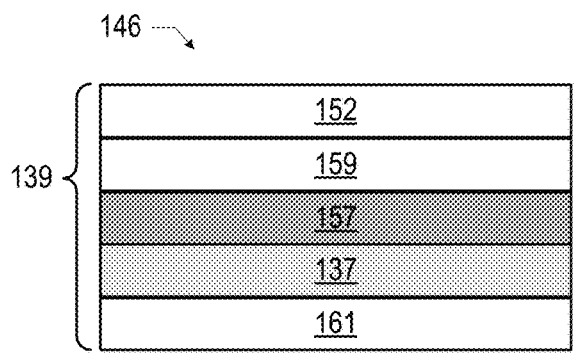

FIG. 31 is a cross-sectional view of a quantum well stack 146 including only a modulation doped stack 139 with a single doped layer 137, a barrier layer 157, a barrier layer 159, a barrier layer 161, and a quantum ell layer 152. As illustrated in FIG. 31, the doped layer 137 may be disposed on the barrier layer 161, the barrier layer 157 may be disposed on a doped layer 137, the barrier layer 159 may be disposed on the barrier layer 157, and a quantum well layer 152 disposed on the barrier layer 159. In some embodiments of the quantum dot device 100, the conductive pathways 135 (not shown) may extend through the quantum well layer 152 to the doped layer 137; in other words, the quantum well stack 146 of FIG. 31 may be oriented so that the quantum well layer 152 is disposed between the doped layer 137 and the gates 106/108 (not shown in FIG. 30). In some embodiments of the quantum dot device 100, the quantum well stack 146 of FIG. 31 may be oriented "upside down" in the quantum dot device 100 relative to its illustration in FIG. 31; in such embodiments, the conductive pathways 135 (not shown) may extend through the doped layer 137 to the quantum well layer 152. In other words, the quantum well stack 146 of FIG. 31 may be oriented so that the doped layer 137 is disposed between the quantum well layer 152 and the gates 106/108 (not shown in FIG. 31). The doped layer 137 of FIG. 31 may take the form of any of the embodiments of the doped layer 137 discussed above with reference to FIG. 30, and the barrier layer 157 of FIG. 31 may take the form of any of the embodiments discussed above with reference to FIG. 30.

The barrier layer 159 may be formed of a different material from the barrier later 157; thus the barrier layers 157 and 159 may together be viewed as a multilayer barrier. In some embodiments, the doped layer 137 may be formed of a material that includes a desired dopant, and the barrier layer 159 may be formed of the material. For example, the doped layer 137 may be formed of doped silicon germanium with a particular germanium content (e.g., in accordance with any of the embodiments discussed above with reference to FIG. 30), and the barrier layer 159 may be formed of silicon germanium (with the same or different germanium content). In some embodiments, the barrier layer 159 may be undoped, and thus may provide an additional barrier to the diffusion of impurities between the doped layer 137 and the quantum well layer 152.

The thickness (i.e., z-height) of the barrier layer 159 may take any suitable value. For example, in some embodiments, the thickness may be between 5 and 50 nanometers (e.g., between 10 and 20 nanometers, between 10 and 30 nanometers, or between 20 and 30 nanometers). As discussed above, when the barrier layer 159 is grown by epitaxy on the barrier layer 157, the thickness of the barrier layer 159 may be selected to be less than the critical value after which the material of the barrier layer 159 may "relax" and exhibit defects during growth. As known in the art, the critical thickness for a particular material of the barrier layer 159 may depend on the adjacent materials in the epitaxial stack and the lattice mismatch between the particular material and the adjacent materials.

The barrier layer 161 may take the form of any of the embodiments of the barrier layer 157 discussed above with reference to FIG. 30, or the form of any of the embodiments of the barrier layer 159 discussed above. In some embodiments, the barrier layer 161 may be omitted from the quantum well stack 146 of FIG. 31.

In some embodiments, the barrier layer 159 of the quantum well stack 146 of FIG. 31 may have a particular diffusivity of the dopant in the doped layer 137, and this particular diffusivity may be greater than the diffusivity of the dopant in the barrier layer 157. In such embodiments, the barrier layer 157 may provide a "stronger" barrier to diffusion of the dopant than the barrier layer 159. Including the additional barrier layer 159, however, may increase the total number of material interfaces that an impurity would have to pass in order to diffuse from the doped layer 137 to the quantum well layer 152; since the interfaces between materials tend to "trap" some impurities, including additional material interfaces between the doped layer 137 and the quantum well layer 152 (by including multiple different material layers in the quantum well stack 146 between the doped layer 137 and the quantum well layer 152) may reduce the impurities that reach the quantum well layer 152.

Figure 32:
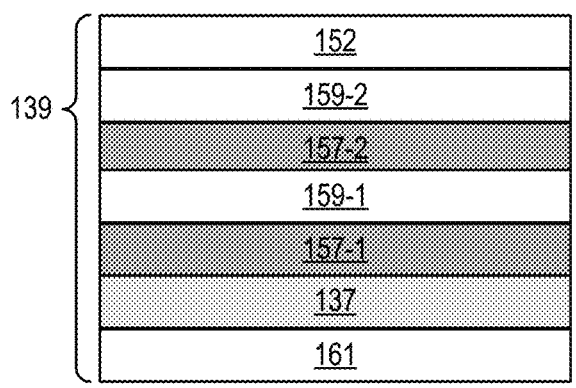

A modulation doped stack 139 may include multiple multilayer barriers having a barrier layer 157 and a barrier layer 159. For example, FIG. 32 illustrates another quantum well stack 146 including a modulation doped stack 139 having two sets of the barrier layer 157 and the barrier layer 159; in particular, FIG. 32 illustrates an embodiment in which a barrier layer 157-1 is disposed on the doped layer 137, a barrier layer 159-1 is disposed on the barrier layer 157-1, another barrier layer 157-2 is disposed on the barrier layer 159-1, another barrier layer 159-2 is disposed on the barrier layer 157-2, and the quantum well layer 152 is disposed on the barrier layer 159-2. The barrier layers 157-1 and 157-2 may take the form of any of the barrier layers 157 disclosed herein, and the barrier layers 159-1 and 159-2 may take the form of any of the barrier layers 159 disclosed herein. Although FIG. 32 illustrates two multilayer barriers having a barrier layer 157 and a barrier layer 159, a modulation doped stack 139 may include three or more such multilayer barriers, as desired. The doped layer 137, the quantum well layer 152, and the barrier layer 161 of the quantum well stack 146 of FIG. 32 may take the form of any of the embodiments of these components disclosed herein.

As noted above with reference to FIGS. 30 and 31, in some embodiments of the quantum dot device 100, the conductive pathways 135 (not shown) may extend through the quantum well layer 152 to the doped layer 137 of the quantum well stack 146 of FIG. 32; in other words, the quantum well stack 146 of FIG. 32 may be oriented so that the quantum well layer 152 is disposed between the doped layer 137 and the gates 106/108 (not shown in FIG. 32). In some embodiments of the quantum dot device 100, the quantum well stack 146 of FIG. 32 may be oriented "upside down" in the quantum dot device 100 relative to its illustration in FIG. 32; in such embodiments, the conductive pathways 135 (not shown) may extend through the doped layer 137 to the quantum well layer 152. In other words, the quantum well stack 146 of FIG. 32 may be oriented so that the doped layer 137 is disposed between the quantum well layer 152 and the gates 106/108 (not shown in FIG. 32). In some embodiments, the barrier layer 161 and/or the barrier layer 159 may be omitted from the quantum well stack 146 of FIG. 32.

Figure 33:
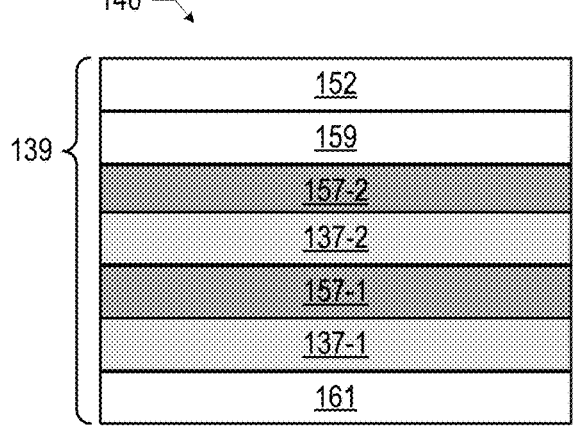

In some embodiments, a modulation doped stack 139 may include multiple doped layers 137. For example, FIG. 33 illustrates a quantum well stack 146 including a modulation doped stack 139 in which a first doped layer 137-1 is disposed on a barrier layer 161, a barrier layer 157-1 is disposed on the first doped layer 137-1, a second doped layer 137-2 is disposed on the barrier layer 157-1, a barrier layer 157-2 is disposed on the second doped layer 137-2, a barrier layer 159 is disposed on the barrier layer 157-2, and a quantum well layer 152 is disposed on the barrier layer 159. In FIG. 33, the barrier layer 161 may take the form of any of the barrier layers 161 discussed herein, the doped layers 137-1 and 137-2 may take the form of any of the doped layers 137 discussed herein, the barrier layers 157-1 and 157-2 may take the form of any of the barrier layers 157 discussed herein, the barrier layer 159 may take the form of any of the barrier layers 159 discussed herein, and the quantum well layer 152 may take the form of any of the quantum well layers 152 discussed herein.

In some embodiments of modulation doped stacks 139 including multiple doped layers 137 (like the embodiment illustrated in FIG. 33), different ones of the doped layers 137 may have different concentrations of the dopant. For example, it may be advantageous for doped layers 137 closer to the quantum well layer 152 to have doping concentrations that are lower than doped layers 137 farther away from the quantum well layer 152; since impurities arising in doped layers 137 that are closer to the quantum well layer 152 would have to pass through fewer barrier layers 157 (and possibly intervening doped layers 137) than doped layers 137 farther from the quantum well layer 152, reducing the doping concentrations in the doped layers 137 closer to the quantum well layer 152 may reduce the total number of impurities available to diffuse into the quantum well layer 152, and thus reduce the likelihood of such diffusion. Thus, in the embodiment illustrated in FIG. 33, the doping concentration of the doped layer 137-2 may be less than the doping concentration of the doped layer 137-1. More generally, the doping concentrations of three or more doped layers 137 included in a modulation doped stack 139 may be graded so that doped layers 137 that are progressively closer to the quantum well layer 152 have progressively lower doping concentrations.

As noted above with reference to FIGS. 30-32, in some embodiments of the quantum dot device 100, the conductive pathways 135 (not shown) may extend through the quantum well layer 152 (and the doped layer 137-2) to the doped layer 137-1 of the quantum well stack 146 of FIG. 33; in other words, the quantum well stack 146 of FIG. 33 may be oriented so that the quantum well layer 152 is disposed between the doped layers 137 and the gates 106/108 (not shown in FIG. 33). In some embodiments of the quantum dot device 100, the quantum well stack 146 of FIG. 33 may be oriented "upside down" in the quantum dot device 100 relative to its illustration in FIG. 33; in such embodiments, the conductive pathways 135 (not shown) may extend through the doped layers 137 to the quantum well layer 152. In other words, the quantum well stack 146 of FIG. 33 may be oriented so that the doped layer 137 is disposed between the quantum well layer 152 and the gates 106/108 (not shown in FIG. 33). In some embodiments, the barrier layer 161 and/or the barrier layer 159 may be omitted from the quantum well stack 146 of FIG. 33.

Figure 34:
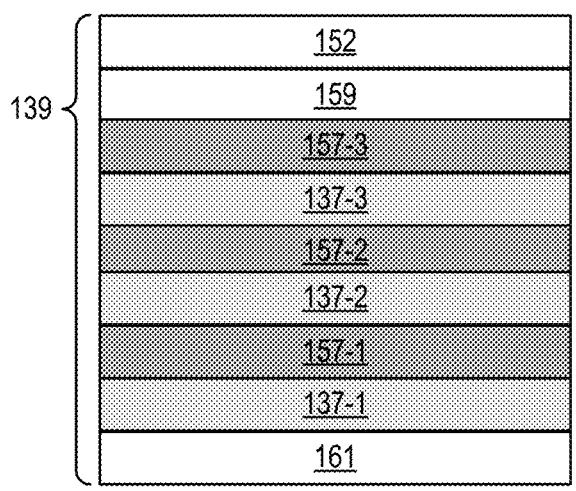

Although FIG. 33 illustrates two doped layers 137, a modulation doped stack 139 may include three or more doped layers 137, as desired. For example, FIG. 34 illustrates an embodiment including three doped layers 137, separated by intervening barrier layers 157, as shown. The doped layers 137-1, 137-2, and 137-3 may take the form of any of the embodiments of the doped layers 137 discussed herein; for example, the doped layers 137-1, 137-2, and 137-3 may have progressively lower doping concentrations, as discussed above with reference to FIG. 33. The barrier layers 157-1, 157-2, and 157-3 may take the form of any of the embodiments of the barrier layers 157 discussed herein. The barrier layer 161, the barrier layer 159, and the quantum well layer 152 may take the form of any of these respective elements disclosed herein.

As noted above with reference to FIGS. 30-33, in some embodiments of the quantum dot device 100, the conductive pathways 135 (not shown) may extend through the quantum well layer 152 (and the doped layer 137-2) to the doped layer 137-1 of the quantum well stack 146 of FIG. 34; in other words, the quantum well stack 146 of FIG. 34 may be oriented so that the quantum well layer 152 is disposed between the doped layers 137 and the gates 106/108 (not shown in FIG. 34). In some embodiments of the quantum dot device 100, the quantum well stack 146 of FIG. 34 may be oriented "upside down" in the quantum dot device 100 relative to its illustration in FIG. 34; in such embodiments, the conductive pathways 135 (not shown) may extend through the doped layers 137 to the quantum well layer 152. In other words, the quantum well stack 146 of FIG. 34 may be oriented so that the doped layer 137 is disposed between the quantum well layer 152 and the gates 106/108 (not shown in FIG. 34). In some embodiments, the barrier layer 161 and/or the barrier layer 159 may be omitted from the quantum well stack 146 of FIG. 34.

Figure 35:
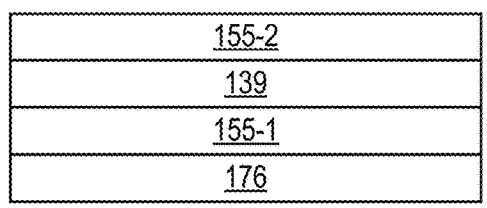

A quantum well stack 146 may include one or more layers in addition to those included in a modulation doped stack 139. For example, FIG. 35 is a cross-sectional view of a quantum well stack 146 including a buffer layer 176, a barrier layer 155-1, a modulation doped stack 139, and a barrier layer 155-2. The quantum well stack 146 may be disposed on the substrate 144 (e.g., as discussed above with reference to FIG. 5, and which may be formed of silicon) such that the buffer layer 176 is disposed between the barrier layer 155-1 and the substrate 144. In some embodiments, the barrier layers 155-1 and 155-2 may take the form of any of the embodiments of the barrier layer 159 discussed herein. For example, the barrier layers 155-1 and 155-2 may be formed of silicon germanium (e.g., with 30% germanium content for electron-type quantum dot devices 100, and 70% germanium content for hole-type quantum dot devices 100). The buffer layer 176 may be formed of the same material as the barrier layer 155-1, and may be present to trap defects that form in this material as it is grown on the substrate 144. In some embodiments, the buffer layer 176 may be grown under different conditions (e.g., deposition temperature or growth rate) from the barrier layer 155-1. In particular, the barrier layer 155-1 may be grown under conditions that achieve fewer defects than the buffer layer 176. In some embodiments in which the buffer layer 176 includes silicon germanium, the silicon germanium of the buffer layer 176 may have a germanium content that varies from the substrate 144 to the barrier layer 155-1; for example, the silicon germanium of the buffer layer 176 may have a germanium content that varies from zero percent at the silicon substrate 144 to a nonzero percent (e.g., 30% or 70%) at the barrier layer 155-1. The buffer layer 176 may be grown beyond its critical layer thickness such that it is substantially free of stress from the underlying substrate 144 (and thus may be referred to as "relaxed").

The thicknesses (i.e., z-heights) of the layers in the quantum well stack 146 of FIG. 35 may take any suitable values. For example, in some embodiments, the thickness of the buffer layer 176 (e.g., silicon germanium) may be between 0.3 and 4 microns (e.g., 0.3-2 microns, or 0.5 microns). In some embodiments, the thickness of the barrier layer 155-1 (e.g., silicon germanium) may be between 0 and 400 nanometers. The barrier layer 155-2, like the barrier layer 155-1, may provide a potential energy barrier around the quantum well layer 152, and may take the form of any of the embodiments of the barrier layer 155-1. In some embodiments, the thickness of the barrier layer 155-2 (e.g., silicon germanium) may be between 25 and 75 nanometers (e.g., 32 nanometers). The modulation doped stack 139 of FIG. 35 may take any of the forms discussed herein (e.g., any of the forms discussed above with reference to FIGS. 30-34).

The substrate 144 and the quantum well stack 146 may be distributed between the base 102 and the fins 104 of the quantum dot device 100, as discussed above. This distribution may occur in any of a number of ways. For example, FIGS. 36-42 illustrate example base/fin arrangements 158 that may be used in a quantum dot device 100, in accordance with various embodiments.

Figure 36:
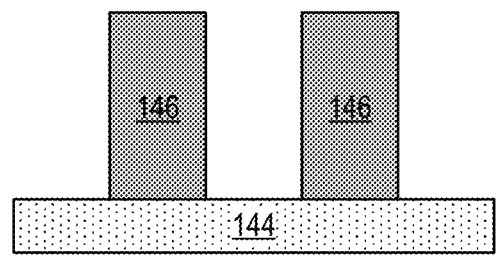
FIGS. 36-42 illustrate example base/fin arrangements that may be used in a quantum dot device, in accordance with various embodiments.

In the base/fin arrangement 158 of FIG. 36, the quantum well stack 146 may be included in the fins 104, but not in the base 102. The substrate 144 may be included in the base 102, but not in the fins 104. When the base/fin arrangement 158 of FIG. 36 is used in the manufacturing operations discussed with reference to FIGS. 5-6, the fin etching may etch through the quantum well stack 146, and stop when the substrate 144 is reached.

Figure 37:
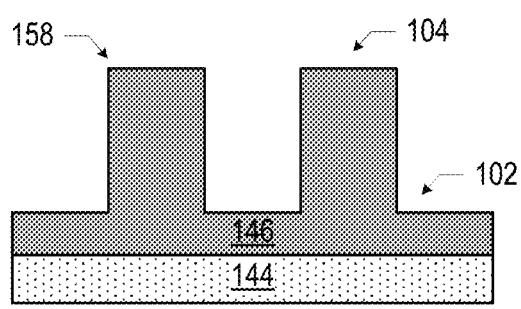
Figure 38:
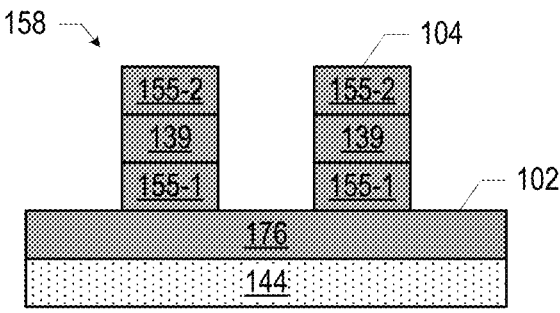

In the base/fin arrangement 158 of FIG. 37, the quantum well stack 146 may be included in the fins 104, as well as in a portion of the base 102. A substrate 144 may be included in the base 102 as well, but not in the fins 104. When the base/fin arrangement 158 of FIG. 37 is used in the manufacturing operations discussed with reference to FIGS. 5-6, the fin etching may etch partially through the quantum well stack 146, and stop before the substrate 144 is reached. FIG. 38 illustrates a particular embodiment of the base/fin arrangement 158 of FIG. 37. In the embodiment of FIG. 38, the quantum well stack 146 of FIG. 35 is used; the fins 104 include the barrier layer 155-1, the modulation doped stack 139, and the barrier layer 155-2, while the base 102 includes the buffer layer 176 and the substrate 144.

Figure 39:
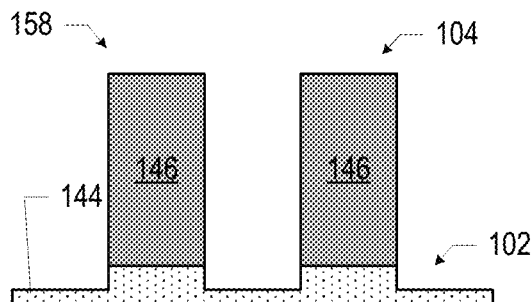
Figure 40:
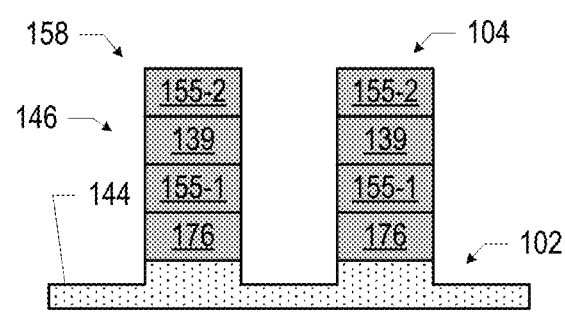

In the base/fin arrangement 158 of FIG. 39, the quantum well stack 146 may be included in the fins 104, but not the base 102. The substrate 144 may be partially included in the fins 104, as well as in the base 102. When the base/fin arrangement 158 of FIG. 39 is used in the manufacturing operations discussed with reference to FIGS. 5-6, the fin etching may etch through the quantum well stack 146 and into the substrate 144 before stopping. FIG. 40 illustrates a particular embodiment of the base/fin arrangement 158 of FIG. 39. In the embodiment of FIG. 40, the quantum well stack 146 of FIG. 35 is used; the fins 104 include the quantum well stack 146 and a portion of the substrate 144, while the base 102 includes the remainder of the substrate 144.

Figure 41:
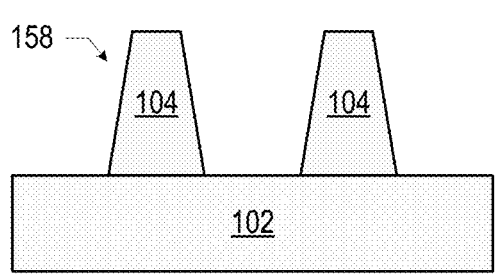
Figure 42:
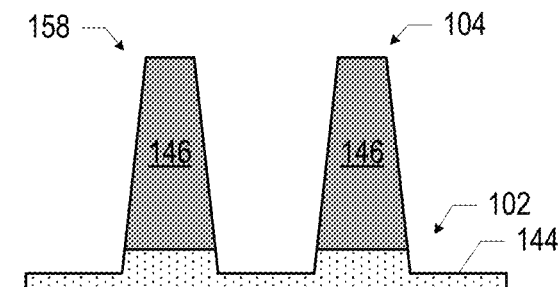

Although the fins 104 have been illustrated in many of the preceding figures as substantially rectangular with parallel sidewalls, this is simply for ease of illustration, and the fins 104 may have any suitable shape (e.g., a shape appropriate to the manufacturing processes used to form the fins 104). For example, as illustrated in the base/fin arrangement 158 of FIG. 41, in some embodiments, the fins 104 may be tapered. In some embodiments, the fins 104 may taper by 3-10 nanometers in x-width for every 100 nanometers in z-height (e.g., 5 nanometers in x-width for every 100 nanometers in z-height). When the fins 104 are tapered, the wider end of the fins 104 may be the end closest to the base 102, as illustrated in FIG. 41. FIG. 42 illustrates a particular embodiment of the base/fin arrangement 158 of FIG. 41. In FIG. 42, the quantum well stack 146 is included in the tapered fins 104 while a portion of the substrate 144 is included in the tapered fins and a portion of the substrate 144 provides the base 102.

Figure 43:
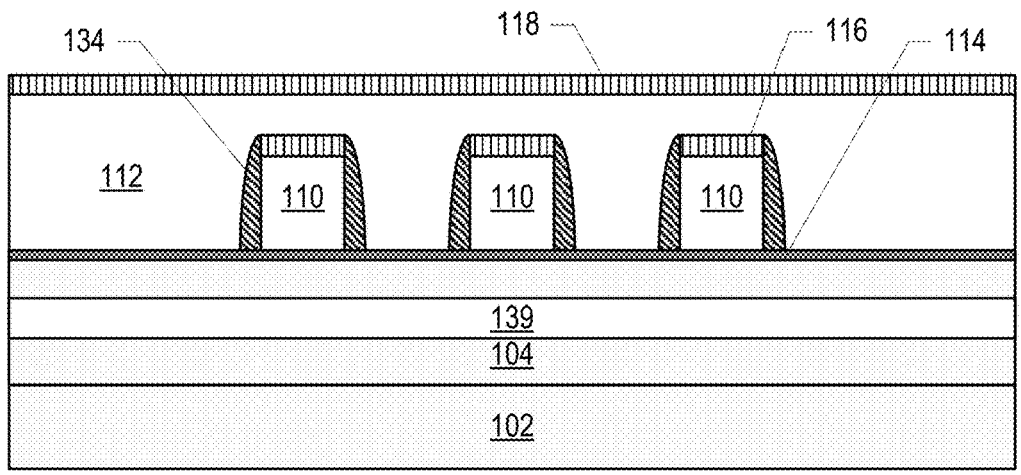
FIGS. 43-45 illustrate various example stages in the manufacture of alternative gate arrangements that may be included in a quantum dot device, in accordance with various embodiments.
Figure 44:
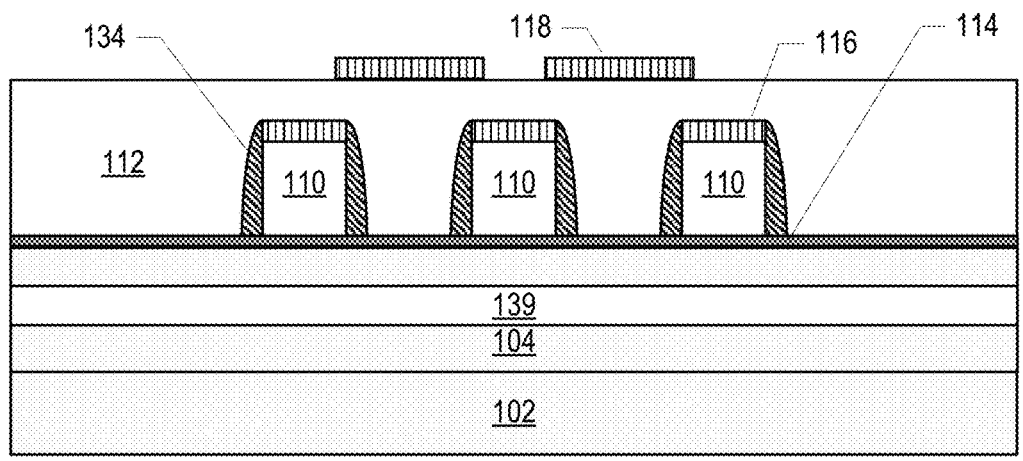
Figure 45:
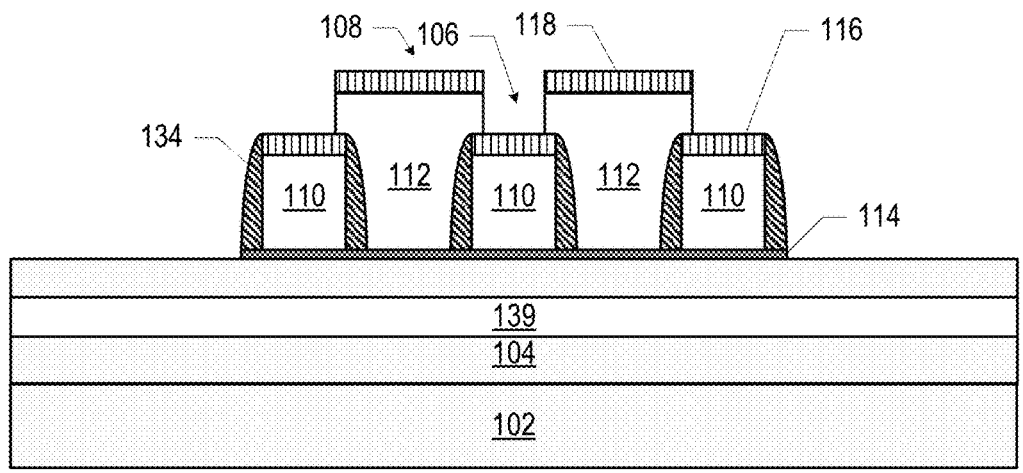

In the embodiment of the quantum dot device 100 illustrated in FIG. 2, the z-height of the gate metal 112 of the gates 108 may be approximately equal to the sum of the z-height of the gate metal 110 and the z-height of the hardmask 116, as shown. Also in the embodiment of FIG. 2, the gate metal 112 of the gates 108 may not extend in the x-direction beyond the adjacent spacers 134. In other embodiments, the z-height of the gate metal 112 of the gates 108 may be greater than the sum of the z-height of the gate metal 110 and the z-height of the hardmask 116, and in some such embodiments, the gate metal 112 of the gates may extend beyond the spacers 134 in the x-direction. FIGS. 43-45 illustrate various example stages in the manufacture of alternative gate arrangements that may be included in a quantum dot device 100, in accordance with various embodiments.

FIG. 43 illustrates an assembly 242 subsequent to providing the gate metal 112 and a hardmask 118 on the assembly 218 (FIG. 15). The assembly 242 may be similar to the assembly 224 of FIG. 18 (and may be formed using any of the techniques discussed above with reference to FIGS. 16-18), but may include additional gate metal 112 between the hardmask 116 and the hardmask 118, of any desired thickness. In some embodiments, the gate metal 112 may be planarized prior to provision of the hardmask 118, but the hardmask 118 may still be spaced away from the hardmask 116 in the z-direction by the gate metal 112, as shown in FIG. 43.

FIG. 44 illustrates an assembly 244 subsequent to patterning the hardmask 118 of the assembly 242 (FIG. 43). The pattern applied to the hardmask 118 may include the locations for the gates 108, as discussed below. The hardmask 118 may be non-coplanar with the hardmask 116, as illustrated in FIG. 43, and may extend "over" at least a portion of the hardmask 116 (and thus over the gate metal 110 of the gates 106).

FIG. 45 illustrates an assembly 246 subsequent to etching the assembly 244 (FIG. 44) to remove the portions that are not protected by the patterned hardmask 118 to form the gates 108. The gate metal 112 of the gates 106 may extend "over" the hardmask 116 of the gates 108, and may be electrically insulated from the gate metal 110 by the hardmask 116. In the embodiment illustrated in FIG. 45, the z-height of the gate metal 112 of the gates 108 may be greater than the sum of the z-height of the gate metal 110 and the z-height of the hardmask 116 of the gates 106. Additionally, the gate metal 112 of the gates 108 may extend beyond the spacers 134 in the x-direction, as shown. Further manufacturing operations may be performed on the assembly 246, as discussed above with reference to FIGS. 21-29.

Figure 46:
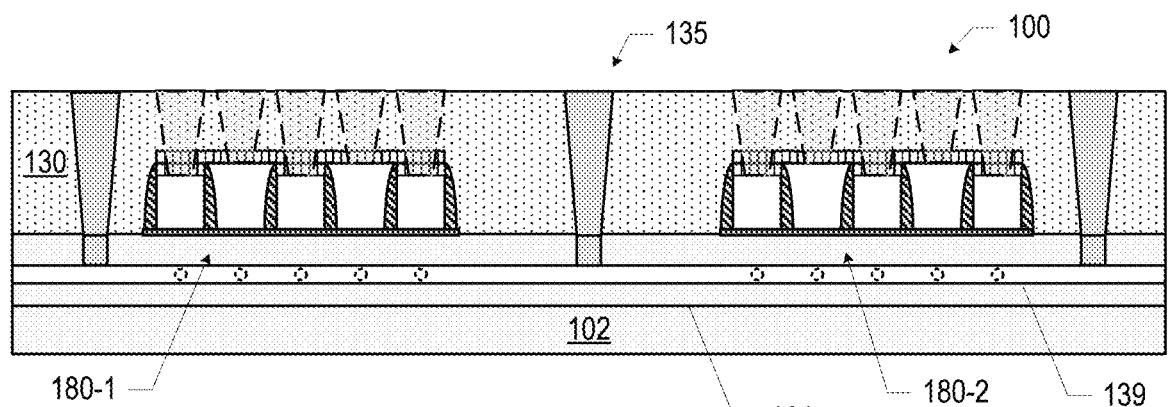
FIG. 46 illustrates an embodiment of a quantum dot device having multiple groups of gates on a single fin, in accordance with various embodiments.

As noted above, a single fin 104 may include multiple groups of gates 106/108, spaced apart along the fin by a doped region 140. FIG. 46 is a cross-sectional view of an example of such a quantum dot device 100 having multiple groups of gates 180 on a single fin 104, in accordance with various embodiments. Each of the groups 180 may include gates 106/108 (not labeled in FIG. 46 for ease of illustration) that may take the form of any of the embodiments of the gates 106/108 discussed herein. A conductive pathway 135 may be disposed between two adjacent groups 180 (labeled in FIG. 46 as groups 180-1 and 180-2), and may provide a contact to the modulation doped stack 139 shared by the groups 180. The particular number of gates 106/108 illustrated in FIG. 46, and the particular number of groups 180, is simply illustrative, and a fin 104 may include any suitable number of gates 106/108 arranged in any suitable number of groups 180.

As discussed above with reference to FIGS. 1-3, in some embodiments in which the gate dielectric 114 is not a layer shared commonly between the gates 108 and 106, but instead is separately deposited on the fin 104 between the spacers 134, the gate dielectric 114 may extend at least partially up the sides of the spacers 134, and the gate metal 112 may extend between the portions of gate dielectric 114 on the spacers 134. FIGS. 47-51 illustrate various alternative stages in the manufacture of such an embodiment of a quantum dot device 100, in accordance with various embodiments. In particular, the operations illustrated in FIGS. 47-51 may take the place of the operations illustrated in FIGS. 13-15.

Figure 47:
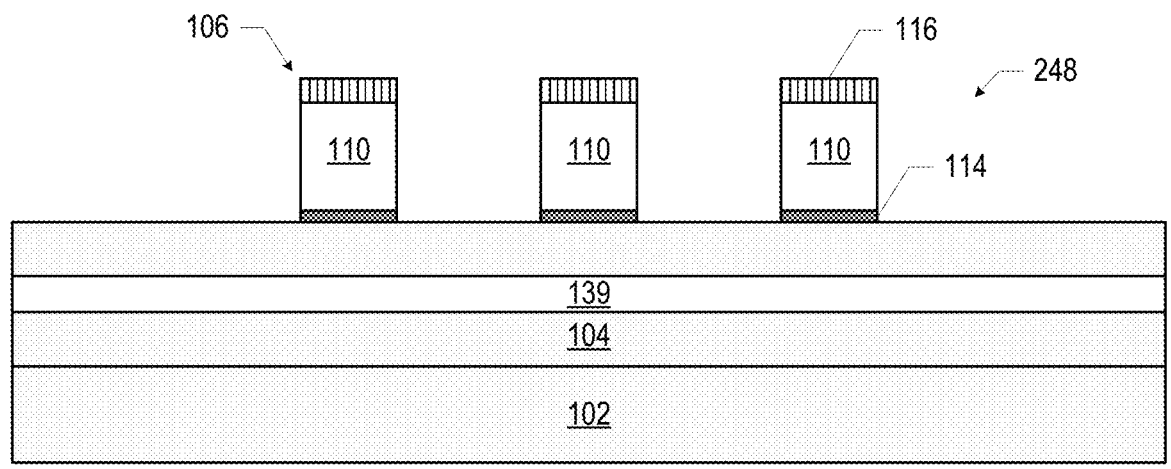
FIGS. 47-51 illustrate various alternative stages in the manufacture of a quantum dot device, in accordance with various embodiments.

FIG. 47 is a cross-sectional view of an assembly 248 subsequent to etching the assembly 212 (FIG. 12) to remove the gate metal 110, and the gate dielectric 114 that is not protected by the patterned hardmask 116, to form the gates 106.

Figure 48:
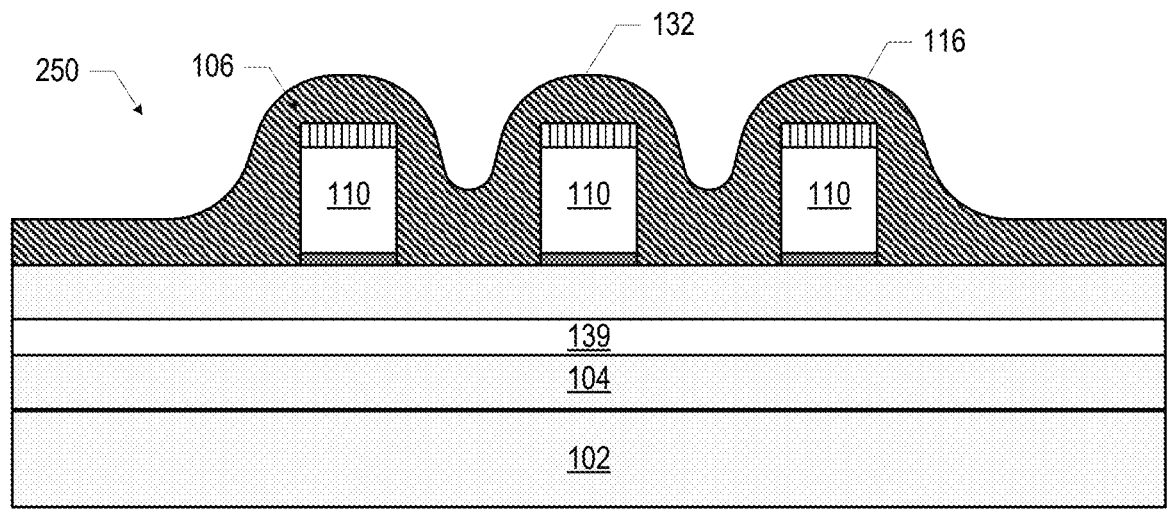

FIG. 48 is a cross-sectional view of an assembly 250 subsequent to providing spacer material 132 on the assembly 248 (FIG. 47). The deposition of the spacer material 132 may take any of the forms discussed above with reference to FIG. 14, for example.

Figure 49:
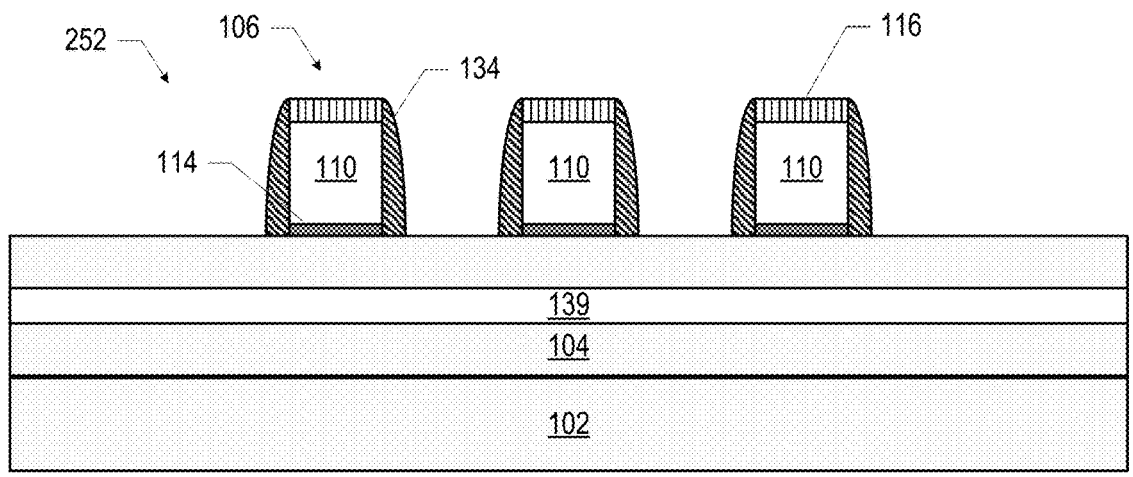

FIG. 49 is a cross-sectional view of an assembly 252 subsequent to etching the spacer material 132 of the assembly 250 (FIG. 48), leaving spacers 134 formed of the spacer material 132 on the sides of the gates 106 (e.g., on the sides of the hardmask 116, the gate metal 110, and the gate dielectric 114). The etching of the spacer material 132 may take any of the forms discussed above with reference to FIG. 15, for example.

Figure 50:
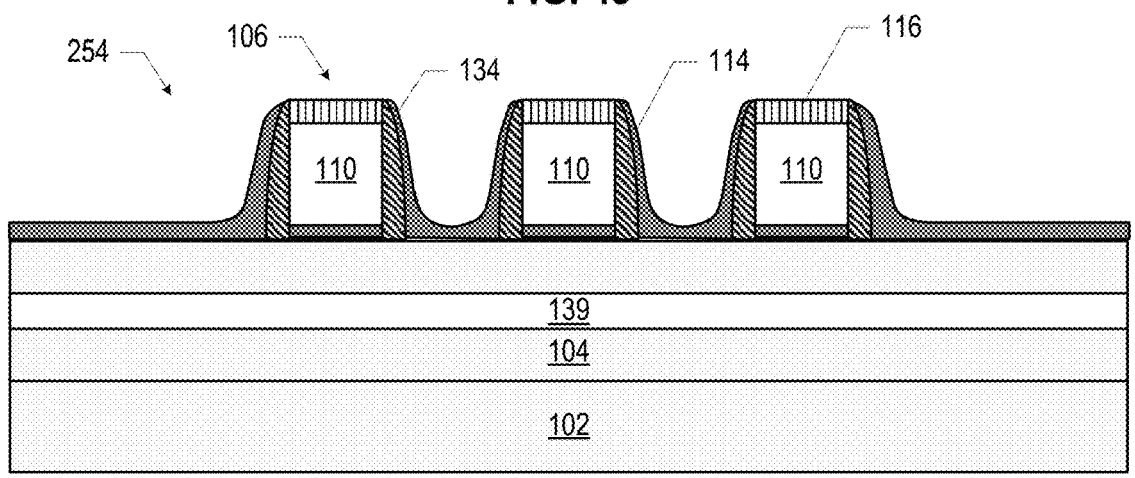

FIG. 50 is a cross-sectional view of an assembly 254 subsequent to providing a gate dielectric 114 on the fin 104 between the gates 106 of the assembly 252 (FIG. 49). In some embodiments, the gate dielectric 114 provided between the gates 106 of the assembly 252 may be formed by atomic layer deposition (ALD) and, as illustrated in FIG. 50, may cover the exposed fin 104 between the gates 106, and may extend onto the adjacent spacers 134.

Figure 51:
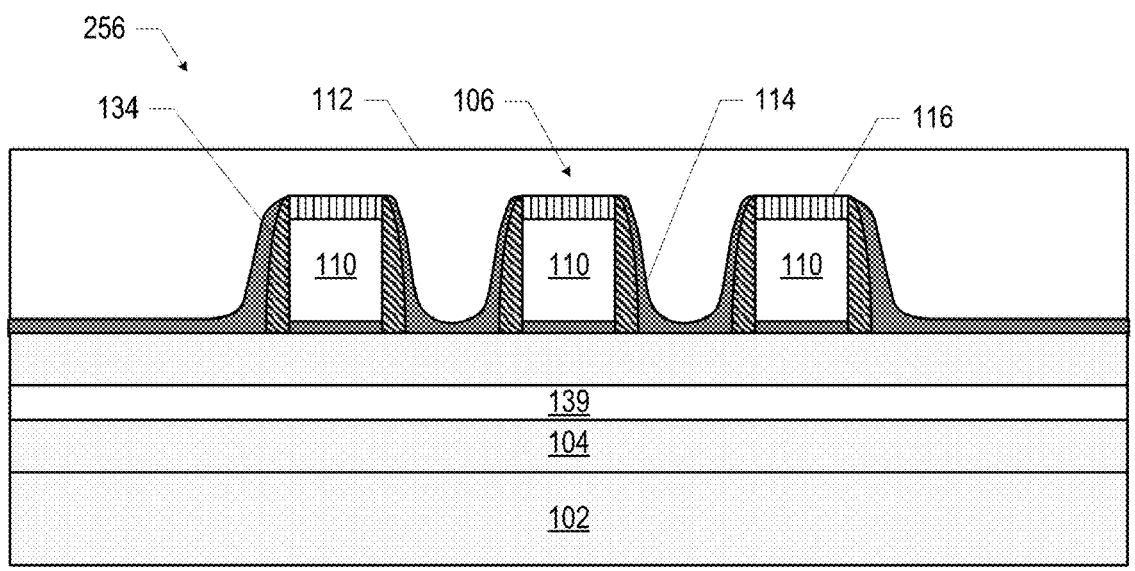

FIG. 51 is a cross-sectional view of an assembly 256 subsequent to providing the gate metal 112 on the assembly 254 (FIG. 50). The gate metal 112 may fill the areas between adjacent ones of the gates 106, and may extend over the tops of the gates 106, as shown. The provision of the gate metal 112 may take any of the forms discussed above with reference to FIG. 16, for example. The assembly 256 may be further processed as discussed above with reference to FIGS. 17-29.

Figure 52:
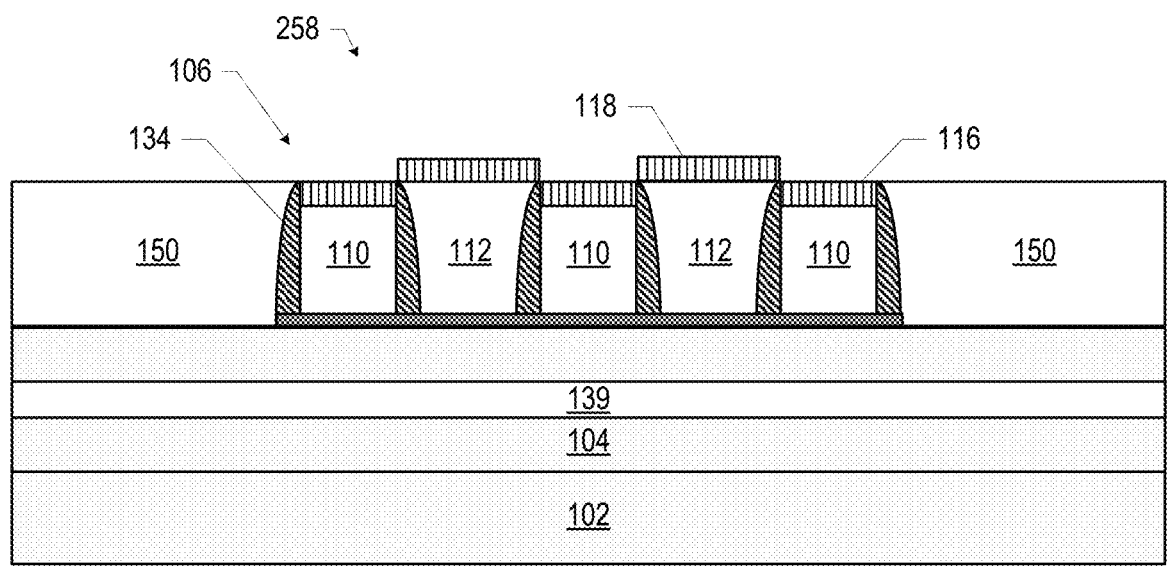
FIG. 52 illustrates an example alternative stage in the manufacture of a quantum dot device, in accordance with various embodiments.

As discussed above with reference to FIG. 19, in some embodiments, the pattern applied to the hardmask 118 (used for patterning the gates 108) may not result in a common, continuous portion of hardmask 118 that extends over all of the hardmask 116. One such example was discussed above with reference to FIGS. 43-45, and another example of such an embodiment is illustrated in FIG. 52. In particular, FIG. 52 is a cross-sectional view of an assembly 258 in which the hardmask 118 of the assembly 224 (FIG. 18) is not patterned to extend over the gates 106, but instead is patterned so as not to extend over the gate metal 110. The assembly 258 may be further processed as discussed above with reference to FIGS. 20-29 (e.g., etching away the excess portions 150, etc.). In some embodiments, the hardmasks 116 and 118 may remain in the quantum dot device 100 as part of the gates 106/108, while in other embodiments, the hardmasks 116 and 118 may be removed.

Figure 53:
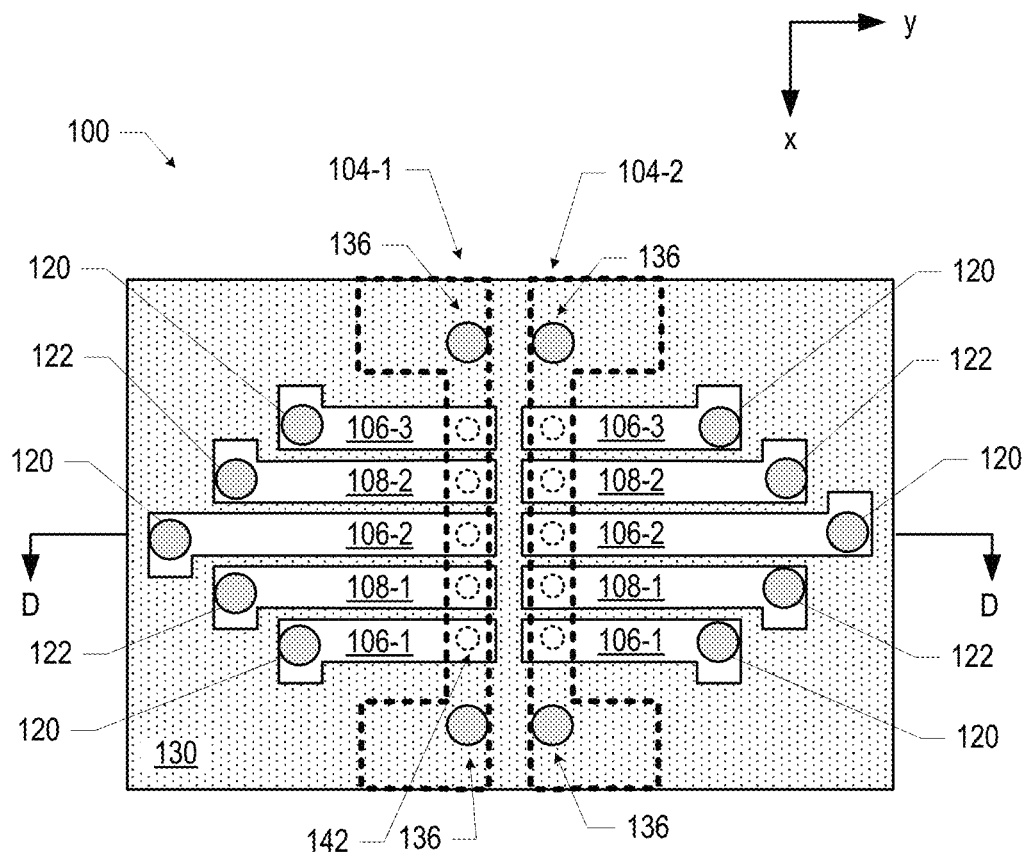
FIG. 53 is a cross-sectional view of a quantum dot device including a fin arrangement with additional portions, in accordance with various embodiments.

In some embodiments, fins 104 having non-rectangular footprints may be used in any of the quantum dot devices 100 disclosed herein. For example, FIG. 53 is a top view (analogous to the view of FIG. 3) of an embodiment in which each of the fins 104 has a C-shaped footprint (indicated by the dashed lines). In particular, the fins 104 of FIG. 53 have a footprint that includes a central rectangular portion augmented by two additional portions (which are illustrated as rectangular in FIG. 53) extending away from the central rectangular portion. The dimensions of these additional portions may have any desired values. FIG. 54 is a perspective view (analogous to the view of FIG. 9) of an assembly 260 that may be formed and used in place of the assembly 208 (FIGS. 8-10) in the manufacturing operations discussed above with reference to FIGS. 4-29, including the additional portions. These additional portions in the fins 104 may be included for any of a number of reasons. For example, in some embodiments, the greatest amount of doping in the doped layer(s) 137 may be found in or near these additional portions so that the interface between the doped layer(s) 137 and the conductive vias 136 (formed, e.g., of metal materials) may have an advantageously low resistivity. In some embodiments, including these additional portions in the fins 104 may enable a larger reservoir of charge carriers to be built up in the doped layer(s) 137 of the modulation doped stack 139 than if the additional portions were not included. These additional portions may be viewed as acting as source/drain regions for the operation of the quantum dot device 100.

As noted above, any suitable techniques may be used to manufacture the quantum dot devices 100 disclosed herein. FIG. 55 is a flow diagram of an illustrative method 1000 of manufacturing a quantum dot device, in accordance with various embodiments. Although the operations discussed below with reference to the method 1000 are illustrated in a particular order and depicted once each, these operations may be repeated or performed in a different order (e.g., in parallel), as suitable. Additionally, various operations may be omitted, as suitable. Various operations of the method 1000 may be illustrated with reference to one or more of the embodiments discussed above, but the method 1000 may be used to manufacture any suitable quantum dot device (including any suitable ones of the embodiments disclosed herein).

At 1002, a quantum well stack may be formed on a substrate. The quantum well stack may include a doped layer, a quantum well layer, and a barrier layer disposed between the doped layer and the quantum well layer. The doped layer may be formed of a first material and a dopant, the first material may have a first diffusivity of the dopant, the barrier layer may be formed of a second material having a second diffusivity of the dopant, and the second diffusivity may be less than the first diffusivity. For example, a quantum well stack 146 including a doped layer 137, a quantum well layer 152, and a barrier layer 157 may be formed on a substrate 144 (e.g., as discussed above with reference to FIGS. 4-5 and 30-35).

At 1004, gates may be formed above the quantum well stack. For example, one or more gates 106/108 may be formed above the quantum well stack 146 (e.g., as discussed above with reference to FIGS. 11-13 and 47).

A number of techniques are disclosed herein for operating a quantum dot device 100. FIGS. 56-57 are flow diagrams of particular illustrative methods 1020 and 1040, respectively, of operating a quantum dot device, in accordance with various embodiments. Although the operations discussed below with reference to the methods 1020 and 1040 are illustrated in a particular order and depicted once each, these operations may be repeated or performed in a different order (e.g., in parallel), as suitable. Additionally, various operations may be omitted, as suitable. Various operations of the methods 1020 and 1040 may be illustrated with reference to one or more of the embodiments discussed above, but the methods 1020 and 1040 may be used to operate any suitable quantum dot device (including any suitable ones of the embodiments disclosed herein).

Turning to the method 1020 of FIG. 56, at 1022, voltages may be applied to first gates above a first quantum well stack region to cause a first quantum dot to form in a first quantum well layer in the first quantum well stack region. The first quantum well stack region may include a first doped layer spaced away from the first quantum well layer by a first barrier layer. The first doped layer may be formed of a first material and a dopant, the first material may have a first diffusivity of the dopant, the first barrier layer may be formed of a second material having a second diffusivity of the dopant, and the second diffusivity may be less than the first diffusivity. For example, one or more voltages may be applied to the gates 106/108 on a fin 104-1 to cause at least one quantum dot 142 to form in the quantum well layer 152 in the fin 104-1. A doped layer 137 in the fin 104-1 may be spaced away from the quantum well layer 152 by a barrier layer 157 (e.g., as discussed above with reference to FIGS. 30-35).

At 1024, voltages may be applied to second gates above a second quantum well stack region to cause a second quantum dot to form in a second quantum well layer in the second quantum well stack region. The second quantum well stack region may include a second doped layer spaced away from the second quantum well layer by a second barrier layer. For example, one or more voltages may be applied to the gates 106/108 on a fin 104-2 to cause at least one quantum dot 142 to form in a quantum well layer 152 in the fin 104-2. A doped layer 137 in the fin 104-2 may be spaced away from the quantum well layer 152 by a barrier layer 157 (e.g., as discussed above with reference to FIGS. 30-35).

At 1026, a quantum state of the first quantum dot may be sensed with the second quantum dot. For example, a quantum dot 142 in the fin 104-2 (the "read" fin) may sense the quantum state of a quantum dot 142 in the fin 104-1 (the "active" fin).

Turning to the method 1040 of FIG. 57, at 1042, an electrical signal may be applied to a first gate disposed above a quantum well stack region to cause a first quantum dot to form in a first quantum well in a quantum well layer in the quantum well stack region under the first gate. The quantum well stack region may include a doped layer, and a barrier layer may be disposed between the quantum well layer and the doped layer. The doped layer may be formed of a first material and a dopant, the first material may have a first diffusivity of the dopant, the barrier layer may be formed of a second material having a second diffusivity of the dopant, and the second diffusivity may be less than the first diffusivity. For example, a voltage may be applied to the gate 108-1 disposed on a fin 104 to cause a first quantum dot 142 to form in the quantum well layer 152 in the fin 104 under the gate 108-1. A barrier layer 157 may be disposed between the quantum well layer 152 and the doped layer 137 (e.g., as discussed above with reference to FIGS. 30-35).

At 1044, an electrical signal may be applied to a second gate disposed above the quantum well stack region to cause a second quantum dot to form in a second quantum well in the quantum well layer in the quantum well stack region under the second gate. For example, a voltage may be applied to the gate 108-2 disposed on the fin 104 to cause a second quantum dot 142 to form in the quantum well layer 152 in the fin 104 under the gate 108-2.

At 1046, an electrical signal may be applied to a third gate disposed on the quantum well stack region to (1) cause a third quantum dot to form in a third quantum well in the quantum well layer in the quantum well stack region under the third gate or (2) provide a potential barrier between the first quantum well and the second quantum well. For example, a voltage may be applied to the gate 106-2 to (1) cause a third quantum dot 142 to form in the quantum well layer 152 in the fin 104 (e.g., when the gate 106-2 acts as a "plunger" gate) or (2) provide a potential barrier between the first quantum well (under the gate 108-1) and the second quantum well (under the gate 108-2) (e.g., when the gate 106-2 acts as a "barrier" gate).

Figure 58:
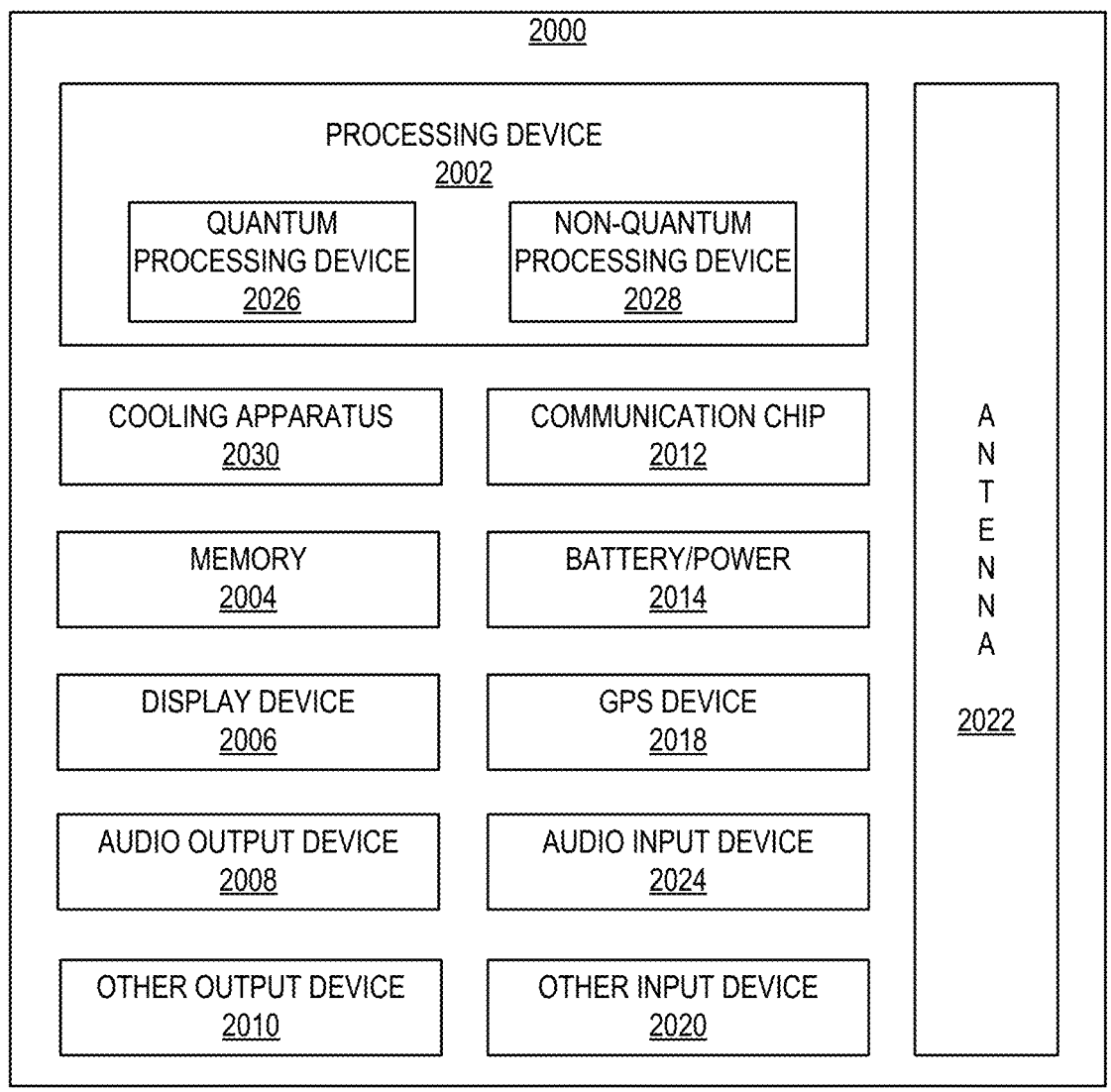
FIG. 58 is a block diagram of an example quantum computing device that may include any of the quantum dot devices disclosed herein, in accordance with various embodiments.

FIG. 58 is a block diagram of an example quantum computing device 2000 that may include any of the quantum dot devices disclosed herein. A number of components are illustrated in FIG. 58 as included in the quantum computing device 2000, but any one or more of these components may be omitted or duplicated, as suitable for the application. In some embodiments, some or all of the components included in the quantum computing device 2000 may be attached to one or more printed circuit boards (e.g., a motherboard). In some embodiments, various ones of these components may be fabricated onto a single system-on-a-chip (SoC) die. Additionally, in various embodiments, the quantum computing device 2000 may not include one or more of the components illustrated in FIG. 58, but the quantum computing device 2000 may include interface circuitry for coupling to the one or more components. For example, the quantum computing device 2000 may not include a display device 2006, but may include display device interface circuitry (e.g., a connector and driver circuitry) to which a display device 2006 may be coupled. In another set of examples, the quantum computing device 2000 may not include an audio input device 2024 or an audio output device 2008, but may include audio input or output device interface circuitry (e.g., connectors and supporting circuitry) to which an audio input device 2024 or audio output device 2008 may be coupled.

The quantum computing device 2000 may include a processing device 2002 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2002 may include a quantum processing device 2026 (e.g., one or more quantum processing devices), and a non-quantum processing device 2028 (e.g., one or more non-quantum processing devices). The quantum processing device 2026 may include one or more of the quantum dot devices 100 disclosed herein, and may perform data processing by performing operations on the quantum dots that may be generated in the quantum dot devices 100, and monitoring the result of those operations. For example, as discussed above, different quantum dots may be allowed to interact, the quantum states of different quantum dots may be set or transformed, and the quantum states of quantum dots may be read (e.g., by another quantum dot). The quantum processing device 2026 may be a universal quantum processor, or specialized quantum processor configured to run one or more particular quantum algorithms. In some embodiments, the quantum processing device 2026 may execute algorithms that are particularly suitable for quantum computers, such as cryptographic algorithms that utilize prime factorization, encryption/decryption, algorithms to optimize chemical reactions, algorithms to model protein folding, etc. The quantum processing device 2026 may also include support circuitry to support the processing capability of the quantum processing device 2026, such as input/output channels, multiplexers, signal mixers, quantum amplifiers, and analog-to-digital converters.

As noted above, the processing device 2002 may include a non-quantum processing device 2028. In some embodiments, the non-quantum processing device 2028 may provide peripheral logic to support the operation of the quantum processing device 2026. For example, the non-quantum processing device 2028 may control the performance of a read operation, control the performance of a write operation, control the clearing of quantum bits, etc. The non-quantum processing device 2028 may also perform conventional computing functions to supplement the computing functions provided by the quantum processing device 2026. For example, the non-quantum processing device 2028 may interface with one or more of the other components of the quantum computing device 2000 (e.g., the communication chip 2012 discussed below, the display device 2006 discussed below, etc.) in a conventional manner, and may serve as an interface between the quantum processing device 2026 and conventional components. The non-quantum processing device 2028 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices.

The quantum computing device 2000 may include a memory 2004, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the states of qubits in the quantum processing device 2026 may be read and stored in the memory 2004. In some embodiments, the memory 2004 may include memory that shares a die with the non-quantum processing device 2028. This memory may be used as cache memory and may include embedded dynamic random access memory (eDRAM) or spin transfer torque magnetic random-access memory (STT-M RAM).

The quantum computing device 2000 may include a cooling apparatus 2030. The cooling apparatus 2030 may maintain the quantum processing device 2026 at a predetermined low temperature during operation to reduce the effects of scattering in the quantum processing device 2026. This predetermined low temperature may vary depending on the setting; in some embodiments, the temperature may be 5 degrees Kelvin or less. In some embodiments, the non-quantum processing device 2028 (and various other components of the quantum computing device 2000) may not be cooled by the cooling apparatus 2030, and may instead operate at room temperature. The cooling apparatus 2030 may be, for example, a dilution refrigerator, a helium-3 refrigerator, or a liquid helium refrigerator.

In some embodiments, the quantum computing device 2000 may include a communication chip 2012 (e.g., one or more communication chips). For example, the communication chip 2012 may be configured for managing wireless communications for the transfer of data to and from the quantum computing device 2000. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2012 may implement any of a number of wireless standards or protocols, including but not limited to Institute for Electrical and Electronic Engineers (IEEE) standards including Wi-Fi (IEEE 1402.11 family), IEEE 1402.16 standards (e.g., IEEE 1402.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 1402.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 1402.16 standards. The communication chip 2012 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2012 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2012 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2012 may operate in accordance with other wireless protocols in other embodiments. The quantum computing device 2000 may include an antenna 2022 to facilitate wireless communications and/or to receive other wireless communications (such as AM or FM radio transmissions).

In some embodiments, the communication chip 2012 may manage wired communications, such as electrical, optical, or any other suitable communication protocols (e.g., the Ethernet). As noted above, the communication chip 2012 may include multiple communication chips. For instance, a first communication chip 2012 may be dedicated to shorter-range wireless communications such as Wi-Fi or Bluetooth, and a second communication chip 2012 may be dedicated to longer-range wireless communications such as GPS, EDGE, GPRS, CDMA, WiMAX, LTE, EV-DO, or others. In some embodiments, a first communication chip 2012 may be dedicated to wireless communications, and a second communication chip 2012 may be dedicated to wired communications.

The quantum computing device 2000 may include battery/power circuitry 2014. The battery/power circuitry 2014 may include one or more energy storage devices (e.g., batteries or capacitors) and/or circuitry for coupling components of the quantum computing device 2000 to an energy source separate from the quantum computing device 2000 (e.g., AC line power).

The quantum computing device 2000 may include a display device 2006 (or corresponding interface circuitry, as discussed above). The display device 2006 may include any visual indicators, such as a heads-up display, a computer monitor, a projector, a touchscreen display, a liquid crystal display (LCD), a light-emitting diode display, or a flat panel display, for example.

The quantum computing device 2000 may include an audio output device 2008 (or corresponding interface circuitry, as discussed above). The audio output device 2008 may include any device that generates an audible indicator, such as speakers, headsets, or earbuds, for example.

The quantum computing device 2000 may include an audio input device 2024 (or corresponding interface circuitry, as discussed above). The audio input device 2024 may include any device that generates a signal representative of a sound, such as microphones, microphone arrays, or digital instruments (e.g., instruments having a musical instrument digital interface (MIDI) output).

The quantum computing device 2000 may include a global positioning system (GPS) device 2018 (or corresponding interface circuitry, as discussed above). The GPS device 2018 may be in communication with a satellite-based system and may receive a location of the quantum computing device 2000, as known in the art.

The quantum computing device 2000 may include an other output device 2010 (or corresponding interface circuitry, as discussed above). Examples of the other output device 2010 may include an audio codec, a video codec, a printer, a wired or wireless transmitter for providing information to other devices, or an additional storage device.

The quantum computing device 2000 may include an other input device 2020 (or corresponding interface circuitry, as discussed above). Examples of the other input device 2020 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The quantum computing device 2000, or a subset of its components, may have any appropriate form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device.

The following paragraphs provide examples of various ones of the embodiments disclosed herein.

Example 1 is a quantum dot device, including: a quantum well stack including a quantum well layer, a doped layer, and a barrier layer disposed between the doped layer and the quantum well layer, wherein the doped layer includes a first material and a dopant, the first material has a first diffusivity of the dopant, the barrier layer includes a second material having a second diffusivity of the dopant, and the second diffusivity is less than the first diffusivity; and gates disposed above the quantum well stack.

Example 2 may include the subject matter of Example 1, and may further specify that the dopant is an n-type dopant.

Example 3 may include the subject matter of Example 2, and may further specify that the dopant includes arsenic or phosphorous.

Example 4 may include the subject matter of Example 1, and may further specify that the dopant is a p-type dopant.

Example 5 may include the subject matter of Example 4, and may further specify that the dopant includes phosphorous.

Example 6 may include the subject matter of Example 1, and may further specify that the second material includes a III-V material.

Example 7 may include the subject matter of Example 6, and may further specify that the barrier layer has a thickness between 1 and 3 nanometers.

Example 8 may include the subject matter of Example 1, and may further specify that the second material is intrinsic silicon.

Example 9 may include the subject matter of Example 8, and may further specify that the barrier layer has a thickness between 1 and 10 nanometers.

Example 10 may include the subject matter of Example 9, and may further specify that the barrier layer has a thickness between 2 and 3 nanometers.

Example 11 may include the subject matter of any of Examples 1-10, and may further specify that the first material is silicon germanium.

Example 12 may include the subject matter of Example 11, and may further specify that the first material has a first germanium content, the second material is silicon germanium having a second germanium content, and the first germanium content is different from the second germanium content.

Example 13 may include the subject matter of Example 11, and may further specify that the second material includes a III-V material.

Example 14 may include the subject matter of Example 12, and may further specify that the barrier layer has a thickness between 1 and 3 nanometers.

Example 15 may include the subject matter of Example 11, and may further specify that the second material is intrinsic silicon.

Example 16 may include the subject matter of Example 15, and may further specify that the barrier layer has a thickness between 1 and 10 nanometers.

Example 17 may include the subject matter of Example 16, and may further specify that the barrier layer has a thickness between 2 and 3 nanometers.

Example 18 may include the subject matter of any of Examples 1-17, and may further specify that the barrier layer is a first barrier layer, the quantum well stack further includes a second barrier layer formed of a third material, and the third material is different from the second material.

Example 19 may include the subject matter of Example 18, and may further specify that the third material has a third diffusivity of the dopant, and the third diffusivity is greater than the second diffusivity.

Example 20 may include the subject matter of Example 18, and may further specify that the third material is a same material as the first material.

Example 21 may include the subject matter of Example 20, and may further specify that the first and third materials include silicon germanium.

Example 22 may include the subject matter of any of Examples 1-21, and may further specify that the doped layer is a first doped layer, the quantum well stack further includes a second doped layer, and the barrier layer is disposed between the first doped layer and the second doped layer.

Example 23 may include the subject matter of Example 22, and may further specify that the second doped layer includes the first material and the dopant.

Example 24 may include the subject matter of Example 23, and may further specify that the second doped layer is disposed between the barrier layer and the quantum well layer, and the first and second doped layers have equal concentrations of the dopant.

Example 25 may include the subject matter of Example 23, and may further specify that the second doped layer is disposed between the barrier layer and the quantum well layer, the first doped layer has a first concentration of the dopant, the second doped layer has a second concentration of the dopant, and the second concentration of the dopant is less than the first concentration of the dopant.

Example 26 may include the subject matter of Example 22, and may further specify that the barrier layer is a first barrier layer, the quantum well stack further includes a second barrier layer, and the second barrier layer is disposed between the second doped layer and the quantum well stack.

Example 27 may include the subject matter of Example 26, and may further specify that the second barrier layer includes the second material.

Example 28 may include the subject matter of any of Examples 26-27, and may further specify that the quantum well stack further includes a third doped layer disposed between the second barrier layer and the quantum well stack.

Example 29 may include the subject matter of Example 28, and may further specify that the third doped layer includes the first material and the dopant.

Example 30 may include the subject matter of Example 29, and may further specify that the second doped layer is disposed between the barrier layer and the quantum well layer, the first doped layer has a first concentration of the dopant, the second doped layer has a second concentration of the dopant, the third doped layer has a third concentration of the dopant, the second concentration of the dopant is less than the first concentration of the dopant, and the third concentration of the dopant is less than the second concentration of the dopant.

Example 31 may include the subject matter of Example 29, and may further specify that the quantum well stack further includes a third barrier layer disposed between the third doped layer and the quantum well stack.

Example 32 may include the subject matter of any of Examples 1, and may further specify that the barrier layer is a first barrier layer, the quantum well stack further includes a second barrier layer formed of a third material different from the second material, and the quantum well layer is disposed between the second barrier layer and the first barrier layer.

Example 33 may include the subject matter of Example 32, and may further specify that the third material is a same material as the first material.

Example 34 may include the subject matter of any of Examples 1-33, and may further specify that the barrier layer is a first barrier layer, the quantum well stack further includes a second barrier layer, and the doped layer is disposed between the first barrier layer and the second barrier layer.

Example 35 may include the subject matter of Example 34, and may further specify that the second barrier layer includes the second material.

Example 36 may include the subject matter of Example 34, and may further specify that the second barrier layer includes the first material.

Example 37 may include the subject matter of any of Examples 1 or 4-36, and may further specify that the dopant is a p-type dopant, and the quantum well layer includes germanium.

Example 38 may include the subject matter of any of Examples 1-3 or 6-36, and may further specify that the dopant is an n-type dopant, and the quantum well layer includes silicon.

Example 39 may include the subject matter of any of Examples 1-38, and may further specify that the doped layer is disposed between the gates and the quantum well layer.

Example 40 may include the subject matter of any of Examples 1-39, and may further specify that the quantum well layer is disposed between the gates and the doped layer.

Example 41 may include the subject matter of any of Examples 1-40, and may further specify that the doped layer has a thickness between 5 and 50 nanometers.

Example 42 may include the subject matter of any of Examples 1-41, and may further specify that the doped layer has a thickness between 10 and 20 nanometers.

Example 43 may include the subject matter of any of Examples 1-42, and may further specify that the doped layer has a doping density between $10^{17}/cm^3$ and $5\times10^{18}/cm^3$.

Example 44 may include the subject matter of any of Examples 1-43, and may further specify that a conductive pathway extends between the quantum well layer and the doped layer.

Example 45 may include the subject matter of Example 44, and may further specify that the conductive pathway includes a conductive via.

Example 46 may include the subject matter of Example 45, and may further specify that the conductive pathway includes a doped region through the barrier layer.

Example 47 may include the subject matter of Example 45, and may further specify that the conductive pathway includes a metal diffusion region through the barrier layer.

Example 48 may include the subject matter of any of Examples 1-47, and may further specify that the doped layer includes an in-situ dopant.

Example 49 may include the subject matter of any of Examples 1-47, and may further specify that the doped layer includes an implanted dopant.

Example 50 is a method of operating a quantum dot device, including: applying voltages to first gates above a first quantum well stack region to cause a first quantum dot to form in a first quantum well layer in the first quantum well stack region, wherein the first quantum well stack region includes a first doped layer spaced away from the first quantum well layer by a first barrier layer, the first doped layer includes a first material and a dopant, the first material has a first diffusivity of the dopant, the first barrier layer includes a second material having a second diffusivity of the dopant, and the second diffusivity is less than the first diffusivity; applying voltages to second gates on a second quantum well stack region to cause a second quantum dot to form in a second quantum well layer in the second quantum well stack region, wherein the second quantum well stack region includes a second doped layer spaced away from the second quantum well layer by a second barrier layer; and sensing a quantum state of the first quantum dot with the second quantum dot.

Example 51 may include the subject matter of Example 50, and may further specify that the second doped layer includes the first material and the dopant, and the second barrier layer includes the second material.

Example 52 may include the subject matter of any of Examples 50-51, and may further specify that applying the voltages to the first gates comprises applying a voltage to a first gate of the first gates to cause the first quantum dot to form in the first quantum well layer under the first gate.

Example 53 may include the subject matter of any of Examples 50-52, and may further specify that sensing the quantum state of the first quantum dot with the second quantum dot comprises sensing a spin state of the first quantum dot with the second quantum dot.

Example 54 may include the subject matter of any of Examples 50-53, and may further include: applying the voltages to the first gates to cause a third quantum dot to form in the first quantum well layer; and prior to sensing the quantum state of the first quantum dot with the second quantum dot, allowing the first and third quantum dots to interact.

Example 55 may include the subject matter of Example 54, and may further specify that allowing the first and third quantum dots to interact comprises applying the voltages to the first gates to control interaction between the first and third quantum dots.

Example 56 may include the subject matter of any of Examples 50-55, and may further specify that the first quantum well stack includes multiple doped layers spaced apart by barrier layers.

Example 57 may include the subject matter of Example 56, and may further specify that doping concentrations of different ones of the multiple doped layers decrease for the doped layers progressively closer to the quantum well layer.

Example 58 is a method of manufacturing a quantum dot device, including: forming a quantum well stack on a substrate, wherein the quantum well stack includes a doped layer, a quantum well layer, and a barrier layer disposed between the doped layer and the quantum well layer, the doped layer includes a first material and a dopant, the first material has a first diffusivity of the dopant, the barrier layer includes a second material having a second diffusivity of the dopant, and the second diffusivity is less than the first diffusivity; and forming gates above the quantum well stack.

Example 59 may include the subject matter of Example 58, and may further specify that the doped layer includes doped silicon germanium, and the barrier layer includes intrinsic silicon, a III-V material, or silicon germanium having a different germanium concentration from the silicon germanium of the doped layer.

Example 60 may include the subject matter of Example 59, and may further specify that the quantum well layer includes silicon.

Example 61 may include the subject matter of any of Examples 58-60, and may further specify that forming the quantum well stack includes in-situ doping a material to form the doped layer.

Example 62 may include the subject matter of any of Examples 58-60, and may further specify that forming the quantum well stack includes providing a layer of dopant on a material, and annealing the layer of dopant and the material to drive the dopant into the material to form the doped layer.

Example 63 may include the subject matter of any of Examples 58-60, and may further specify that forming the quantum well stack includes performing ion implantation to form the doped layer.

Example 64 may include the subject matter of any of Examples 58-63, and may further specify that forming the quantum well stack includes growing the barrier layer on the doped layer.

Example 65 may include the subject matter of any of Examples 58-63, and may further specify that forming the quantum well stack includes growing the first material of the doped layer on the barrier layer.

Example 66 may include the subject matter of any of Examples 58-65, and may further include forming conductive pathways to the gates and to the doped layer.

Example 67 may include the subject matter of any of Examples 58-66, and may further specify that the quantum well stack includes multiple barrier layers formed of the second material, and the multiple barrier layers are disposed between the doped layer and the quantum well layer.

Example 68 is a quantum computing device, including: a quantum processing device, wherein the quantum processing device includes a first quantum well stack region and a second quantum well stack region, an active quantum well layer in the first quantum well stack region, a read quantum well layer in the second quantum well stack region, a doped layer in the first quantum well stack region spaced away from the active quantum well layer by a barrier layer, the doped layer includes a first material and a dopant, the first material has a first diffusivity of the dopant, the barrier layer includes a second material having a second diffusivity of the dopant, and the second diffusivity is less than the first diffusivity; a non-quantum processing device, coupled to the quantum processing device, to control voltages applied to gates on the first and second quantum well stack regions; and a memory device to store data generated by the read quantum well layer during operation of the quantum processing device.

Example 69 may include the subject matter of Example 68, and may further include a cooling apparatus to maintain a temperature of the quantum processing device below 5 degrees Kelvin.

Example 70 may include the subject matter of Example 69, and may further specify that the cooling apparatus includes a dilution refrigerator.

Example 71 may include the subject matter of Example 69, and may further specify that the cooling apparatus includes a liquid helium refrigerator.

Example 72 may include the subject matter of any of Examples 68-71, and may further specify that the memory device is to store instructions for a quantum computing algorithm to be executed by the quantum processing device.

Example 73 may include the subject matter of any of Examples 68-72, and may further specify that the doped layer and the active quantum well layer are coupled by a conductive pathway through the barrier layer.

The invention claimed is:

1. A quantum dot device, comprising:
a quantum well stack including a quantum well layer, a doped layer, and a barrier layer between the doped layer and the quantum well layer, wherein the doped layer includes a first material and a dopant, the first material has a first diffusivity of the dopant, the barrier layer includes a second material having a second diffusivity of the dopant, and the second diffusivity is less than the first diffusivity; and
gates above the quantum well stack;
wherein the first material includes silicon and germanium, the second material includes silicon and germanium, the first material has a first germanium content, the second material has a second germanium content, and the first germanium content is different from the second germanium content.

2. The quantum dot device of claim 1, wherein the doped layer is a first doped layer, the quantum well stack further includes a second doped layer, and the barrier layer is between the first doped layer and the second doped layer.

3. The quantum dot device of claim 2, wherein the second doped layer includes the first material and the dopant.

4. The quantum dot device of claim 3, wherein the second doped layer is between the barrier layer and the quantum well layer, and the first and second doped layers have equal concentrations of the dopant.

5. The quantum dot device of claim 3, wherein the second doped layer is between the barrier layer and the quantum well layer, the first doped layer has a first concentration of the dopant, the second doped layer has a second concentration of the dopant, and the second concentration of the dopant is less than the first concentration of the dopant.

6. The quantum dot device of claim 2, wherein the barrier layer is a first barrier layer, the quantum well stack further includes a second barrier layer, and the second barrier layer is between the second doped layer and the quantum well stack.

7. The quantum dot device of claim 6, wherein the second barrier layer includes the second material.

8. The quantum dot device of claim 6, wherein the quantum well stack further includes a third doped layer between the second barrier layer and the quantum well stack.

9. The quantum dot device of claim 8, wherein the third doped layer includes the first material and the dopant.

10. The quantum dot device of claim 9, wherein the second doped layer is between the barrier layer and the quantum well layer, the first doped layer has a first concentration of the dopant, the second doped layer has a second concentration of the dopant, the third doped layer has a third concentration of the dopant, the second concentration of the dopant is less than the first concentration of the dopant, and the third concentration of the dopant is less than the second concentration of the dopant.

11. The quantum dot device of claim 9, wherein the quantum well stack further includes a third barrier layer between the third doped layer and the quantum well stack.

12. The quantum dot device of claim 1, wherein the doped layer is between the gates and the quantum well layer.

13. The quantum dot device of claim 1, wherein the quantum well layer is between the gates and the doped layer.

14. A quantum computing device, comprising:
a quantum processing device, wherein the quantum processing device includes a first quantum well stack region and a second quantum well stack region, an active quantum well layer in the first quantum well stack region, a read quantum well layer in the second quantum well stack region, a doped layer in the first quantum well stack region spaced away from the active quantum well layer by a barrier layer, the doped layer includes a first material and a dopant, the first material has a first diffusivity of the dopant, the barrier layer includes a second material having a second diffusivity of the dopant, and the second diffusivity is less than the first diffusivity;
a non-quantum processing device, coupled to the quantum processing device, to control voltages applied to gates on the first and second quantum well stack regions; and
a memory device to store data generated by the read quantum well layer during operation of the quantum processing device;
wherein the first material includes silicon and germanium, the second material includes silicon and germanium, the first material has a first germanium content, the second material has a second germanium content, and the first germanium content is different from the second germanium content.

15. The quantum computing device of claim 14, wherein the doped layer and the active quantum well layer are coupled by a conductive pathway through the barrier layer.

16. A quantum dot device, comprising:
a quantum well stack including a quantum well layer, a first doped layer, a second doped layer, and a barrier layer between the first doped layer and the quantum well layer, wherein the first doped layer includes a first material and a dopant, the first material has a first diffusivity of the dopant, the barrier layer includes a second material having a second diffusivity of the dopant, the second diffusivity is less than the first diffusivity, and the barrier layer is between the first doped layer and the second doped layer; and
gates above the quantum well stack;
wherein the first material includes silicon or germanium or a combination thereof, and the second material includes silicon or germanium or a combination thereof, a III-V material, or silicon and carbon.

17. The quantum dot device of claim 16, wherein the second material includes a III-V material.

18. The quantum dot device of claim 16, wherein the second material includes intrinsic silicon.

19. The quantum dot device of claim 16, wherein the second doped layer includes the first material and the dopant.

20. The quantum dot device of claim 19, wherein the second doped layer is between the barrier layer and the quantum well layer, and the first and second doped layers have equal concentrations of the dopant.

21. The quantum dot device of claim 19, wherein the second doped layer is between the barrier layer and the quantum well layer, the first doped layer has a first concentration of the dopant, the second doped layer has a second concentration of the dopant, and the second concentration of the dopant is less than the first concentration of the dopant.

22. The quantum dot device of claim 16, wherein the barrier layer is a first barrier layer, the quantum well stack further includes a second barrier layer, and the second barrier layer is between the second doped layer and the quantum well stack.

23. The quantum dot device of claim 22, wherein the second barrier layer includes the second material.

24. A quantum computing device, comprising:
a quantum processing device, wherein the quantum processing device includes a first quantum well stack region and a second quantum well stack region, an active quantum well layer in the first quantum well stack region, a read quantum well layer in the second quantum well stack region, a first doped layer in the first quantum well stack region spaced away from the active quantum well layer by a barrier layer, a second doped layer in the first quantum well stack region, the first doped layer includes a first material and a dopant, the first material has a first diffusivity of the dopant, the barrier layer includes a second material having a second diffusivity of the dopant, the second diffusivity is less than the first diffusivity, the barrier layer is between the first doped layer and the second doped layer, the first material includes silicon or germanium or a combination thereof, and the second material includes silicon or germanium or a combination thereof, a III-V material, or silicon and carbon;
a non-quantum processing device, coupled to the quantum processing device, to control voltages applied to gates on the first and second quantum well stack regions; and
a memory device to store data generated by the read quantum well layer during operation of the quantum processing device.

25. The quantum computing device of claim 24, wherein the first doped layer and the active quantum well layer are coupled by a conductive pathway through the barrier layer.

* * * * *